United States Patent
Shimomura et al.

(10) Patent No.: US 7,488,236 B2
(45) Date of Patent: Feb. 10, 2009

(54) POLISHING PAD AND METHOD OF PRODUCING THE SAME

(75) Inventors: Tetsuo Shimomura, Ohtsu (JP);
Masahiko Nakamori, Ohtsu (JP);
Takatoshi Yamada, Ohtsu (JP); Shigeru Komai, Ohtsu (JP); Koichi Ono, Ohtsu (JP); Kazuyuki Ogawa, Osaka (JP);
Atsushi Kazuno, Osaka (JP); Tsuyoshi Kimura, Osaka (JP)

(73) Assignee: Toyo Tire & Rubber Co., Ltd., Osaka (JP)

( * ) Notice: Subject to any disclaimer, the term of this patent is extended or adjusted under 35 U.S.C. 154(b) by 135 days.

(21) Appl. No.: 11/466,909

(22) Filed: Aug. 24, 2006

(65) Prior Publication Data

US 2006/0280930 A1    Dec. 14, 2006

Related U.S. Application Data

(62) Division of application No. 10/494,249, filed on Nov. 3, 2004.

(30) Foreign Application Priority Data

| Nov. 13, 2001 | (JP) | 2001-347410 |
| Nov. 13, 2001 | (JP) | 2001-347538 |
| Nov. 13, 2001 | (JP) | 2001-347585 |
| Nov. 16, 2001 | (JP) | 2001-351629 |
| Dec. 7, 2001  | (JP) | 2001-374223 |
| Dec. 7, 2001  | (JP) | 2001-374354 |
| Dec. 10, 2001 | (JP) | 2001-375954 |
| Dec. 12, 2001 | (JP) | 2001-378181 |
| Apr. 8, 2002  | (JP) | 2002-105459 |
| Apr. 19, 2002 | (JP) | 2002-117623 |
| Apr. 19, 2002 | (JP) | 2002-117767 |
| May 20, 2002  | (JP) | 2002-144617 |
| May 20, 2002  | (JP) | 2002-144628 |
| May 21, 2002  | (JP) | 2002-146495 |

(51) Int. Cl.
*B24B 7/22* (2006.01)

(52) U.S. Cl. ..................... 451/41; 451/533
(58) Field of Classification Search ............ 451/41, 451/59, 63, 526, 527, 533
See application file for complete search history.

(56) References Cited

U.S. PATENT DOCUMENTS 3,769,245 A    10/1973    Stewar et al.

(Continued)

FOREIGN PATENT DOCUMENTS

JP    1-222868    9/1989

(Continued)

OTHER PUBLICATIONS

Oertal, et al., Polyurethane Handbook 2nd Edition (1994) pp. 92, 107-109, 249, 271.

(Continued)

*Primary Examiner*—Robert Rose
(74) *Attorney, Agent, or Firm*—Knobbe Martens Olson & Bear, LLP

(57) ABSTRACT

The invention provides a polishing pad by which optical materials such as lenses, reflecting mirrors etc., or materials requiring a high degree of surface planarity, as in the polishing of silicone wafers, glass substrates or aluminum substrates for hard disks, or general metal polishing, can be flattened with stability and high polishing efficiency. The invention also provides a polishing pad for semiconductor wafers, which is superior in planarizing characteristic, is free from scratches and can be produced at low cost. There is provided a polishing pad which is free from dechucking error so that neither damage to wafers nor decrease in operating efficiency occurs. There is provided a polishing pad which is satisfactory in planarity, within wafer uniformity, and polishing rate and produces less change in polishing rate. There is provided a polishing pad which can make planarity improvement and scratch decrease compatible.

11 Claims, 2 Drawing Sheets

U.S. PATENT DOCUMENTS

| | | | |
|---|---|---|---|
| 4,842,678 A * | 6/1989 | Noro et al. | ............ 216/88 |
| 4,927,861 A | 5/1990 | Souto et al. | |
| 5,564,965 A | 10/1996 | Tanaka et al. | |
| 5,704,987 A | 1/1998 | Huynh et al. | |
| 5,725,420 A | 3/1998 | Torii | |
| 5,840,782 A | 11/1998 | Limerkens et al. | |
| 6,022,903 A | 2/2000 | Younes et al. | |
| 6,200,901 B1 | 3/2001 | Hudson et al. | |
| 6,410,608 B1 | 6/2002 | Sakai et al. | |
| 6,437,013 B2 | 8/2002 | Kuwamura et al. | |
| 6,705,934 B1 | 3/2004 | Shiro et al. | |
| 6,777,455 B2 | 8/2004 | Seyanagi et al. | |
| 2004/0242719 A1 | 12/2004 | Seyanagi et al. | |

FOREIGN PATENT DOCUMENTS

| | | |
|---|---|---|
| JP | 2-138328 | 5/1990 |
| JP | 7-164308 | 6/1995 |
| JP | 8-12794 | 1/1996 |
| JP | 11-302355 | 11/1996 |
| JP | 9-57608 | 3/1997 |
| JP | 6-220151 | 8/1998 |
| JP | 11-10798 | 1/1999 |
| JP | 2000-17252 | 1/2000 |
| JP | 2000-167763 A | 6/2000 |
| JP | 2000-178374 | 6/2000 |
| JP | 2000-282010 | 10/2000 |
| JP | 2000-343413 A | 12/2000 |
| JP | 2001-47355 A | 2/2001 |
| JP | 2001-89548 | 4/2001 |
| JP | 2001-176829 A | 6/2001 |
| JP | 2001-179608 A | 7/2001 |
| JP | 2001-277101 A | 10/2001 |
| JP | 2001-357101 A | 12/2001 |
| JP | WO 01/96434 A1 | 12/2001 |
| JP | 2002-370157 | 12/2002 |

OTHER PUBLICATIONS

Shigetaka Watanabe, Industrial Material, vol. 17, No. 11, Published on Oct. 1969 (with Englishe translation).

Tetsuo Shimomura, et al., USPTO Office Action for U.S. Appl. No. 10/494,249 issued on Nov. 3, 2007.

* cited by examiner (a)

(b)

POLISHING PAD AND METHOD OF PRODUCING THE SAME

This is a divisional application of U.S. patent application Ser. No. 10/494,249, filed Nov. 3, 2004, Which is the U.S. National Phase under 35 U.S.C. §371 of International Application PCT/JP2002/10310, filed Oct. 2, 2002, which claims priority under 35 U.S.C. § 119 to Japanese Patent Application No. 2001-347585, filed Nov. 13, 2001; No. 2001-347538, filed November 13; No. 2001; 2001-347410, filed Nov. 13, 2001; No. 2001-351629, filed Nov. 16, 2001; No. 2001-374223, filed Dec. 7, 2001; No. 2001-374354, filed Dec. 7, 2001; No. 2001-375954, filed Dec. 10, 2001; No. 2001-378181, filed Dec. 12, 2001; No. 2002-105459, filed Apr. 8, 2002; No. 2002-117767, filed Apr. 19, 2002; No. 2002-117623, filed Apr. 19, 2002; No. 2002-144617, filed May 20, 2002; No. 2002-144628, filed May 20, 2002; and No. 2002-146495, filed May 21, 2002. The International Application was not published under PCT Article 21(2) in English.

BACKGROUND OF THE INVENTION

1. Field of the Invention

The present invention relates to a polishing pad by which optical materials such as reflecting mirrors etc., or materials requiring a high degree of surface planarity, as in the polishing of silicone wafers, glass substrates or aluminum substrates for hard disks, or general metal polishing, can be flattened with stability and high polishing efficiency. The polishing pad of the present invention can also be used particularly in a step of planarizing a silicone wafer, a device having an oxide layer, a metal layer etc. formed on a silicon wafer, or a device before lamination and formation of an oxide layer or a metal layer. Further, the present invention also relates to a method of producing the polishing pad described above.

2. Description of the Related Art

Typical materials requiring a high degree of surface planarity include a single-crystalline silicone disk called a silicone wafer for producing semiconductor integrated circuits (IC, LSI). In a process for producing IC, LSI etc., the surface of the silicone wafer should be flattened highly accurately in a step of depositing and forming an oxide layer or a metal layer in order to provide reliable semiconductor connection with various films used in manufacturing circuits. Generally, a polishing pad is stuck on a rotatable supporting disk called a platen in the polishing step, while a workpiece such as a semiconductor wafer is fixed to a polishing head. By rotational movement of the two, a relative speed is generated between the platen and the polishing head, and polishing slurry containing abrasive grains is continuously fed to the polishing pad to effect polishing.

A chemical mechanical polishing apparatus (CMP apparatus) for planarizing a processed surface by a CMP method is shown by reference to FIG. 1. The CMP apparatus used in the CMP method is provided with a polishing platen 2 for supporting a polishing pad 1 and with a supporting stand (polishing head) 4 for supporting a polished material (wafer) 3. The polishing platen 2 and the supporting stand 4 are arranged such that the polished pad 1 and the polished material 3, both of which are supported by them, are opposed to each other, and the polishing platen and the supporting stand are constituted to be capable of rotating around rotating shafts 6 and 7. The polished material 3 is stuck on the supporting stand 4 which is provided with a pressing mechanism for pushing the polished material 3 onto the polishing pad 1 at the time of polishing. An abrasive-feeding mechanism 5 is to feed an abrasive suspension having abrasive grains such as silica particles dispersed in an alkali solution to the polishing pad 1 on the polishing platen 2.

In finishing processing or in a process for multilayer interconnections for devices, a semiconductor wafer is subjected to mirror polishing by chemical mechanical polishing or polished to flatten an inter layer dielectrics and an electroconductive film. Such polishing requires polishing uniformity in the whole area of the wafer, selective polishing of protrusions in an uneven surface, and planarity after polishing of the uneven surface. For these requirements, known polishing pads constituted in the following manner have been developed and investigated.

(1) A polishing pad having a synthetic leather layer as a polishing layer laminated on an elastic polyurethane layer (U.S. Pat. No. 3,504,457).

(2) A polishing pad structured by sticking a polyurethane-impregnated nonwoven fabric on a foamed polyurethane layer (JP-A 6-21028).

(3) A polishing pad provided with a polishing surface and a rigid element of selected rigidity and thickness adjacent to the polishing surface and with an elastic element adjacent to the rigid element to endow the rigid element with substantially uniform strength, characterized in that the rigid element and the elastic element give elastic flex strength to the polishing surface to induce the controlled flex of the polishing surface so as to fit it to the whole shape of the surface of a workpiece and to maintain rigidity controlled for the local shape of the surface of the workpiece (JP-A 6-077185).

(4) A polishing cloth comprising a surface layer A having high longitudinal elastic coefficient $E_A$ and a lower layer B having low longitudinal elastic coefficient $E_B$, characterized by being provided with a middle layer M having higher longitudinal elastic coefficient than that of the layer B between the layers A and B (JP-A 10-156724).

(5) A pad composed of a polishing layer, a middle layer having higher elasticity than that of the polishing layer, and a soft lower layer, wherein the middle layer is divided (JP-A 11-48131).

However, the polishing pads described above suffer from the following problems:

(a) For the uniformity of whole surface, the elastic polyurethane layer in the polishing pad described in U.S. Pat. No. 3,504,457 plays a role in making loading applied to a wafer uniform, and soft synthetic leather is used in the outermost polishing layer, and therefore there is no problem such as scratches, but there is the problem of poor planarizing characteristics in minute regions.

(b) In the polishing pad described in JP-A 6-21028, the nonwoven fabric layer plays the same role as that of the elastic polyurethane layer described in U.S. Pat. No. 3,504,457, to achieve uniformity. Further, the polishing layer has a rigid foamed polyurethane layer and is thus superior to the synthetic leather in planarizing characteristics, but does not reach levels required in recent years for improving planarizing characteristics in minute regions and for polishing metal films. The planarizing characteristics can be improved by further increasing the hardness of the rigid urethane layer, but in this case, scratches occur frequently, thus making this prior art pad unpractical.

(c) The polishing pad described in JP-A 6-77185 is constituted so as to have suitable hardness not causing scratches on the polishing layer as the surface layer and to permit a second rigid layer to improve planarizing characteristics deteriorated due to low hardness. This is to solve the problem in the polishing pad described in JP-A 6-21028, but in this case, the thickness of the polishing layer is limited to 0.003 inch or less, and with this thickness given, the polishing layer is also shaved to reduce the life of the product.

(d) The basic idea in the polishing pad described in JP-A 10-156724 is the same as in the art described in JP-A 6-77185, and the range of the elastic modulus of each layer is limited to achieve a more efficient range, but in this art, there is no description of any substantial realizing means, thus making production of the polishing pad difficult.

(e) The basic idea in the polishing pad described in JP-A 11-48131 is the same as in the art described in JP-A 6-77185, but the middle rigid layer is divided in a certain predetermined size to further improve uniformity in the surface of a wafer. However, the step for dividing the layer costs much, thus failing to provide an inexpensive polishing pad.

In the case of the polishing pads described in these prior art literatures, the polishing pads are generally stuck via an adhesive such as a double-coated tape on a polishing machine used, but their adhesiveness in this case is scarcely examined up to now. In the case of the polishing pad used generally and widely at present, the removal of the polishing pad from a polishing machine after use requires very large force, and the exchange of the polishing pad with a new one requires severe hard work.

The present invention provides a polishing pad used in a polishing step of planarizing a semiconductor wafer or fine unevenness of a fine pattern on a device having the pattern formed on a semiconductor wafer, wherein the polishing pad shows a high polishing rate at the time of polishing, as well as a method of polishing a semiconductor wafer. The present invention also provides a semiconductor wafer-polishing pad which in polishing a semiconductor wafer, is excellent in planarizing characteristics of a fine pattern on a device having the pattern formed on the semiconductor wafer, does not generate scratches, and can be produced at low cost, as well as a method of polishing a semiconductor wafer by using the polishing pad.

In the polishing operation, a change in dimension of the polishing pad is very important. When the polishing pad is poor in dimensional stability, a change in dimension of the polishing pad occurs due to frictional heat generated in a polishing process, which can cause deterioration in planarizing characteristics.

Conventionally, a polishing pad is often rendered highly elastic for the purpose of improving the planarity of a material to be polished, and there is no sufficient discussion on the dimensional stability of the polishing pad.

Another object of the present invention is to provide a polishing layer of a polishing pad, which undergoes less deterioration in planarizing characteristics even at an increasing temperature due to frictional heat generated in a polishing step.

As the polishing pad used in highly accurate polishing, a polyurethane foam sheet whose void volume is about 30 to 35% is generally used. Further, it is important that the polishing pad can complete polishing as rapidly as possible, and for this purpose, the polishing pad is required to have a high polishing rate.

However, when the conventional polyurethane foam sheet is used as a polishing pad or a polishing layer of a polishing pad, the polishing efficiency is improved by increasing the polishing rate, but after polishing, resistance upon removal of a wafer from the polishing pad is increased to generate dechucking error to cause problems of wafer breakage and reduction of operational efficiency.

A still other object of the present invention is to provide a polishing pad or a polishing layer of a polishing pad, which maintains a high polishing rate, exhibits less resistance upon removal of a wafer from the polishing pad after polishing to prevent generation of dechucking error, thus preventing wafer breakage and reduction of operational efficiency.

The planarity and within wafer uniformity of a polished material and polishing rate are required as the polishing characteristics of the polishing pad. The planarity and within wafer uniformity of a polished material can be improved to a certain degree by rendering the polishing layer highly elastic. The polishing rate can be improved by using cell-containing foam. However, when the polishing rate of the polishing pad during use is changed, it is necessary to regulate the polishing conditions, resulting in low polishing efficiency.

A still other object of the present invention is to provide a polishing pad excellent in planarity, within wafer uniformity and polishing rate and undergoing less change in polishing rate.

With respect to such polishing pads used in CMP, techniques described in Japanese Patent No. 3013105 and JP-A 11-322878 are known. The techniques disclosed in Japanese Patent No. 3013105 are concerned with a polishing pad comprising fine particles or hollow fine particles of water-soluble resin added to a polymer matrix such as a polyurethane polymer. The techniques disclosed in JP-A 11-322878 are concerned with a polishing pad comprising polystyrene foamed beads dispersed in a polyurethane polymer.

However, when fine particles or hollow fine particles of water-soluble resin, or polystyrene foamed beads, are dispersed in resin in the known polishing pads described above, uneven dispersion of the particles occur readily due to e.g. a difference in density from the polyurethane as matrix resin. The fine particles or hollow fine particles in the prior art described above exhibit a very important function in forming small concaves in the polishing surface of the polishing pad in CMP processing, to maintain abrasive grains on the concaves, and uneven dispersion of such particles affects the performance of the polishing pad.

On the other hand, when a polishing pad consisting of foamed polyurethane obtained by reacting and hardening an isocyanate group-containing compound with an active hydrogen group-containing compound is used, sufficient polishing performance may not be obtained even if the same components are used, and thus there is demand for improvement.

A further object of the present invention is to provide a method of producing a polishing pad having stable polishing properties with a polishing layer composed of foamed polyurethane, as well as a method of producing a polishing pad having a polishing layer whose pores are composed exclusively of polyurethane without containing fine particles or fine hollow particles of water-soluble resin, or materials such as polystyrene foamed beads for forming concaves in the polishing surface.

In the operation of polishing, heat is generated due to friction between the polishing pad and a workpiece, to increase the temperature of the surface of the polishing pad. This increase in temperature changes the hardness (modulus of elasticity) of the polishing pad, thus exerting adverse influence on planarizing processing requiring a high degree of surface planarity.

A still further object of the present invention is to provide a polishing pad capable of planarizing processing stably in a wide temperature range, which overcomes the conventional problem of the adverse influence of frictional heat between the polishing pad and a workpiece on planarizing processing due to a change in the hardness (modulus of elasticity) of the polishing pad.

As a polishing pad used in highly accurate polishing, a polishing pad (trade name IC-1000 manufactured by Rodel) comprising high-pressure-gas-containing hollow fine spheres dispersed in matrix resin such as polyurethane as described in Japanese Patent No. 3013105 is well-known. However, it cannot be said that the planarity of this polishing pad comprising high-pressure-gas-containing hollow fine spheres dispersed therein is sufficiently satisfactory. As is also described on page 17 in Detailed Semiconductor CMP Techniques (in Japanese) authored by Toshiro Doi et al. and published by Kogyo Chosakai Publishing Co., Ltd. (2000), a hard polishing pad which can further improve planarity is necessary in consideration of application to next-generation elements.

For the purpose of improving planarity, a hard polishing pad in a non-foam system (for example, IC-2000 manufactured by Rodel) can also be used. However, when such a hard pad is used, there occurs a problem of scratches on the polished surface of a workpiece, as described in the above literature (ibid.). Further, the polishing pad in a non-foam system cannot sufficiently maintain slurry abrasive grains on the surface of the pad at the time of polishing, and is thus not preferable from the viewpoint of polishing rate.

In addition, JP-A 2001-47355 proposes a polishing pad comprising a water-soluble material dispersed in a water-insoluble thermoplastic polymer. This polishing pad is a non-foam, but the water-soluble material dispersed in the polishing pad is dissolved during polishing to generate foam-like pores in the surface of the polishing pad, and the polishing pad is swollen to reduce the hardness of the surface of the polishing pad, and thus this polishing pad is significantly effective for improvement in planarity and improvement in polishing rate. However, the characteristics of this polishing pad depend greatly on the water-soluble material, and scratches caused by the thermoplastic polymer as a major component of the polishing pad cannot be solved.

A still other object of the present invention is to provide a polishing pad which can achieve improvement in planarity and reduction in scratches which cannot be simultaneously solved by the conventional polishing pads. A further object of the present invention is to provide a polishing pad which can be satisfactory from the viewpoint of polishing rate in addition to improvement in planarity and reduction in scratches.

In the polishing operation, the wetting properties of the polishing pad with polishing slurry are very important. When the polishing pad is poor in wetting properties with polishing slurry, the polishing slurry cannot sufficiently spread on the polishing pad, and in an extreme case, the polishing pad repels the polishing slurry to reduce the polishing rate significantly thus necessitating a long time for polishing. Even if the polishing slurry spreads on the polishing pad, the amount of the adhering polishing slurry is uneven, thus failing to uniformly polish an object of polishing. Further, dry regions may occur on the polishing pad, and when a small amount of polishing slurry adheres to such regions, the solution only is removed by evaporation etc., resulting in aggregation of abrasive grains on the regions, which can cause scratches as defects on the surface of a semiconductor wafer.

On the other hand, when the polishing pad is too excellent in wetting properties with polishing slurry, the solution in the polishing slurry is absorbed into the surface of the polishing pad, resulting in swelling of the polishing pad to deteriorate the stability of polishing rate.

In consideration of the instability of polishing rate caused by too excellent wetting properties, the surface of the conventional polishing pad is often rendered water-repellent. For the purpose of improving the planarity of an object of polishing, the polishing pad is often rendered highly elastic, and there was no sufficient discussion on the wetting properties of the polishing pad.

For the reason described above, it is noticed in recent years that the wetting properties of the polishing pad with polishing slurry should be improved to a certain degree, and improvements in this respect have been attempted. JP-A 2000-173958 proposes improvement in the wetting properties of the surface of a polishing pad by rendering the surface of the polishing pad hydrophilic by treatment with a chemical solution having an oxidizing action or with a surfactant etc. JP-A 2000-237951 proposes improvement in the wetting properties of the surface of a polishing cloth made of a nonwoven fabric or a polishing cloth comprising a nonwoven fabric impregnated with an elastomer, wherein the polishing cloth is rendered hydrophilic by treatment with a hydrophilic solution.

In both JP-A 2000-173958 and JP-A 2000-237951 supra, a matrix polymer material forming the polishing pad is subjected to hydrophilization treatment with some chemicals in order to improve the wetting properties of the surface of the polishing pad. Accordingly, chemicals for hydrophilization treatment are necessary in producing the polishing pad, and the step of hydrophilization treatment is also necessary, thus hardly coping with demand for reduction in costs.

A further still object of the present invention is to provide a polishing layer of a polishing pad, which has the optimum wetting properties with polishing slurry without hydrophilizing, with chemicals, a matrix polymer material forming the polishing pad (polishing layer), a process for producing the same, a polishing pad capable of polishing an object of polishing uniformly without scratches and maintaining a satisfactory polishing rate, and a process for producing the same.

As the polishing pad used in highly accurate polishing, a polyurethane foamed sheet having a void volume of about 30 to 35% is generally used. However, the polyurethane foamed sheet is excellent in topical planarizing performance, but is poor in cushioning properties due to a low compressibility of about 0.5 to 1.0%, thus hardly giving uniform pressure on the whole surface of a wafer. Accordingly, the polyurethane foamed sheet is provided on the backside thereof with a soft cushion layer and used in polishing step as a laminated polishing pad.

In the conventional polishing pad, a resin-impregnated nonwoven fabric used widely as a cushion layer has open cells through which the slurry used enters the cushion layer. As a result, the hardness, compressibility etc. of the cushion layer are changed, the characteristics of the whole polishing pad are changed, and polishing characteristics such as uniformity and polishing rate are changed with time to cause a problem of a reduction in wafer yield.

As the technique of preventing slurry from entering a resin-impregnated nonwoven fabric as the cushion layer in the conventional polishing pad, a technique of covering a side of a cushion layer with a polishing layer is disclosed in Japanese Patent No. 2842865 and a technique of arranging a waterproof material layer between polishing layers is disclosed in Japanese Patent No. 3152188.

In the technique described in Japanese Patent No. 2842865, however, the polishing layer should be in a such special shape as to cover a side of a cushion layer, and the backside of the polishing layer should form a concave so as to embed and laminate the cushion layer therein, thus significantly reducing the productivity of the polishing pad. In the technique disclosed in Japanese Patent No. 3152188, a waterproof material layer is arranged between polishing layers, and when the polishing surface approaches the waterproof material layer as the polishing layer is abraded during polishing, the difference in rigidity between the polishing layer and waterproof material layer comes to be significant, to exert adverse influence on the polishing characteristics. When the polishing layer is used in such a range that such influence is eliminated, the life of the polishing pad is reduced.

A still other object of the present invention is to provide a polishing pad with less reduction in the hardness of the cushion layer and with less change in the compressibility thereof and thus with less change in the characteristics of the whole polishing pad, thus being free of the reduction of wafer yield caused by changes with time of polishing properties such as uniformity, polishing rate etc. A still further object is to provide a polishing pad of long life having a stable and high polishing rate.

SUMMARY OF THE INVENTION

A semiconductor wafer polishing pad according to the present invention has a polishing layer comprising resin foam of closed-cell type, wherein the number of closed cells in the polishing layer is 200 to 600 per mm$^2$.

The number of cells is determined by measuring the number of cells in a section of the polishing layer cut in an arbitrary position.

Another semiconductor wafer polishing pad according to the present invention has a polishing layer comprising resin foam of closed-cell type, wherein the average diameter of the closed cells is 30 to 60 μm.

The average diameter of the cells is determined by measuring the diameters of cells in a section of the polishing layer cut in an arbitrary position.

A still other semiconductor wafer polishing pad according to the present invention has a polishing layer comprising resin foam of closed-cell type, wherein the number of closed cells in the polishing layer is 200 to 600 per mm$^2$, and the average diameter of the cells is 30 to 60 μm.

In the resin foam of closed-cell type constituting the polishing layer, a high polishing rate is achieved when the number of cells is in the range of 200 to 600 per mm$^2$ When the number of cells is less than 200/mm$^2$, slurry-maintaining concave(cells) are reduced, and the amount of slurry effective for polishing between a semiconductor wafer and the polishing pad is reduced, which would result in a reduction in polishing rate. When the number of cells is higher than 600/mm$^2$, the diameter of cells in the pad is as small as 10 μm or less, and it is considered that the cells are clogged with abrasive dust and slurry aggregates and can thus not play a role in maintaining slurry.

In the present invention, when hollow fine particles are added, the number of cells and the diameter of cells can be regulated by the diameter and amount of the fine particles added. When cells are mechanically formed, the number and diameter of cells can be regulated by regulating the number of revolutions of a stirring blade during stirring, the shape of the blade, and stirring time, and by changing the amount of a surfactant added as an additive for forming cells.

When the average diameter of closed cells in the polishing layer is less than 30 μm or higher than 60 μm, the polishing rate is lowered.

In the present invention, the term "closed cells" refers to cells in a circular or elliptic shape or a shape analogous thereto and excludes cells consisting of two or more bound cells.

In the present invention, the material of the polishing pad is not particularly limited insofar as the polishing pad has closed cells, but the material is preferably polyurethane resin foam.

Because the polyurethane resin has flexibility in addition to necessary hardness, minute flaws (i.e. scratches) given to an object of polishing are reduced.

It is not necessary for the polyurethane resin foam of closed-cell type to be composed exclusively of 100% closed cells, and open cells may be partially present therein. The percentage of closed cells may be 90% or more. The percentage of closed cells can be determined according to the following method.

The percentage of closed cells is determined by cutting the resulting foam polishing layer with a microtome, producing a microphotograph of the resulting section with an image processing unit image analyzer V10 (TOYOBO Co., Ltd.), determining the number of all cells and the number of closed cells per unit area, and calculating the percentage of closed cells from the following equation:

Percentage of closed cells (%)=(number of closed cells/number of all cells)×100

Another polishing pad according to the present invention has a polishing layer comprising resin foam, wherein the thermal change in dimension of the polishing layer is 3% or less.

When the thermal change in dimension of the polishing layer in the polishing pad is 3% or less, the polishing pad with less reduction in planarizing characteristics than conventional can be obtained even when an increase in temperature occurs due to frictional heat generated in the polishing step.

In the polishing layer in the polishing pad described above, the resin foam or the resin layer is preferably polyurethane resin foam.

The polyurethane resin foam can easily constitute a polishing layer whose thermal dimensional change is 3% or less. Further, slurry abrasive grains can be maintained on the surface of the pad during polishing, to achieve a satisfactory polishing rate. The average diameter (cell diameter) of fine cells possessed by the polyurethane resin foam is 30 to 70 μm, preferably 30 to 50 μm, more preferably 30 to 40 μm. The resin foam is particularly preferably polyurethane resin foam of closed-cell type. When the foamed state of the polyurethane is not good, polishing characteristics may be lowered even if the thermal change in dimension is in the preferable range.

Another polishing pad according to the present invention has a polishing layer comprising resin foam, wherein the dynamic coefficient of friction of the surface of the polishing layer is 0.1 to 1.0. When the dynamic coefficient of friction of the surface of the polishing layer is 0.1 to 1.0, it is possible to obtain a polishing pad maintaining a high polishing rate, showing less resistance upon removal of a wafer from the polishing pad after polishing, and being free of dechucking error, thus not causing breakage of the wafer and not reducing the efficiency of operation.

When the dynamic coefficient of friction of the surface of the polishing layer is less than 0.1, the polishing rate is decreased, and the efficiency of polishing is lowered. When the dynamic coefficient of friction of the surface of the polishing layer is greater than 1.0, dechucking error occurs after polishing upon removal of the polishing pad from the surface of an object of polishing. The dynamic coefficient of friction of the surface of the polishing layer is more preferably 0.2 to 0.9.

The dynamic coefficient of friction of the surface of the polishing layer is a value determined by contacting the polishing layer with highly heat-resistant glass Pyrex (manufactured by Corning) in an atmosphere of a temperature of 23±2° C. and 50±6% relative humidity, and then measuring the dynamic coefficient of friction while moving it at a rate of 20 cm/min. at a pressure of 10.8 kPa. When the polishing surface has grooves, the grooves are removed by dressing, and the coefficient of friction of the polishing sheet itself is measured.

In the above-described polishing pad, the resin foam is preferably polyurethane resin foam.

In the present invention, the material of the polishing pad is not particularly limited insofar as the polishing pad has closed cells and has a dynamic coefficient of friction in the range described above, but polyurethane resin foam of closed-cell type is particularly preferably used. The contact area between the polishing layer and an object of polishing is reduced due to cells in the surface, so that the polishing pad having a dynamic coefficient of friction in the range in the present invention can be easily produced.

The method of regulating the dynamic coefficient of friction can be carried out by changing the surface shape or by adding an additive. The method of changing the surface shape involves regulating the shape of grooves on the surface of the pad, or changing the surface roughness of the pad by dressing with a diamond dresser etc. When the additive is added, the amount of the surfactant added is changed, or the content of the surfactant is changed, whereby the state of cells formed can be changed in the cell-containing polishing pad, to change the dynamic coefficient of friction.

Another polishing pad according to the present invention is a polishing pad having a polishing resin layer, wherein the difference in the abrasion loss of the polishing layer before and after a test of dipping for 24 hours in an aqueous solution (40° C.) of potassium hydroxide, pH 12.5, is 10 mg or less in a Taber abrasion test.

Usually, when the polishing pad is used, slurry having a pH value of about 11 to 12 is dropped always on the surface of the polishing pad. Accordingly, a material showing an abrasion loss of 10 mg or less in a Taber abrasion test is used as the material of the polishing layer to give a polishing pad having a stable polishing rate with less change with time in polishing characteristics. The difference in abrasion loss is preferably smaller, preferably 7 mg or less. An abrasion loss in the range of about 30 to 80 mg is preferable for securing fundamental polishing characteristics and in respect of the life of the polishing pad. The abrasion loss is measured specifically by a method described in the Examples.

In the polishing pad, the storage elastic modulus of the resin foam or the resin layer at 40° C. is preferably 270 MPa or more. When the storage elastic modulus is less than 270 MPa, sufficient planarizing characteristics cannot be obtained. A polishing pad using a polyurethane composition of such high modulus of elasticity is useful for planarizing a device wafer by polishing, and is also useful for glass polishing requiring a polishing pad of high modulus of elasticity. The polishing pad can be used in polishing in stable and high polishing efficiency. The storage elastic modulus is preferably 280 MPa or more, more preferably 300 MPa or more.

The storage elastic modulus in the present invention refers to the storage elastic modulus of a polishing layer at 40° C. when measured in a frequency of 1 Hz with sinusoidal wave vibration by a tensile test jig in a dynamic viscoelasticity measuring device. The conditions for measurement of storage elastic modulus are established in accordance with polishing conditions. That is, the conditions of measurement of storage elastic modulus are in accordance with the polishing conditions wherein the polishing pad at a temperature of about 40° C. (due to frictional heat) is pressed against a workpiece, both of which are rotated in approximately 1 Hz. In measurement in a tensile test, the present inventors found that measurements in a compressive test are almost identical with measurements in the tensile test, and therefore, measurements in the easier tensile test are adopted.

In the polishing pad, the resin foam or resin layer is preferably polyurethane resin foam.

The polyurethane resin has flexibility in addition to necessary hardness, and is thus a material excellent in abrasion resistance and most suitable as a material of the polishing pad. A distinctive feature of the polyurethane resin is that a polymer having desired physical properties can be obtained by changing the composition of starting materials, and is suitable as a material for forming the polishing pad. In addition, the finely foamed polyurethane has uniform fine cells and has higher hardness than other resin of the same density. By the finely foamed structure of the finely foamed polyurethane, a polishing pad formed therefrom achieves higher modulus of elasticity and simultaneously secures cells maintaining slurry supplied to the polishing pad. The finely foamed structure is very effective in maintaining slurry abrasive grains in finely foamed regions and in stabilizing the polishing rate, and thus the polishing rate is significantly increased and stabilized by the fine cells. The fine cells possessed by the finely foamed polyurethane are those having an average cell diameter of 70 μm or less, preferably 50 μm or less, more preferably 40 μm or less. Generally, the cell diameter is preferably 30 to 40 μm. The resin foam is particularly preferably polyurethane resin foam of closed-cell type.

In the polishing pad, the density of the polyurethane resin foam is preferably 0.67 to 0.90 g/cm$^3$.

When the density of the polyurethane resin foam is decreased, sufficient storage elastic modulus tends to be hardly achieved, and thus the density of the polyurethane resin foam is preferably at least 0.67 g/cm$^3$, more preferably at least 0.68 g/cm$^3$. On the other hand, when the density of the polyurethane resin foam is increased, the number of fine cells in the surface of the polishing layer is often insufficient, which is not preferable from the viewpoint of polishing rate, and thus the density of the polyurethane composition is preferably not higher than 0.90 g/cm$^3$, more preferably not higher than 0.88 g/cm$^3$.

The hardness of the polishing layer in the polishing pad, as determined by a D-type rubber hardness meter, is preferably 45 to 65. The compressibility of the polishing layer is preferably 0.5 to 5%.

The polyurethane resin foam in the polishing pad preferably contains 0.05 to 5 wt % silicone-based surfactant.

In production of the polyurethane resin foam, it is advantageous to mix a silicone-based surfactant previously with the polyurethane material in order to produce fine cells stably, and polyurethane resin foam having uniform cells can be obtained stably without deterioration in the physical properties of polyurethane.

When the amount of the silicone-based surfactant in the polishing pad comprising the polyurethane resin foam of closed-cell type is less than 0.05 wt %, stable foam of closed-cell type is hardly obtained. When the amount of the surfactant is higher than 5 wt %, the strength of the polishing pad is lowered by adding the surfactant, to deteriorate planarizing characteristics in polishing.

In the present invention, the silicone-based surfactant is preferably a polyalkylsiloxane/polyether copolymer.

In the polishing pad of the present invention, the hardness of the polishing layer, as determined by a D-type rubber hardness meter, is preferably 45 to 65.

In the polishing pad of the present invention, the compressibility of the polishing layer is preferably 0.5 to 5%.

The polishing pad is composed of at least 2 layers comprising a cushion layer laminated on the polishing layer contacting with an object of polishing, wherein the cushion layer is preferably softer than the polishing layer. The cushion layer is selected preferably from a urethane-impregnated polyester nonwoven fabric, polyurethane foam, and polyethylene foam.

Another aspect of the invention relates to a method of polishing a semiconductor wafer, which comprises rotating the polishing pad and simultaneously abutting it on a semiconductor wafer while supplying an abrasive between the polishing layer and the semiconductor wafer.

According to the polishing method described above, fine unevenness on a semiconductor wafer or on a fine pattern on a device comprising the pattern on a semiconductor wafer can be flattened at high polishing rate.

In the polishing method described above, the polishing layer is preferably polyurethane resin foam containing 0.05 to 5 wt % silicone-based surfactant.

A still other aspect of the present invention relates to a method of producing a polishing pad, which comprises the steps consisting of adding a hydroxyl-free silicone-based surfactant to at least one of a first component containing an isocyanate group-containing compound and a second component containing an active hydrogen group-containing compound, in an amount of 0.05 to 5 wt % based on the total amount of the first and second components, stirring the component containing the surfactant in an inert gas to prepare a cell dispersion having the inert gas as fine cells dispersed therein, mixing the remaining component with the cell dispersion, and hardening the mixture to produce polyurethane resin foam.

Further, the present inventors found that when an isocyanate-terminated prepolymer is used as the isocyanate group-containing compound that is a starting material of foamed polyurethane, the content of the isocyanate monomer in the isocyanate-terminated prepolymer is regulated at a predetermined level or less, whereby a polishing pad excellent in abrasion resistance during polishing and superior in polishing characteristics can be obtained, and another aspect of the present invention was completed.

That is, another aspect of the present invention is a method of producing a foamed polyurethane polishing pad, which comprises the steps consisting of adding a silicone-based surfactant to an isocyanate-terminated prepolymer, stirring the mixture in the presence of an inert gas to form a cell dispersion, mixing a chain extender with the cell dispersion to form a foamed reaction solution, and euring-hardening the foamed reaction solution, wherein the content of the isocyanate monomer in the isocyanate-terminated prepolymer is 20 wt % or less.

The reason that the prepolymer containing 20 wt % or less isocyanate monomer can be used to improve polishing characteristics is not evident, and one reason therefor is estimated as follows: When the content of the isocyanate monomer exceeds 20%, the reaction of the chain extender with the isocyanate monomer proceeds first, thus leading to insufficient polymerization of polyurethane.

The resulting foamed polyurethane has formed fine cells without adding fine particles or hollow fine particles of water-soluble resin or a material (for example, styrene foamed beads) for forming concaves on the polishing surface, and by the presence of the fine cells, abrasive grains in slurry can be maintained on the surface of the pad during polishing, thus achieving a satisfactory polishing rate. The average cell diameter of fine cells possessed by the foamed polyurethane is 70 μm or less, preferably 50 μm or less, more preferably 40 μm or less. Generally, the cell diameter is preferably 30 to 40 μm.

In the invention described above, it is preferable that the isocyanate-terminated prepolymer makes use of at least one (first isocyanate component) of an aliphatic diisocyanate and an alicyclic diisocyanate and an aromatic diisocyanate (second isocyanate component) as an isocyanate component, wherein the first isocyanate component/second isocyanate component ratio is 0.5 to 3.2 (ratio by weight) in the isocyanate monomers.

By using the aromatic diisocyanate in combination with the aliphatic or alicyclic diisocyanate reacting at a relatively low rate as a diisocyanate component constituting the isocyanate-terminated prepolymer, foamed polyurethane excellent in polishing characteristics can be produced easily in a suitable hardening time upon mixing with a chain extender.

Preferably, the first isocyanate component is 4,4'-dicyclohexylmethane diisocyanate, and the second isocyanate component is toluene diisocyanate.

By using such isocyanate components, foamed polyurethane excellent in the physical properties of resin constituting the foamed polyurethane and superior particularly in polishing characteristics can be obtained.

When the first isocyanate component/second isocyanate component ratio by weight in the isocyanate monomers in the isocyanate-terminated prepolymer is less than 0.5, the hardening time is short, and the stable foamed polyurethane or polishing pad cannot be formed. On the other hand, when the first isocyanate component/second isocyanate component ratio by weight is higher than 3.2, the hardening step of reacting and hardening the isocyanate-terminated prepolymer with a chain extender is time-consuming, thus leading to an undesirable increase in costs.

In the method of producing the foamed polyurethane polishing pad, the amount of the silicone-based surfactant added in the stirring step is preferably 0.05 to 5 wt % in the polyurethane.

In production of the foamed polyurethane, it is advantageous to mix the silicone-based surfactant previously with the polyurethane material in order to produce fine cells stably, and polyurethane foam having uniform cells can be obtained stably without deterioration in the physical properties of polyurethane.

When the amount of the silicone-based surfactant added is less than 0.05 wt %, stable foam of closed-cell type may not be obtained. On the other hand, when the amount of the surfactant is higher than 5 wt %, the number of cells in the polyurethane foam is increased, and polyurethane fine cell foam of high hardness is hardly obtained. It is estimated that by the action of the silicone-based surfactant on plasticization of polyurethane, the strength of the polishing pad is lowered, and polishing properties are deteriorated.

Preferably, the method of producing the polishing pad further comprises a step of laminating the polishing pad with a flexible porous sheet.

By arranging the flexible porous sheet as a cushion layer, a polishing pad excellent in planarizing characteristics can be obtained.

Another aspect of the present invention is a polishing pad composed essentially of polyurethane comprising an organic polyisocyanate, a polyol and a curing agent, wherein the major ingredient of the curing agent is 4,4'-methylenebis(o-chloroaniline), and the polyol comprises polytetramethylene glycol having a number-average molecular weight of 500 to 1600 and a molecular-weight distribution (weight-average molecular weight/number-average molecular weight) of less than 1.9.

The polishing pad according to a still other aspect of the invention is a polishing pad containing a polishing layer comprising a polymer material as a matrix material, wherein the degree of swelling of the polymer material upon dipping for 24 hours in an aqueous solution of sodium hydroxide, pH 11, at 20° C. is 2 to 15%.

In the present invention, a polymer material having a specific degree of swelling, which is swollen upon moistening to soften its surface, is used as a matrix material forming the polishing layer in the polishing pad. The polishing pad using the polymer material having a specific degree of swelling is superior in planarity to a polishing pad having high-pressure-gas-containing hollow fine spheres dispersed therein, and in the polishing step, the surface of the polishing layer is softened by swelling in the presence of aqueous slurry containing a solvent and abrasive grains, to reduce the surface hardness, thus solving a problem of scratching. By the effect described above, the polishing pad of the present invention can achieve improvement in planarity and reduction in scratches.

The degree of swelling of the polymer material is an estimated value indicative of the degree of swelling of the polymer material as a polishing layer-forming matrix material in the presence of aqueous slurry in the polishing step. Specifically, the degree of swelling is determined by cutting the polymer material off as a suitable specimen, dipping it for 24 hours in an aqueous solution of sodium hydroxide, pH 11, at 20° C. and calculating the degree of swelling according to the following equation:

degree of swelling (%)=[{(weight after 24 hours)−(original weight)}/(original weight)]×100

The degree of swelling is 2 to 15%. When the degree of swelling is low, the polishing layer is not sufficiently softened in the polishing step, thus making less contribution to reduction in scratches, and therefore the degree of swelling is 2% or more, more preferably 2.5% or more, still more preferably 3% or more. On the other hand, when the degree of swelling is high, the polishing layer is significantly softened in the polishing step, and the whole polishing pad is softened, which may result in insufficient improvement in planarity, and therefore the degree of swelling is preferably 15% or less, more preferably 10% or less, still more preferably 8% or less.

From the viewpoint of planarity, the hardness (Shore D hardness) of the surface of the polishing layer formed from the polymer material having the above-defined degree of swelling is preferably about 52 to 75, more preferably 55 to 70, under usual conditions. The reduction in the hardness of the surface of the polishing layer in the polishing step can be estimated from the degree of swelling, and the reduction in the hardness of the surface of the polishing layer after swelling in the measurement conditions (dipping for 24 hours in an aqueous solution of sodium hydroxide, pH 11, at 20° C.) is lowered by about 4 to 10, preferably by 5 to 8, relative to the hardness thereof before dipping.

In the polishing pad, the polymer material serving as the matrix material of the polishing layer is polyurethane, which preferably contains a water-soluble polymeric polyol as a polyol compound that is a component constituting the polyurethane.

To improve planarity as one of the polishing characteristics of the polishing pad (polishing layer), the whole of the polishing layer should be hardened. This can be achieved by selecting a hard material, that is, a material of high modulus of elasticity as the polymer material forming the polishing layer.

A distinctive feature of polyurethane among polymer materials is that its polymer having desired physical properties is obtained by changing the composition of starting materials, and a material of high modulus of elasticity most suitable in the polishing pad improving planarity can be easily selected. In addition, polyurethane is a material excellent in abrasion resistance and most suitable as a material of the polishing layer. The degree of swelling of the polyurethane serving as the polymer material can be regulated by using a hydrophilic compound as a constituent component in the polyurethane, preferably by using a water-soluble polymeric polyol as the polyol compound.

In the polishing pad, the polyurethane serving as the matrix material of the polishing layer is preferably foamed polyurethane having fine cells.

When the polyurethane is foamed polyurethane incorporating fine cells, abrasive grains in slurry can be sufficiently maintained on the surface of the pad during polishing, thus achieving a satisfactory polishing rate. The foamed polyurethane has uniform fine cells and has higher hardness than that of other resin of the same density. By the finely foamed structure of the foamed polyurethane, the polyurethane is rendered highly elastic, while the polyurethane when used in the polishing pad can maintain the supplied slurry to secure the polishing rate. The finely foamed structure is very effective in maintaining slurry abrasive grains in finely foamed pores and in stabilizing the polishing rate, and thus the polishing rate is significantly increased and stabilized by the fine cells. The fine cells possessed by the foamed polyurethane are those having an average cell diameter of 70 μm or less, preferably 50 μm or less, more preferably 40 μm or less. Generally, the cell diameter is preferably 30 to 40 μm.

In the polishing pad, the density of the foamed polyurethane serving as the matrix material of the polishing layer is preferably 0.67 to 0.90 g/cm$^3$.

When the polyurethane serving as the matrix material of the polishing layer is finely foamed polyurethane, planarity tends to be insufficient as the density of the polyurethane is decreased, and therefore the density of the finely foamed polyurethane is preferably at least 0.67 g/cm$^3$, more preferably at least 0.68 g/cm$^3$. On the other hand, when the density of the finely foamed polyurethane is increased, the number of fine cells in the surface of the polishing layer is readily decreased, which is not preferable from the viewpoint of polishing rate, and thus the density of the finely foamed polyurethane is preferably not higher than 0.90 g/cm$^3$, more preferably not higher than 0.88 g/cm$^3$.

In the polishing pad, the foamed polyurethane serving as the matrix material of the polishing layer preferably contains a silicone-based surfactant.

In production of the foamed polyurethane, it is advantageous to mix the silicone-based surfactant previously with the polyurethane material in order to produce fine cells stably, and foamed polyurethane having fine and uniform cells can be obtained stably without deterioration in the physical properties of the polyurethane.

In the polishing pad, the storage elastic modulus of the polishing layer at 40° C. is preferably 270 MPa or more.

The polishing layer comprises the polymer materials as the matrix material, and when its storage elastic modulus is 270 MPa or more, sufficient planarity can be obtained. A polishing pad using the polymer material of such high modulus of elasticity is useful for planarizing a device wafer by polishing, and is also useful for glass polishing requiring a polishing pad of high modulus of elasticity. The polishing pad can be used in polishing in stable and high polishing efficiency. The storage elastic modulus is preferably 280 MPa or more, more preferably 300 MPa or more.

Further, the present invention relates to a method of producing the polishing pad, which comprises the steps consisting of adding a hydroxyl-free silicone-based surfactant to at least one of a first component containing an isocyanate group-containing compound and a second component containing an active hydrogen group-containing compound, in an amount of 0.1 to 5 wt % based on the total amount of the first and second components, stirring the component containing the surfactant in an inert gas to prepare a cell dispersion having the inert gas as fine cells dispersed therein, mixing the remaining component with the cell dispersion, and hardening the mixture to produce finely foamed polyurethane.

Another polishing pad of the present invention is a polishing pad containing a polishing layer comprising a polymer material as a matrix material, wherein the contact angle of the polymer material to water is 70 to 95°.

In the present invention, a polymer material having suitable wetting properties is used as the matrix material forming the polishing layer in the polishing pad. The polishing pad having the polishing layer using such polymer material having suitable wetting properties can be easily produced without a hydrophilization treatment in the process of producing the polishing layer of the polishing pad, thus simplifying the process, is highly compatible with polishing slurry, can polish an object of polishing uniformly with less scratching, and can maintain a satisfactory polishing rate.

The wetting properties of the polymer material are evaluated by using the contact angle of the polymer material to water. The contact angle is greatly affected by the state of the surface of the polymer material, and is thus measured under the following conditions.

The polymer material is formed into a film of about 100 µm in thickness. The temperature and pressing pressure are suitably established depending on the polymer material. The temperature and pressing pressure for polyurethane are for example 215° C. and about 5 MPa, respectively. The contact angle of the resulting film to water is measured by a droplet method by using a contact angle meter CA-X (Kyowa Kaimen Kagaku Co., Ltd.).

Usually, the surface of the polishing pad is microscopically not flat. For example, the polymer material is foamed to increase retention of abrasive grains in slurry, or grooves are formed to disperse slurry uniformly and to discharge abrasive dust etc., or dressing is conducted to increase retention of abrasive grains and to increase the polishing rate. The contact angle depends considerably on the microscopic shape of the surface. That is, the contact angle is varied depending on the shape of the surface, and cannot be determined depending on the shape. Accordingly, the contact angle of the above-mentioned flat film is measured.

The contact angle is in the range of 70 to 95°. When the contact angle is less than 70°, the resulting polishing pad has significant wetting properties with polishing slurry, depending on the shape of the surface, and thus a solution in the polishing slurry may be absorbed into the polishing pad, thus swelling the polishing pad and deteriorating the stability of the polishing rate.

When the contact angle is greater than 95°, the resulting polishing pad does not sufficiently retain polishing slurry thereon, depending on the shape of the surface, to reduce the polishing rate. Even if the polishing slurry is retained on the polishing pad, the amount of the adhering polishing slurry is uneven, thus failing to uniformly polish an object of polishing. Further, dry regions may occur on the polishing pad, and when a small amount of polishing slurry adheres to such regions, the solution only is removed by evaporation etc., which may result in aggregation of polishing grains on the regions to cause scratches.

The contact angle is more preferably in the range of 75 to 93°, still more preferably in the range of 79 to 91°.

It is preferable in the polishing pad that the polymer material serving as the matrix material of the polishing layer is polyurethane, and the polyol component as a constituent component of the polyurethane is mainly an ether-based polyol, and a part of the ether-based polyol is a water-soluble glycol.

The characteristics of the polishing layer constituting the polishing pad is preferably harder (high modulus of elasticity) in order to improve planarity, or softer (low modulus of elasticity) in order to reduce scratches. That is, a polishing layer having suitable hardness should be employed in order to achieve improvement in planarity and reduction in scratches. A distinctive feature of the polyurethane among polymer materials is that polyurethane having desired physical properties is obtained by changing the composition of starting materials, and a material of suitable hardness can be easily selected therefrom. Further, the polyurethane is a material excellent in resistance to abrasion, particularly in resistance to abrasion with slurry and most suitable as a material of the polishing layer.

The wetting properties of general polyurethane are not significant, and the contact angle thereof to water is high. In particular, the wetting properties of polyether-based polyurethane are lower than those of polyester-based polyurethane. However, the polyester-based polyurethane is hydrolyzed by an aqueous solution of slurry (which is often a basic aqueous solution) to deteriorate the physical properties of the polymer, resulting in a reduction in polishing characteristics. Accordingly, the polyurethane serving as the polymer material of the polishing layer is desirably the polyether-based polyurethane. By allowing the polyurethane-forming component to incorporate ether-based water-soluble glycols, the wetting properties of the resulting polyether-based polyurethane with water can be regulated at the maximum contact angle of from 70 to 95°.

In the polishing pad, the polyurethane serving as the matrix material of the polishing layer is preferably foamed polyurethane having fine cells.

When the polyurethane is foamed polyurethane incorporating fine cells, the resulting polishing pad not only attains optimum wetting properties with slurry, but can also retain slurry abrasive grains on the surface of the pad during polishing, thus achieving a satisfactory polishing rate. The fine cells possessed by the foamed polyurethane are those having an average cell diameter of 70 µm or less, preferably 50 µm or less, more preferably 40 µm or less. Generally, the cell diameter is preferably 30 to 40 µm.

In the polishing pad, the foamed polyurethane serving as the matrix material of the polishing layer preferably contains a silicone-based surfactant.

Further, the present invention relates to a method of producing a polishing pad having a polishing layer comprising foamed polyurethane having fine cells, wherein the contact angle of the foamed polyurethane is 70 to 95°, which comprises the following steps:

(1) a stirring step of adding a silicone-based surfactant to an isocyanate-terminated prepolymer and stirring the mixture in the presence of an inert gas to form a cell dispersion, (2) a mixing step of mixing a chain extender with the cell dispersion to form a foamed reaction solution, and (3) a hardening step of reacting and hardening the foamed reaction solution.

Preferably, the method of producing the polishing pad further comprises a lamination step of laminating the polishing layer with a soft porous sheet.

Another polishing pad of the present invention comprises at least a polishing layer and a cushion layer, wherein the degree of swelling of the cushion layer with water is 40% or less.

The degree of swelling of the cushion layer with water is made 40% or less thereby providing a polishing pad with less reduction in hardness, less change in compressibility, thus less change in the characteristics of the whole polishing pad, and preventing the reduction in wafer yield caused by a change with time of polishing characteristics such as uniformity and polishing rate. In addition, a polishing pad with long life and a stable and high polishing rate can be obtained.

The degree of swelling is determined by dipping a material used as the cushion layer in distilled water for a predetermined time at a predetermined temperature and calculating the degree of swelling from the weights before and after dipping, according to the following equation:

Degree of swelling (%)=[(weight after dipping−weight before dipping)/weight before dipping]×100

The cushion layer may be resin foam of closed-cell type, or non-foamed resin.

The polishing pad is used preferably to polish a semiconductor wafer or a glass substrate for precision instruments.

DETAILED DESCRIPTION OF THE PREFERRED EMBODIMENT

<[I] Polishing Pad>

Figure 1:
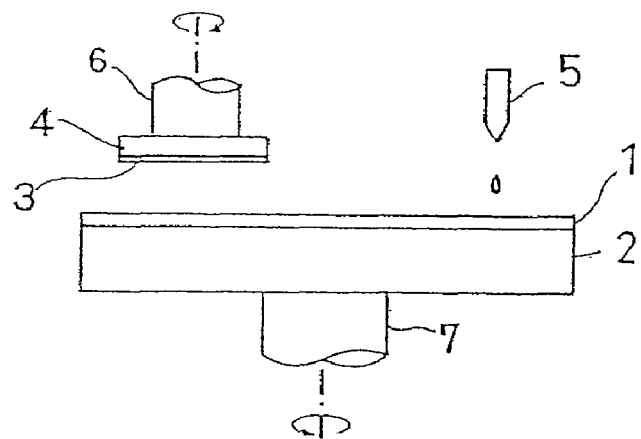
FIG. 1 is an illustration of a semiconductor-polishing apparatus.

The material for forming the polishing layer in the polishing pad of the present invention is not particularly limited, and examples thereof include polyurethane, polyester, polyamide, acrylic resin etc. Among these materials, the polyurethane resin is preferably used because it is excellent in abrasion resistance, and the composition of its starting materials can be significantly changed to constitute the polishing layer easily, as described above.

Hereinafter, the polyurethane resin is described in detail as the material for forming the polishing layer. The polyurethane resin comprises polyisocyanate, a polyol compound and a chain extender, and is particularly preferably a foamed polymer obtained by reacting and hardening an isocyanate-terminated urethane prepolymer in a foamed state with an organic diamine compound as a chain extender.

The isocyanate-terminated urethane prepolymer is obtained by reacting polyisocyanate with a polyol compound known in the technical field of polyurethane in the presence of an excess of isocyanate groups therein.

As the polyisocyanate, compounds known in the field of polyurethane can be used without particular limitation. The polyisocyanate includes aromatic diisocyanates such as 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethylhexamethylene diisocyanate and 1,6-hexamethylene diisocyanate, and alicyclic diisocyanates such as 1,4-cyclohexane diisocyanate, 4,4'-dicyclohexylmethane diisocyanate, isophorone diisocyanate and norbornane diisocyanate. These may be used alone or as a mixture of two or more thereof.

As the polyisocyanate, not only the diisocyanate compounds described above but also multifunctional (trifunctional or more) polyisocyanate compounds can be used. As the multifunctional isocyanate compounds, Desmodule-N (manufactured by Bayer) and a series of diisocyanate adduct compounds under the trade name of Duranate (Asahi Chemical Industry Co., Ltd.) are commercially available.

Among the diisocyanates described above, 4,4'-dicyclohexylmethane diisocyanate (hydrogenated MDI=HMDI) and toluene diisocyanate are preferably simultaneously used. In respect of characteristics of foamed polyurethane, toluene diisocyanate is preferably a mixture of 2,4-toluene diisocyanate/2,6-toluene diisocyanate in a molar ratio of 100/0 to 60/40.

The polyol compound includes compounds known as polyols in the technical field of polyurethane, such as hydroxy-terminated polyester, polycarbonate, polyester carbonate, polyether, polyether carbonate and polyester amide, among which polyether and polycarbonate excellent in hydrolysis resistance are preferable, and polyether is particularly preferable from the viewpoint of low cost and melt viscosity. In consideration of the alkali resistance of polyurethane resin, it is preferable to use ether-based polyol or polycarbonate polyol as the polyol compound.

The number-average molecular weight of these polyols is not particularly limited, but is desirably 500 to 5000, more preferably 500 to 3000, from the viewpoint of the elastic characteristics of the resulting polyurethane foam.

When the number-average molecular weight of the polyol is less than 500, the polyurethane foam obtained from the polyol can easily become a brittle polymer not having sufficient elastic characteristics, and a polishing pad using this polyurethane foam as matrix is so hard as to cause scratches on the polished surface of a workpiece. Further, the polishing pad is easily abraded and is thus not preferable from the viewpoint of its life.

On the other hand, when the number-average molecular weight is higher than 5000, a polishing pad comprising as matrix the polyurethane foam obtained therefrom may be soft to fail to achieve sufficiently satisfactory planarity.

The polyether polyol includes reaction products of a starting compound having reactive hydrogen atoms and at least one alkylene oxide such as ethylene oxide, propylene oxide, butylene oxide, styrene oxide, tetrahydrofuran and epichlorohydrin. The starting compound having reactive hydrogen atoms includes water, bisphenol A, and divalent alcohols described below which are used in producing polyester polyol.

The polyether polyol includes polytetramethylene glycol (PTMG), polypropylene glycol (PPG), polyethylene glycol (PEG) etc. Particularly, polytetramethylene glycol is preferable as a material excellent in alkali resistance.

The polycarbonate polyol having a hydroxy group includes, for example, reaction products of diol such as 1,3-propane diol, 1,4-butane diol, 1,6-hexane diol, diethylene glycol, polyethylene glycol, polypropylene glycol and/or polytetramethylene glycol and phosgene, diallyl carbonate (for example diphenyl carbonate) or cyclic carbonate (for example propylene carbonate).

The polyester polyol includes polybutylene adipate, polyhexamethylene adipate, polycaprolactone polyol etc.

The polyester polyol includes reaction products of divalent alcohol and dibasic carboxylic acid, and for improving hydrolysis resistance, the length of the ester linkage is preferably longer, and thus a combination of long-chain components is desired.

The divalent alcohol constituting the polyester polyol includes, but is not limited to, ethylene glycol, 1,3- and 1,2-propylene glycol, 1,4-, 1,3- and 2,3-butylene glycol, 1,6-hexane diol, 1,8-octane diol, neopentyl glycol, cyclohexane dimethanol, 1,4-bis-(hydroxymethyl)-cyclohexane, 2-methyl-1,3-propane diol, 3-methyl-1,5-pentane diol, 2,2,4-trimethyl-1,3-pentane diol, diethylene glycol, dipropylene glycol, triethylene glycol, tripropylene glycol, dibutylene glycol etc.

As the dibasic carboxylic acid constituting the polyester polyol, aliphatic, alicyclic, aromatic and/or heterocyclic dibasic carboxylic acids can be used without particular limitation, and the aliphatic or alicyclic dibasic carboxylic acids are preferably used for the necessity for making a solution of the formed terminal NCO prepolymer or for reducing its melt viscosity, and when the aromatic ones are used, they are used preferably in combination with aliphatic or alicyclic carboxylic acids.

The preferable dibasic carboxylic acids include, for example, succinic acid, adipic acid, suberic acid, azelaic acid, sebacic acid, phthalic acid, isophthalic acid, terephthalic acid, naphthalene dicarboxylic acid, o-cyclohexane dicarboxylic acid, m-cyclohexane dicarboxylic acid, p-cyclohexane dicarboxylic acid, dimer aliphatic acid, oleic acid etc.

As the polyester polyol, a ring-opening polymer of lactone such as ε-caprolactone, or a condensation polymer (polyester) of hydroxycarboxylic acid such as ε-hydroxycaproic acid can also be used.

As the polyester polycarbonate polyol, reaction products of a polyester glycol (for example polycaprolactone polyol) and an alkylene carbonate, and reaction products of an organic carboxylic acid and a reaction mixture obtained by reacting ethylene carbonate with a polyvalent alcohol, are mentioned as materials excellent in alkali resistance.

In the isocyanate-terminated urethane prepolymer, a low-molecular polyol in addition to the polyol compound may be used. The low-molecular polyol includes divalent alcohols used in the polyester polyol, and preferably used divalent alcohols include diethylene glycol, 1,3-butylene glycol, 3-methyl-1,5-pentane diol and 1,6-hexamethylene glycol, or mixtures thereof. When a divalent alcohol having a longer chain than that of 1,6-hexamethylene glycol is used, a molded polyurethane polishing material having suitable hardness may be finally obtained with suitable reactivity at the time of cast molding.

In production of the polishing layer-forming foamed polyurethane having fine cells, the above-mentioned polyols may be used alone or as a mixture of two or more thereof. If necessary, a trifunctional or more components may be used in combination therewith.

As the polyol compound and the low-molecular polyol, bifunctional components are mainly used, and in a preferable mode, multifunctional (trifunctional or more) components are used in combination therewith in order that the thermal dimensional change of the resulting polishing pad can be reduced stably to 3% or less.

The isocyanate component is selected suitably depending on pot life required at the time of cast molding, and is used singly or as a mixture of two or more isocyanates so that the melt viscosity of the formed NCO-terminated prepolymer can be reduced.

As the organic diamine compound used as a chain extender for the isocyanate-terminated prepolymer in the present invention, known chain extenders can be used without particular limitation. The chain extender is an organic compound having at least 2 active hydrogen groups, and the active hydrogen group includes a hydroxyl group, a primary or secondary amino group, a thiol group (SH) etc. Examples thereof include polyamines such as 4,4'-methylenebis(o-chloroaniline) (MOCA), 2,6-dichloro-p-phenylene diamine, 4,4'-methylenebis(2,3-dichloroaniline), 3,5-bis(methylthio)-2,4-toluene diamine, 3,5-bis(methylthio)-2,6-toluene diamine, 3,5-diethyltoluene-2,4-diamine, 3,5-diethyltoluene-2,6-diamine, trimethylene glycol-di-p-aminobenzoate, 1,2-bis(2-aminophenylthio)ethane, 4,4'-diamino-3,3'-diethyl-5,5'-dimethyldiphenylmethane, or the low-molecular polyols described above. These may be used alone or as a mixture of two or more thereof.

The proportion of the polyisocyanate, the polyol compound and the chain extender can be changed depending on their molecular weights and the desired physical properties of the polishing pad. To obtain the polishing pad having desired polishing characteristics, the number of isocyanate groups in the polyisocyanate to the number of total active hydrogen groups (hydroxyl groups+amino groups) in the polyol compound and the chain extender is preferably in the range of 0.95 to 1.15, more preferably 0.99 to 1.10.

The ratio of the polyol compound to the low-molecular polyol is suitably determined depending on the required characteristics of the polyurethane resin produced therefrom.

From the viewpoint of hydrolysis resistance, elastic properties and abrasion resistance, it is necessary that in the polishing pad described in claim 23, polytetramethylene glycol should be contained as the polyol. This polytetramethylene glycol should satisfy a number-average molecular weight of 500 to 1600 and a molecular-weight distribution (weight-average molecular weight/number-average molecular weight) of less than 1.9.

This number-average molecular weight is determined from hydroxyl value measured according to JIS K 1557. The molecular-weight distribution is determined under the following measurement conditions:

GPC unit: LC-10A (manufactured by Shimadzu Corporation)
Sample: About 4 mg sample dissolved in 2 ml tetrahydrofuran
Columns: Two MIX-E columns (manufactured by PL)
Column temperature: 40° C.
Mobile phase: Tetrahydrofuran
Flow rate: 0.7 ml/min.
Injection volume: 60 μl
Detector: RI (37° C.)
Molecular-weight distribution: Determined using standard PPG (polypropylene polyol)

It is not preferable that the number-average molecular weight of this tetramethylene glycol is less than 500, because polyurethane obtained therefrom is a brittle polymer not having sufficiently elastic characteristics, and a polishing pad obtained produced from this polyurethane is too brittle, thus causing scratches on the polished surface of a workpiece. A number-average molecular weight of less than 500 is not preferable either from the viewpoint of the life of the pad.

It is not preferable that the number-average molecular weight of the tetramethylene glycol is higher than 1600, because a polishing pad produced from polyurethane obtained from the tetramethylene glycol is soft, thus failing to achieve sufficiently satisfactory planarizing processing.

When the molecular-weight distribution of the polytetramethylene glycol is 1.9 or more, the temperature dependence of the hardness (modulus of elasticity) of polyurethane obtained therefrom is significant, and a polishing pad produced from this polyurethane shows a significant difference in hardness (modulus of elasticity) due to temperature. As described above, the temperature of the polishing pad during polishing is changed due to generation of frictional heat between the polishing pad and a workpiece. Accordingly, there occurs an undesirable difference in polishing characteristics.

As the polyol other than polytetramethylene glycol, the polyol compound and the low-molecular polyol may also be simultaneously used in such a range that the characteristics of the polishing pad are not deteriorated.

From the viewpoint of the mechanical characteristics, abrasion resistance etc. of the resulting polyurethane and a polishing pad obtained therefrom, it is necessary that in the polishing pad described in claim 23, 4,4'-methylenebis(o-chloroaniline) is contained as the major ingredient of the curing agent. However, polyamines such as 2,6-dichloro-p-phenylene diamine, 4,4'-methylenebis(2,3-dichloroaniline) etc. or the low-molecular polyol may be simultaneously used as a curing agent in addition to 4,4'-methylenebis(o-chloroaniline) in such a range that the characteristics of the polishing pad are not deteriorated.

The form of the polishing pad described in claim 23 may be composed of a polyurethane matrix impregnated with high-molecular fine elements containing a pressurized gas therein as shown in Japanese Patent No. 3013105, or may be composed of finely foamed polyurethane having polystyrene-based beads dispersed therein as shown in JP-A 11-322878. Further, the polishing pad may be composed of polyurethane foam having fine cells as shown in JP-A 2000-178374.

The polyurethane resin of the present invention can be produced by known urethane-making techniques such as a melting method, a solution method etc., but in consideration of cost and working atmosphere, the polyurethane resin is formed preferably by the melting method.

The polyurethane can be produced by a prepolymer method or a one-shot method, but the prepolymer method wherein an isocyanate-terminated prepolymer synthesized previously from polyisocyanate and a polyol compound is reacted with a chain extender is preferable because the resulting polyurethane is excellent in physical properties.

When a commercially available isocyanate-terminated prepolymer produced from polyisocyanate and a polyol compound can be adapted to the present invention, the commercial product can be used in the prepolymer method, to polymerize the polyurethane used in the present invention. An isocyanate-terminated prepolymer having a molecular weight of about 800 to 5000 is preferable because of excellent processability, physical properties etc.

A mixture of two or more kinds of isocyanate-terminated prepolymers may be used, and particularly in production of foamed polyurethane using an aliphatic or alicyclic diisocyanate and an aromatic diisocyanate, a prepolymer using an aliphatic or alicyclic diisocyanate is mixed in a preferable mode with a prepolymer using an aromatic diisocyanate.

The method of regulating the degree of remaining isocyanate monomers involves for example producing a prepolymer with a low degree of remaining isocyanate monomers and then adding isocyanate monomers to the prepolymer, or removing isocyanate monomers by distillation or under reduced pressure from a prepolymer with a high degree of remaining monomers.

The polyurethane is produced by mixing a first component containing an isocyanate group-containing compound with a second component containing an active hydrogen group-containing compound and then curing-hardening the mixture. In the prepolymer method, the isocyanate-terminated prepolymer serves as the isocyanate group-containing compound and the chain extender serves as the active hydrogen group-containing compound. In the one-shot method, the polyisocyanate serves as the isocyanate group-containing compound, and the chain extender and polyol compound serve as the active hydrogen group-containing compound.

The method of producing the polyurethane resin includes, but is not limited to, a method of adding hollow beads and a method of forming foam by mechanical foaming. Both methods can be simultaneously used, but the mechanical foaming method using an active hydrogen group-free silicone-based surfactant consisting of a polyalkyl siloxane/polyether copolymer is more preferable.

In production of the polyurethane, it is possible to use techniques wherein before or while the polyurethane materials (the first component containing an isocyanate group-containing compound and the second component containing an active hydrogen group-containing compound) are mixed and stirred, the polyurethane materials incorporate cells of inert gas and then hardened and foamed to produce a polyurethane resin foam block in a foamed state (preferably in a foamed state having fine cells).

In this case, it is preferable that a silicone-based surfactant is preferably added to the polyurethane material (the first component containing an isocyanate group-containing compound and/or the second component containing an active hydrogen group-containing compound), and after or while the component to which the silicone-based surfactant was added is dispersed as fine cells under stirring in an inert gas, the remaining component is mixed therewith. It is a very effective means to previously mix the silicone-based surfactant with the polyurethane material in order to produce fine cells stably.

As the silicone-based surfactant used in the present invention, a surfactant consisting of a polyalkylsiloxane/polyether copolymer is preferably used. The surfactant can be exemplified by compounds represented by the following chemical formulas 1 to 6:

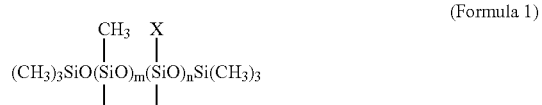

(Formula 1)

(Formula 2)

(Formula 3)

-continued

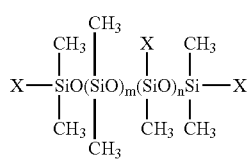

(Formula 4)

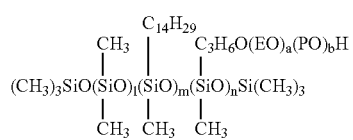

(Formula 5)

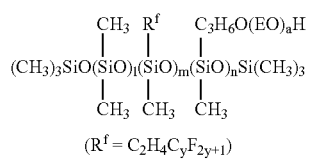

(Formula 6)

$(R^f = C_2H_4C_yF_{2y+1})$

The substituent X in the chemical formulas 1 to 4 includes the following substituent groups.

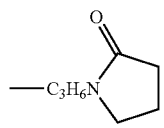

(Formula 7)

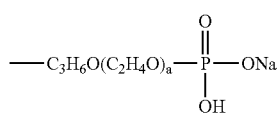

(Formula 8)

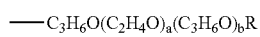 (Formula 9)

 (Formula 10)

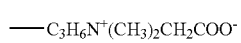 (Formula 11)

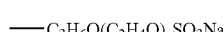 (Formula 12)

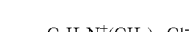 (Formula 13)

The substituent groups illustrated above are preferably those not having a hydroxyl group. The polyether includes polyethylene oxide, polypropylene oxide or copolymers thereof. These surfactants are shown merely for illustrative purposes and not intended to be limitative.

Preferable examples of the commercial silicone-based surfactants include SH-192, SH-193 (Toray Dow Corning Silicone Co., Ltd.). L-5340 (Nippon Unicar) etc.

In the present invention, the hardness of the polishing layer of the polishing pad containing a surfactant, as determined by a D-type rubber hardness meter, is preferably from 45 or more to less than 65. When the D hardness is less than 45, planarizing characteristics are deteriorated, while when the D hardness is 65 or more, planarizing characteristics are excellent, but the polishing uniformity of a semiconductor wafer is deteriorated.

In the present invention, the hardness of the cushion layer of the polishing pad containing a surfactant, as determined by a D-type rubber hardness meter, is preferably from 1 or more to less than 40. When the hardness is more preferably from 2 or more to less than 35, particularly preferably from 5 or more to less than 30. When the hardness is less than 1, within wafer uniformity is deteriorated, while when the hardness is 40 or more, planarizing characteristics are deteriorated.

In the present invention, the compressibility of the polishing layer of the polishing pad is preferably 0.5 to 5%. When the compressibility is in this range, a polishing pad excellent in uniformity can be obtained. The compressibility is expressed by the following equation:

Compressibility (%)=$(T1-T2)/T1\times 100$ wherein T1 represents the thickness of the polishing layer after application of 30 kPa (300 g/cm 2) stress for 60 seconds to the polishing layer, and T2 represents the thickness of the layer after application of 180 kPa stress for 60 seconds to the layer in the state T1.

When the polyurethane foam used as the polishing layer in the polishing pad in the present invention is of closed-cell type, its density is preferably 0.6 to 1.1 g/cm$^3$. When the density is lower than 0.6 g/cm$^3$, the strength is significantly lowered and thus the polishing layer cannot endure friction upon polishing. When the density is higher than 1.1 g/cm$^3$, cells hardly occur, and the polishing rate of the formed polishing pad is lowered.

For the purpose of improving the polishing uniformity of a material to be polished, the polishing pad in the present invention may be composed of at least two layers, that is, a polishing layer contacting with a material to be polished and a polishing layer-supporting cushion layer softer than the polishing layer. In this case, the cushion layer may be a layer made of a nonwoven fabric such as a polyester nonwoven fabric, a nylon nonwoven fabric or an acrylic nonwoven fabric, a material comprising the nonwoven fabric impregnated with polyurethane resin, and closed-cell foam such as polyurethane foam or polyethylene foam. Those preferably used in respect of productivity, low cost and stability of physical properties are an urethane-impregnated polyester nonwoven fabric, polyurethane foam and polyethylene foam, particularly polyurethane closed-cell foam. Such foam can be used to provide an inexpensive pad excellent in durability upon repeated loading. The polishing pad may have an adhesive layer (tack tape layer) between the polishing layer and the cushion layer.

In the polishing pad of the present invention, the thickness of the polishing layer is preferably 0.8 to 2 mm, and the thickness of the cushion layer is not particularly limited and can be suitably determined depending on the material used, but is preferably 0.5 to 2 mm for the balance with the rigidity of the polishing layer.

The method of producing the polishing pad according to the present invention is described by reference to an example wherein an isocyanate-terminated prepolymer is used as the isocyanate group-containing compound. The method of producing the polishing pad according to the present invention comprises the following steps:

(1) Stirring Step of Preparing a Cell Dispersion of an Isocyanate-Terminated Prepolymer A silicone-based surfactant is added to an isocyanate-terminated prepolymer and stirred in an inert gas, and the inert gas is dispersed as fine cells to form a cell dispersion. When the prepolymer is in a solid form at ordinary temperatures, the prepolymer is melted by pre-heating to a suitable temperature.

(2) Step of Mixing a Curing Agent (Chain Extender)

A chain extender is added to, and mixed with, the cell dispersion under stirring to form a foamed reaction solution.

When the chain extender is a solid compound at ordinary temperatures, the chain extender is preferably added after being melted.

(3) Hardening step

The isocyanate-terminated prepolymer mixed with the chain extender is cast in a predetermined mold and hardened by heating.

The polyurethane resin foam thus prepared is cut in a predetermined size and used as a polishing layer.

The inert gas used in production of the polyurethane resin foam is a gas composed exclusively of components in the form of gas at ordinary temperatures, which do not react with an isocyanate group or an active hydrogen group. The gas may be sent positively to the solution, or the gas may be naturally incorporated into the solution under stirring. The inert gas used for forming fine cells is preferably not combustible, and is specifically nitrogen, oxygen, a carbon dioxide gas, a rare gas such as helium and argon, and a mixed gas thereof, and the air dried to remove water is most preferable in respect of cost.

In the present invention, a stabilizer such as an oxidant etc., a lubricant, a pigment, a filler, an antistatic and other additives may be added if necessary to the polyurethane composition.

Before or after cutting the sheet polishing layer into the one having the size of the polishing pad, the polishing layer is laminated if necessary with a soft porous sheet or the like as a cushion layer to produce a polishing pad of 2-layer structure.

As a stirrer for dispersing the silicone-based surfactant-containing isocyanate-terminated prepolymer to form fine cells with the inert gas, known stirrers can be used without particular limitation, and examples thereof include a homogenizer, a dissolver, a twin-screw planetary mixer etc. The shape of a stirring blade of the stirrer is not particularly limited either, but a whipper-type stirring blade is preferably used to form fine cells.

In a preferable mode, different stirrers are used in stirring for forming a cell dispersion in the stirring step and in stirring for mixing an added chain extender in the mixing step, respectively. In particular, stirring in the mixing step may not be stirring for forming cells, and a stirrer not generating large cells is preferably used. Such a stirrer is preferably a planetary mixer. The same stirrer may be used in the stirring step and the mixing step, and stirring conditions such as revolution rate of the stirring blade are preferably regulated as necessary.

In the method of producing the polyurethane foam according to the present invention, heating and post-curing of the foam obtained after casting and reacting the cell dispersion in a mold until the dispersion lost fluidity are effective in improving the physical properties of the foam, and are extremely preferable. The cell dispersion may be cast in a mold and immediately post-cured in a heating oven, and even under such conditions, heat is not immediately conducted to the reactive components, and thus the diameters of cells are not increased. The hardening reaction is conducted preferably at normal pressures to stabilize the shape of cells.

Then, the resulting polyurethane resin foam block is sliced to thickness suitable for the polishing pad (polishing layer). The thickness of the polishing layer is about 0.8 mm to 2 mm, and usually a sheet of about 1.2 mm in thickness is used. Alternatively, the polyurethane resin foam may be prepared by casting the polyurethane components in a mold with a cavity having the same thickness as that of the objective polishing layer.

In the present invention, a known catalyst promoting polyurethane reaction, such as tertiary amine- or organotin-based catalysts, may be used. The type and amount of the catalyst added are determined in consideration of flow time in casting in a predetermined mold after the mixing step.

Production of the polyurethane foam of closed-cell type constituting the polishing layer of the present invention may be in a batch system where each component is weighed and introduced into a vessel or in a continuous production system where each component and an inert gas are continuously supplied to and stirred in a stirring device and the resulting cell dispersion is removed to produce molded articles.

The surface of the polishing layer can be provided thereon with grooves or on the backside thereof with a soft porous sheet etc. to form a polishing pad. The grooves on the surface of the polishing layer have an action of removing abrasive dust and abrasive material from the contact surface between a material polished and the polishing sheet. The shape of the grooves is not particularly limited, and the grooves may be those having a rectangular, triangular, U-shaped or semicircular section through which fine powder passes. The grooves are arranged in the form of concentric circles or in a checked pattern on the sheet. The depth of the groove is about 0.4 to 0.8 mm depending on the thickness of the sheet, etc.

The method of polishing a semiconductor wafer according to the present invention can be carried out after fitting the polishing pad of the present invention to a known polishing machine. As an abrasive supplied between the polishing layer and a semiconductor wafer to be polished, any know abrasives used in polishing a semiconductor wafer can be used without limitation. Examples of such abrasives include ceria, silica etc. A commercial product such as slurry SemiSperse-12 (manufactured by Cabot) is also preferably used.

EXAMPLES

Hereinafter, the present invention is described in more detail by reference to the Examples, but the present invention is not limited by the Examples.

Examples 1 to 3

<Evaluation Methods>

(Evaluation of Polishing Characteristics)

As the polishing apparatus, SPP600S manufactured by Okamoto Machine Tool Works, Ltd. was used in evaluation of polishing characteristics. The thickness of an oxide film was measured by an interference film thickness measuring device manufactured by Otsuka Denshisha. The polishing conditions were as follows: slurry SemiSperse-12 (manufactured by Cabot) was dropped at a flow rate of 150 ml/min., the polishing loading was 350 g/cm$^2$, the number of revolutions of the polishing platen was 35 rpm, and the number of revolutions of the wafer was 30 rpm.

For evaluation of polishing characteristics, a 0.5 µm thermal-oxide film was deposited on an 8-inch silicone wafer and subjected to the following patterning (270/30 and 30/270 line/space), and then a 1 µm oxide film of p-TEOS was deposited thereon, to prepare a wafer having a pattern with an initial difference in level of 0.5 µm. This wafer was polished under the above-described conditions, and after polishing, each difference in level was measured to evaluate planarizing characteristics. For planarizing characteristics, two differences in level were measured. One difference is a local difference in level, which is a difference in level in a pattern having lines of 270 µm in width and spaces, 30 µm each, arranged alternately, and the other difference is an abrasion loss in the concaves of spaces in a pattern having lines of 30 µm in width and spaces of 270 µm arranged alternately. The average polishing rate was the average of those in the 270 µm lines and 30 µm lines.

(Evaluation of the Number of Cells)

In measurement of the number of cells, the resulting foam polishing layer was cut with a microtome (sample size: 5 mm×5 mm), and a microphotograph (×200) of its section (measurement area: 0.45×0.67 mm) after separation of cells was measured for the number of cells per unit area and the cell-size distribution by an image processing unit image analyzer V10 (TOYOBO Co., Ltd.). The limit of detection of cells is 1 μm.

(Evaluation of Average Cell Diameter)

In measurement of average cell diameter, the resulting foam polishing layer was cut with a microtome, and a microphotograph (×200) of its section after separation of cells was measured for the cell-size distribution per unit area by an image processing unit image analyzer V10 (TOYOBO Co., Ltd.) to calculate the average cell diameter.

(Evaluation of Compressibility)

The foam polishing layer (sample size: 7 mm in diameter) under a loading at 25° C. by a cylindrical indenter of 5 mm in diameter was measured for T1 (μm) and T2 (μm) by TMA manufactured by Mac Science.

$$\text{Compressibility (\%)}=[(T1-T2)/T1]\times 100$$

where T1 represents the thickness of a sheet after application of 30 kPa (300 g/cm$^2$) stress for 60 seconds to the sheet, and T2 represents the thickness of the sheet after application of 180 kPa stress for 60 seconds to the sheet in the state T1.

(Method of Measuring D Hardness)

Determined according to JIS K6253.

The polishing layer having a thickness of 1.27 mm is cut into 6 samples which are 1.5 by 1.5 cm square. The samples thus cut off are maintained at 23.5° C.±2° C. under 50% humidity for 16 hours, and then the 6 samples were piled up and set in a D harness meter. A needle of the D hardness meter is stuck into the 6 layered samples, and 1 minute later, an indicator of the D hardness meter is read.

(Measurement of storage elastic modulus)'c modulus was measured in a frequency of 1 Hz with sinusoidal wave vibration with a tensile test jig in a dynamic viscoelasticity measuring device Rheogel-E4000 (manufactured by UBM). Storage elastic modulus was measured at a temperature of from −20° C. to 80° C. in a temperature-dependent mode, and as the elastic modulus, the storage elastic modulus at 40° C. was shown.

(Evaluation of Uniformity)

After polishing, 20 points on the polished surface of a silicone wafer provided with an oxide film thereon were measured for the thickness of the film by an interference film thickness measuring device. The maximum thickness Rmax and minimum thickness Rmin of the film were used to calculate uniformity (%) according to the following equation:

$$\text{Uniformity (\%)}=(R\text{max}-R\text{min})/(R\text{max}+R\text{min})\times 100$$

(Method of Quantifying a Surfactant)

15 mg of the polishing pad was weighed and dissolved in dimethyl sulfoxide-d$_6$ (0.7 ml) at 130° C. The solution was settled by centrifugation, and 5 mg tetrachloroethane was added to the supernatant, and its spectrum was measured under the conditions of a measurement temperature of 80° C., a detection pulse of 15°, an FID incorporation time of 4 seconds, a repeating time of 9 seconds, and the measurement range of −2 to 14 ppm by a proton NMR unit (AVANCE-500, 500 MHz, manufactured by Bruker). A window function at the time of Fourier conversion was not used. The content of the surfactant (wt %) was quantified from the area of a peak near 6.8 ppm attributable to tetrachloroethane and the area of a peak near 0 ppm attributable to a methyl group bound to Si in the spectrum.

Example 1

Example 1-1 parts by weight of a polyether-based urethane prepolymer (Adiprene L-325 manufactured by Uniroyal) and 120 parts by weight of a silicone-based surfactant SH192 (dimethyl polysiloxane/polyoxyalkylene glycol copolymer manufactured by Toray Dow Corning Silicone Co., Ltd.) were introduced into a vessel and mixed at about 900 rpm with a stirrer to produce a foamed solution (cell dispersion), and thereafter, the stirrer was exchanged with another stirrer, and 770 parts by weight of molten 4,4'-methylene-bis(2-chloroaniline) were introduced as a curing agent into it under stirring. The mixture was stirred for about 1 minute, and the mixed solution was introduced into a pan-type open mold and post-cured for 6 hours in an oven at 1110° C., to produce a foamed polyurethane block. The resulting foamed polyurethane had 350 cells/mm$^2$, an Asker D hardness of 52, a compressibility of 2.0%, a storage elastic modulus of 279 MPa, a specific gravity of 0.8 and an average cell diameter of 40 μm.

Under heating at about 50° C., this foamed polyurethane block was sliced into a sheet of 1.27 mm in thickness by slicer VGW-125 (manufactured by Amitec) to give a polishing sheet.

Figure 2:
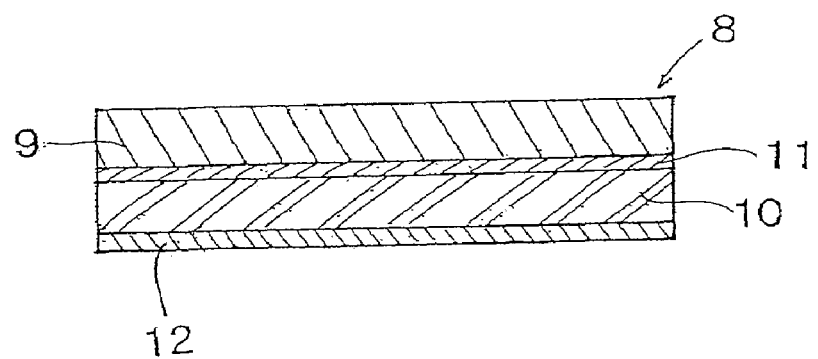
FIG. 2 is an illustration showing the constitution of a polishing pad.

A nonwoven fabric with a basic weight of 200 g/m$^2$ using 3.5-denier polyester fibers was impregnated with 30 wt % water-dispersed polyurethane emulsion, then dried and used as a soft layer. The compressibility of this nonwoven fabric layer was about 15%. This nonwoven fabric was stuck on the previously prepared polishing layer via a double-tack tape #5782 (Sekisui Chemical Co., Ltd.), and a double-tack tape #5782 (Sekisui Chemical Co., Ltd.) was further stuck on the nonwoven fabric, to complete a polishing pad. FIG. 2 is an illustration showing the constitution of the resulting polishing pad.

Example 1-2

A polishing pad was prepared in the same manner as in Example 1 except that the amount of the silicone-based surfactant SH-192 in Example 1-1 was changed to 50 parts by weight. The resulting foamed polyurethane had 230 cells/mm$^2$, a D hardness of 58, a compressibility of 1.4%, a storage elastic modulus of 295 MPa, a specific gravity of 0.87 and an average cell diameter of 35 μm. By elementary analysis with fluorescent X rays, Si was detected, and it was thus confirmed that the predetermined surfactant was contained.

Example 1-3

A double-tack tape #5782 was stuck on the polishing sheet obtained in Example 1-1, and as a layer having lower modulus of elasticity, the following layer was stuck thereon. As the lower soft layer, polyethylene foam of 10-fold degree of foaming was used. The compressibility of this foam layer was about 10%. This foam was stuck on the previously prepared polishing layer via a double-coated tape, and a double-tack tape #5782 was stuck on this foam to complete a polishing pad.

Example 1-4

A double-tack tape #5782 was stuck on the polishing sheet obtained in Example 1-2, and as a layer having lower modulus of elasticity, the following layer was stuck thereon. As the lower soft layer, polyurethane foam of 15-fold degree of foaming was used. The compressibility of this foam layer was about 12%. This foam was stuck on the previously prepared polishing layer via a double-coated tape, and a double-tack tape #5782 was stuck on this foam to complete a polishing pad.

Comparative Example 1-1

A polishing pad was prepared in the same manner as in Example 1 except that the amount of the silicone-based surfactant added in Example 1-1 was changed to 1.4 parts by weight. The resulting foamed polyurethane could not form cells well, and the number of cells was low. The physical properties of the polishing pad were as follows: 110 cells/mm$^2$; D hardness, 60; compressibility, 1.0%; storage elastic modulus, 302 MPa; specific gravity, 0.91; and average cell diameter, 65 μm.

Comparative Example 1-2

A polishing pad was prepared in the same manner as in Example 1 except that the amount of the silicone-based surfactant added in Example 1-1 was changed to 100 parts by weight, and hollow resin particles (diameter 5 μm, Matsumoto Yushi) were added in order to generate many cells. In this case, large cells were generated under stirring. The physical properties of the polishing pad were as follows: 850 cells/mm$^2$; D hardness, 45; compressibility, 2.3%; storage elastic modulus, 255 MPa; specific gravity, 0.70; and average cell diameter, 25 μm.

Comparative Example 1-3

A polishing pad was prepared in the same manner as in Example 1 except that the amount of the silicone-based surfactant added in Example 1-1 was changed to 500 parts by weight. In this case, fine cells were uniformly generated. The physical properties of the polishing pad were as follows: 700 cells/mm$^2$; D hardness, 30; compressibility, 5.2%; storage elastic modulus, 105 MPa; specific gravity, 0.45; and average cell diameter, 25 μm.

Comparative Example 1-4

A double-tack tape #5782 was stuck on the polishing sheet obtained in Comparative Example 1-1, and as a layer having lower modulus of elasticity, the following layer was stuck thereon. As the lower soft layer, polyurethane foam of 15-fold degree of foaming was used. The compressibility of this foam layer was about 12%. A double-tack tape #5782 was further stuck on this foam to complete a polishing pad.

TABLE 1

| | Number of cells | Cell diameter (μm) | D hardness | Compressibility (%) | Storage elastic modulus (MPa) | Uniformity (%) | Laminate | Polishing rate (Å/min) | planarity | l. |
|---|---|---|---|---|---|---|---|---|---|---|
| Example 1-1 | 350 | 38 | 52 | 2.0 | 279 | 4 | nonwoven fabric | 2000 | □ | |
| Example 1-2 | 230 | 45 | 58 | 1.4 | 295 | 9 | single layer | 1600 | □ | |
| Example 1-3 | 350 | 37 | 52 | 2.0 | 279 | 3 | polyethylene | 2000 | ○ | |
| Example 1-4 | 230 | 47 | 58 | 1.4 | 295 | 5 | urethane | 1900 | ○ | |
| Comparative Example 1-1 | 110 | 65 | 60 | 1.0 | 302 | 6 | single layer | 800-1500 | ○ | unstable rate |
| Comparative Example 1-2 | 850 | 25 | 45 | 2.3 | 255 | 5 | single layer | 900-1600 | □ | unstable rate |
| Comparative Example 1-3 | 700 | 28 | 30 | 5.2 | 105 | 5 | single layer | 1000-1500 | X | unstable rate |
| Comparative Example 1-4 | 110 | 66 | 60 | 1.0 | 302 | 6 | urethane | 700 | □ | |

Evaluation Results

The evaluation results, together with the characteristics, are shown in Table 1. When the polishing pads in Examples 1-1 to 1-4 were used, it was found that the polishing rate was high and stable, the uniformity was as good as 10% or less, and the planarizing characteristics were also very excellent.

On the other hand, the polishing rate of the polishing pad in Comparative Example 1-1 was unstable and varied every time measurement was conducted. The polishing pad in Comparative Example 1-2 was excellent in uniformity (10% or less), but the polishing rate was unstable, and the planarizing characteristics were slightly deteriorated. The polishing pad in Comparative Example 1-3 was excellent in uniformity (10% or less), but the polishing rate was unstable, and the planarizing characteristics were significantly deteriorated. The polishing pad in Comparative Example 1-4 was excellent in planarizing characteristics, but there were many scratches, the uniformity was as poor as 10% or more, and the polishing rate was slightly low.

Example 2

Example 2-1 parts by weight of a polyether-based urethane prepolymer (Adiprene L-325 manufactured by Uniroyal) and 120 parts by weight of a silicone-based surfactant SH192 (dimethyl polysiloxane/polyoxyalkyl copolymer manufactured by Toray Dow Corning Silicone Co., Ltd.) were introduced into a vessel and mixed at about 900 rpm with a stirrer to produce a cell dispersion, and thereafter, the stirrer was exchanged with another stirrer, and 770 parts by weight of 4,4'-methylene-bis[2-chloroaniline] were introduced into it under stirring. The mixture was stirred for about 1 minute, and then the mixed solution was introduced into a pan-type open mold and post-cured for 6 hours in an oven at 110° C., to produce a foamed polyurethane block. The resulting foamed polyurethane had an Asker D hardness of 52, a compressibility of 2.0%, a storage elastic modulus of 279 MPa, a specific gravity of 0.8 and an average cell diameter of 40 μm.

Under heating at about 50° C., this foamed polyurethane block was sliced into a sheet of 1.27 mm in thickness by slicer VGW-125 (manufactured by Amitec) to give a polishing sheet.

A nonwoven fabric with a basic weight of 200 g/m² using 3.5-denier polyester fibers was impregnated with 30 wt % water-dispersed polyurethane emulsion, then dried and used as a soft layer. The compressibility of this nonwoven fabric layer was about 15%. This nonwoven fabric was stuck on the previously prepared polishing layer via a double-tack tape #5782 (Sekisui Chemical Co., Ltd.), and a double-tack tape #5782 (Sekisui Chemical Co., Ltd.) was further stuck on the nonwoven fabric, to complete a polishing pad. FIG. 2 is an illustration showing the constitution of the resulting polishing pad. The polishing pad 8 has a polishing layer 9 and a cushion layer 10, and the polishing layer 9 is stuck and laminated via a double-coated tape 11 on the cushion layer 10, and the cushion layer 10 is provided with a double-tack tape layer 12 for fitting to a polishing machine.

Example 2-2

A polishing pad was prepared in the same manner as in Example 2-1 except that the amount of the surfactant in Example 2-1 was changed to 40 parts by weight. The resulting foamed polyurethane had a D hardness of 59, a compressibility of 1.3%, a storage elastic modulus of 299 MPa, a specific gravity of 0.85 and an average cell diameter of 55 μm.

Example 2-3

A polishing pad was prepared in the same manner as in Example 2-1 except that the amount of the surfactant in Example 2-1 was changed to 180 parts by weight. The resulting foamed polyurethane had a D hardness of 47, a compressibility of 2.4%, a storage elastic modulus of 272 MPa, a specific gravity of 0.78 and an average cell diameter of 34 μm.

Example 2-4

A double-tack tape #5782 was stuck on the polishing sheet obtained in Example 2-1, and a cushion layer having lower modulus of elasticity was stuck thereon. As the cushion layer, polyethylene foam of 10-fold degree of foaming was used. The compressibility of this foam layer was about 10%. This foam was stuck on the previously prepared polishing layer via a double-coated tape, and a double-tack tape #5782 was stuck on this foam to complete a polishing pad.

Example 2-5

A double-tack tape #5782 was stuck on the polishing sheet obtained in Example 2-2, and a cushion layer having lower modulus of elasticity was stuck thereon. A nonwoven fabric with a basic weight of 200 g/m² using 3.5-denier polyester fibers was impregnated with 30 wt % water-dispersed polyurethane emulsion, then dried and used as the soft cushion layer. The compressibility of this nonwoven fabric layer was about 15%. This nonwoven fabric was stuck on the previously prepared polishing layer via a double-coated tape, and a double-tack tape #5673FW (Sekisui Chemical Co., Ltd.) was further stuck on the nonwoven fabric, to complete a polishing pad. The adhesion strength of each layer stuck by the double-coated tape was at least 60 g/cm.

Example 2-6

A double-tack tape #5782 was stuck on the polishing sheet obtained in Example 2-3, and a cushion layer having lower modulus of elasticity was stuck thereon. As the soft cushion layer, polyurethane foam of 15-fold degree of foaming was used. The compressibility of this foam layer was about 12%. This foam was stuck on the previously prepared polishing layer via a double-coated tape, and a double-tack tape #5782 was stuck on this foam to complete a polishing pad.

Comparative Example 2-1

A polishing pad was prepared in the same manner as in Example 2-1 except that the amount of the surfactant in Example 2-1 was changed to 1.0 part by weight. The physical properties of the polishing pad were as follows: D hardness, 62; compressibility, 0.9%; storage elastic modulus, 310 MPa; specific gravity, 0.9; and average cell diameter, 80 μm.

Comparative Example 2-2

A polishing pad was prepared in the same manner as in Example 2-1 except that the amount of the surfactant in Example 2-1 was changed to 500 parts by weight. In this case, fine bubbles were uniformly generated. The physical properties of the polishing pad were as follows: D hardness, 30; compressibility, 5.2%; storage elastic modulus, 105 MPa; specific gravity, 0.45; and average cell diameter, 25 μm.

Comparative Example 2-3

A double-tack tape #5782 was stuck on the polishing sheet obtained in Comparative Example 2-1, and a cushion layer having lower modulus of elasticity was stuck thereon. As the soft cushion layer, polyethylene foam of 10-fold degree of foaming was used. The compressibility of this foam layer was about 10%. This foam was stuck on the previously prepared polishing layer via a double-coated tape, and a double-tack tape #5782 was stuck on this foam to complete a polishing pad.

Comparative Example 2-4

A double-tack tape #5782 was stuck on the polishing sheet obtained in Comparative Example 2-2, and a cushion layer having lower modulus of elasticity was stuck thereon. A nonwoven fabric with a basic weight of 200 g/m² using 3.5-denier polyester fibers was impregnated with 30 wt % water-dispersed polyurethane emulsion, then dried and used as the soft cushion layer. The compressibility of this nonwoven fabric layer was about 15%. This nonwoven fabric was stuck on the previously prepared polishing layer via the previously stuck double-coated tape, and a double-tack tape #5673FW was further stuck on the nonwoven fabric, to complete a polishing pad. The adhesion strength of each layer stuck by the double-coated layer was at least 600 g/cm.

TABLE 2

|  | Average cell diameter (μm) | Number of cells | D hardness | Compressibility (%) | Storage elastic modulus (MPa) | Uniformity (%) | Laminate | Polishing rate (Å/min) | planarity | 2. |
| --- | --- | --- | --- | --- | --- | --- | --- | --- | --- | --- |
| Example 2-1 | 40 | 360 | 52 | 2.0 | 279 | 4 | nonwoven fabric | 2000 | ☐ | |
| Example 2-2 | 55 | 240 | 59 | 1.3 | 299 | 9 | single layer | 1600 | ☐ | |
| Example 2-3 | 34 | 380 | 47 | 2.4 | 272 | 4 | single layer | 2000 | ○ | |
| Example 2-4 | 40 | 350 | 52 | 2.0 | 279 | 3 | polyethylene | 2000 | ○ | |
| Example 2-5 | 55 | 245 | 59 | 1.3 | 299 | 5 | nonwoven fabric | 1900 | ○ | |
| Example 2-6 | 34 | 370 | 47 | 2.4 | 272 | 3 | urethane | 2200 | ○ | |
| Comparative Example 2-1 | 80 | 100 | 62 | 0.9 | 310 | 12 | single layer | 800-1500 | ☐ | unstable rate |
| Comparative Example 2-2 | 25 | 860 | 30 | 5.2 | 105 | 4 | single layer | 900-1600 | ☐ | unstable rate |
| Comparative Example 2-3 | 80 | 95 | 62 | 0.9 | 310 | 8 | polyethylene | 1550 | ○ | |
| Comparative Example 2-4 | 25 | 850 | 30 | 5.2 | 105 | 3 | nonwoven fabric | 1650 | X | |

Evaluation Results

The evaluation results, together with the characteristics, are shown in Table 2. When the polishing pads in Examples 2-1 to 2-6 were used, it was found that the polishing rate was high and stable, the uniformity was as good as 10% or less, and the planarizing characteristics were also very excellent.

On the other hand, the polishing pad in Comparative Example 2-1 was excellent in planarizing characteristics, but the polishing rate was low, unstable and varied every time measurement was conducted. The polishing pad in Comparative Example 2-2 was excellent in uniformity (10% or less), but the polishing rate was low and unstable, and the planarizing characteristics were significantly deteriorated. The polishing pad in Comparative Example 2-3 was excellent in planarizing characteristics, but the polishing rate was slightly low, and the uniformity was as poor as about 8%. The polishing pad in Comparative Example 2-4 was extremely excellent in uniformity, but the polishing rate was slightly low, and the planarizing characteristics were extremely bad.

Example 3

Example 3-1

3000 parts by weight of a polyether-based urethane prepolymer (Adiprene L-325 manufactured by Uniroyal) and 120 parts by weight of a silicone-based surfactant SH192 (dimethyl polysiloxane/polyoxyalkylene glycol copolymer manufactured by Toray Dow Corning Silicone Co., Ltd.) were introduced into a vessel and mixed at about 900 rpm with a stirrer to produce a foamed solution (cell dispersion), and thereafter, the stirrer was exchanged with another stirrer, and 770 parts by weight of molten 4,4'-methylene-bis(2-chloroaniline) were introduced as a curing agent into it under stirring. The mixture was stirred for about 1 minute, and the mixed solution was introduced into a pan-type open mold and post-cured for 6 hours in an oven at 1110° C., to produce a foamed polyurethane block. The resulting foamed polyurethane had 350 cells/mm$^2$, an Asker D hardness of 52, a compressibility of 2.0%, a storage elastic modulus of 279 MPa, a specific gravity of 0.8 and an average cell diameter of 40 μm. It was confirmed by analysis that the surfactant was contained in an amount of about 3 wt %.

Under heating at about 50° C., this foamed polyurethane block was sliced into a sheet of 1.27 mm in thickness by slicer VGW-125 (manufactured by Amitec) to give a polishing sheet.

A nonwoven fabric with a basic weight of 200 g/m$^2$ using 3.5-denier polyester fibers was impregnated with 30 wt % water-dispersed polyurethane emulsion, then dried and used as a soft layer. The compressibility of this nonwoven fabric layer was about 15%. This nonwoven fabric was stuck on the previously prepared polishing layer via a double-tack tape #5782 (Sekisui Chemical Co., Ltd.), and a double-tack tape #5782 (Sekisui Chemical Co., Ltd.) was further stuck on the nonwoven fabric, to complete a polishing pad. FIG. 2 is an illustration showing the constitution of the resulting polishing pad. The polishing pad 8 has a polishing layer 9 and a cushion layer 10, and the polishing layer 9 is stuck and laminated via a double-coated tape 11 on the cushion layer 10, and the cushion layer 10 is provided with a double-tack tape layer 12 for fitting to a polishing machine.

Example 3-2

A polishing pad was prepared in the same manner as in Example 3-1 except that the amount of the silicone-based surfactant SH-192 added in Example 3-1 was changed to 40 parts by weight. The resulting foamed polyurethane had 240 cells/mm$^2$, a D hardness of 59, a compressibility of 1.3%, a storage elastic modulus of 299 MPa, a specific gravity of 0.85 and an average cell diameter of 55 μm. It was confirmed by analysis that the surfactant was contained in an amount of about 1.0 wt %.

Example 3-3

A polishing pad was prepared in the same manner as in Example 3-1 except that the amount of the silicone-based surfactant SH-192 added in Example 3-1 was changed to 50 parts by weight. The resulting foamed polyurethane had 230 cells/mm$^2$, a D hardness of 58, a compressibility of 1.4%, a storage elastic modulus of 295 MPa, a specific gravity of 0.87 and an average cell diameter of 35 μm. It was confirmed by analysis that the surfactant was contained in an amount of about 1.3 wt %.

Example 3-4

A polishing pad was prepared in the same manner as in Example 3-1 except that the amount of the silicone-based surfactant SH-192 added in Example 3-1 was changed to 180 parts by weight. The resulting foamed polyurethane had 380 cells/mm$^2$, a D hardness of 47, a compressibility of 2.4%, a storage elastic modulus of 272 MPa, a specific gravity of 0.78 and an average cell diameter of 34 μm. It was confirmed by analysis that the surfactant was contained in an amount of about 4.5 wt %.

Example 3-5

A double-tack tape #5782 was stuck on the polishing sheet obtained in Example 3-1, and as a layer having lower modulus of elasticity, the following layer was stuck thereon. As the soft lower layer, polyethylene foam of 10-fold degree of foaming was used. The compressibility of this foam layer was about 10%. This foam was stuck on the previously prepared polishing layer via a double-coated tape, and a double-tack tape #5782 was stuck on this foam to complete a polishing pad.

Example 3-6

A double-tack tape #5782 was stuck on the polishing sheet obtained in Example 3-2, and as a layer having lower modulus of elasticity, the following layer was stuck thereon. A nonwoven fabric with a basic weight of 200 g/m$^2$ using 3.5-denier polyester fibers was impregnated with 30 wt % water-dispersed polyurethane emulsion, then dried and used as the lower soft layer. The compressibility of this nonwoven fabric layer was about 15%. This nonwoven fabric was stuck on the previously prepared polishing layer via the previously stuck double-coated tape, and a double-tack tape #5673FW (Sekisui Chemical Co., Ltd.) was further stuck on the nonwoven fabric, to complete a polishing pad.

Example 3-7

A double-tack tape #5782 was stuck on the polishing sheet obtained in Example 3-3, and as a layer having lower modulus of elasticity, the following layer was stuck thereon. As the lower soft layer, polyurethane foam of 15-fold degree of foaming was used. The compressibility of this foam layer was about 12%. This foam was stuck on the previously prepared polishing layer via a double-coated tape, and a double-tack tape #5782 was stuck on this foam to complete a polishing pad.

Example 3-8

A double-tack tape #5782 was stuck on the polishing sheet obtained in Example 3-4, and as a layer having lower modulus of elasticity, the following layer was stuck thereon. As the lower soft layer, polyurethane foam of 15-fold degree of foaming was used. The compressibility of this foam layer was about 12%. This foam was stuck on the previously prepared polishing layer via a double-coated tape, and a double-tack tape #5782 was stuck on this foam to complete a polishing pad.

Comparative Example 3-1

A polishing pad was prepared in the same manner as in Example 3-1 except that the amount of the silicone-based surfactant added in Example 3-1 was changed to 1.0 part by weight. The resulting foamed polyurethane could not form cells well, and the number of cells was low. The physical properties of the polishing pad were as follows: 100 cells/mm$^2$; D hardness, 62; compressibility, 0.9%; storage elastic modulus, 310 MPa; specific gravity, 0.9; and average cell diameter, 80 μm. It was confirmed by analysis that the surfactant was contained in an amount of about 0.03 wt %.

Comparative Example 3-2

A polishing pad was prepared in the same manner as in Example 3-1 except that the amount of the silicone-based surfactant added in Example 3-1 was changed to 1.4 parts by weight. The resulting foamed polyurethane could not form cells well, and the number of cells was low. The physical properties of the polishing pad were as follows: 110 cells/mm$^2$; D hardness, 60; compressibility, 1.0%; storage elastic modulus, 302 MPa; specific gravity, 0.91; and average cell diameter, 65 μm. It was confirmed by analysis that the surfactant was contained in an amount of about 0.04 wt %.

Comparative Example 3-3

A polishing pad was prepared in the same manner as in Example 3-1 except that the amount of the silicone-based surfactant added in Example 3-1 was changed to 100 parts by weight, and hollow resin particles (diameter 5 μm, Matsumoto Yushi) were added in order to generate many cells. In this case, large cells were generated under stirring. The physical properties of the polishing pad were as follows: 850 cells/mm$^2$; D hardness, 45; compressibility, 2.3%; storage elastic modulus, 255 MPa; specific gravity, 0.70; and average cell diameter, 25 μm. It was confirmed by analysis that the surfactant was contained in an amount of about 2.6 wt %.

Comparative Example 3-4

A polishing pad was prepared in the same manner as in Example 3-1 except that the amount of the silicone-based surfactant added in Example 3-1 was changed to 500 parts by weight. In this case, fine cells were uniformly generated. The physical properties of the polishing pad were as follows: 700 cells/mm$^2$; D hardness, 30; compressibility, 5.2%; storage elastic modulus, 105 MPa; specific gravity, 0.45; and average cell diameter, 28 μm. It was confirmed by analysis that the surfactant was contained in an amount of about 12 wt %.

Comparative Example 3-5

A double-tack tape #5782 was stuck on the polishing sheet obtained in Comparative Example 3-1, and as a layer having lower modulus of elasticity, the following layer was stuck thereon. As the lower soft layer, polyurethane foam of 10-fold degree of foaming was used. The compressibility of this foam layer was about 10%. A double-tack tape #5782 was further stuck on this foam to complete a polishing pad.

Comparative Example 3-6

A double-tack tape #5782 was stuck on the polishing sheet obtained in Comparative Example 3-2, and as a layer having lower modulus of elasticity, the following layer was stuck thereon. As the lower soft layer, polyurethane foam of 15-fold degree of foaming was used. The compressibility of this foam layer was about 12%. A double-tack tape #5782 was further stuck on this foam to complete a polishing pad.

Comparative Example 3-7

A double-tack tape #5782 was stuck on the polishing sheet obtained in Comparative Example 3-4, and as a layer having lower modulus of elasticity, the following layer was stuck thereon. A nonwoven fabric with a basic weight of 200 g/m using 3.5-denier polyester fibers was impregnated with 30 wt % water-dispersed polyurethane emulsion, then dried and used as the lower soft layer. The compressibility of this nonwoven fabric layer was about 15%. This nonwoven fabric was stuck on the previously prepared polishing layer via the previously stuck double-coated tape, and a double-tack tape #5673FW (Sekisui Chemical Co., Ltd.) was further stuck on the nonwoven fabric, to complete a polishing pad.

(Analysis of the content of a surfactant)

The method of analyzing the content of a surfactant is the same as the method described in Examples 1 to 3.

(Polishing Characteristics)

For evaluation of the polishing characteristics of the polishing pad, a 1 μm thermal-oxide film was deposited on a 6-inch silicone wafer and polished for 5 minutes, and the thickness of the wafer was measured at predetermined 28 positions, and within wafer uniformity was determined according to the equation below. The polishing characteristics were evaluated by using a CMP polishing apparatus SPP-600S (manufactured by Okamoto Machine Tool Works, Ltd.).

TABLE 3

| | Number of cells | Average cell diameter (μm) | D hardness | Compressibility (%) | Storage elastic modulus (MPa) | Uniformity (%) | Surfactant content (wt %) | Laminate | Polishing rate (Å/min) | planarity | Others |
|---|---|---|---|---|---|---|---|---|---|---|---|
| Example 3-1 | 350 | 40 | 52 | 2.0 | 279 | 4 | 3 | nonwoven fabric | 2000 | □ | |
| Example 3-2 | 240 | 55 | 59 | 1.3 | 299 | 9 | 1 | single layer | 1600 | □ | |
| Example 3-3 | 230 | 35 | 58 | 1.4 | 295 | 9 | 1.3 | single layer | 1600 | □ | |
| Example 3-4 | 380 | 34 | 47 | 2.4 | 272 | 4 | 4.5 | single layer | 2000 | ○ | |
| Example 3-5 | 350 | 40 | 52 | 2.0 | 279 | 3 | 3 | polyethylene | 2000 | ○ | |
| Example 3-6 | 245 | 55 | 59 | 1.3 | 299 | 5 | 1 | nonwoven fabric | 1900 | ○ | |
| Example 3-7 | 230 | 47 | 58 | 1.4 | 295 | 5 | 1.3 | urethane | 1900 | ○ | |
| Example 3-8 | 370 | 34 | 47 | 2.4 | 272 | 3 | 4.5 | urethane | 2200 | ○ | |
| Comparative Example 3-1 | 100 | 80 | 62 | 0.9 | 310 | 12 | 0.03 | single layer | 800-1500 | □ | unstable rate |
| Comparative Example 3-2 | 110 | 65 | 60 | 1.0 | 302 | 6 | 0.04 | single layer | 800-1500 | ○ | unstable rate |
| Comparative Example 3-3 | 850 | 25 | 45 | 2.3 | 255 | 5 | 2.6 | single layer | 900-1600 | □ | unstable rate |
| Comparative Example 3-4 | 700 | 28 | 30 | 5.2 | 105 | 5 | 12 | single layer | 1000-1500 | X | unstable rate |
| Comparative Example 3-5 | 95 | 80 | 62 | 0.9 | 310 | 8 | 0.03 | polyethylene | 1550 | ○ | |
| Comparative Example 3-6 | 110 | 66 | 60 | 1.0 | 302 | 6 | 0.04 | urethane | 700 | □ | |
| Comparative Example 3-7 | 700 | 25 | 30 | 5.2 | 105 | 3 | 12 | nonwoven fabric | 1650 | X | |

Example 4

<Evaluation Methods>

(Thermal Change in Dimension)

From a material constituting the polishing layer, a measurement sample of 50 mm in width, 250 mm in length and 2 mm in thickness was cut off and kept at 22.5° C. for 12 hours or more to determine the length L in the longitudinal direction.

Then, this measurement sample was kept at 100° C. for 4 hours to determine the length in the longitudinal direction. The difference ΔL between these lengths was determined, and the thermal change in dimension was determined according to the following equation:

Thermal change in dimension=(ΔL/L)×100 (%)

(Method of Measuring Compressibility)

The method of measuring compressibility is the same as the method described in Examples 1 to 3.

(Method of Measuring Storage Elastic Modulus)

The method of measuring storage elastic modulus is the same as the method described in Examples 1 to 3.

(Method of Measuring Shore D Hardness)

The method of measuring Shore D hardness is the same as the method described in Examples 1 to 3.

Polishing was conducted by allowing silica slurry RD97001 adjusted to pH 11 (manufactured by Fujimi Inc.) to flow at a flow rate of 150 g/min. under conditions where the polishing loading was 350 g/cm$^2$, the number of revolutions of the polishing pad was 35 rpm, and the number of revolutions of the wafer was 33 rpm.

within wafer uniformity (%)={(maximum thickness of the film−minimum thickness of the film)/(2× average thickness of the film)}×100

○ was given to a sample excellent in within wafer uniformity of less than 10%, and x was given to a sample poor in within wafer uniformity of 10% or more.

For evaluation of planarizing characteristics, a 0.5 μm thermal-oxide film was deposited on an 8-inch silicone wafer and subjected to patterning, and then a 1 μm oxide film of p-TEOS was deposited thereon, to prepare a wafer having a pattern with an initial difference in level of 0.5 μm, and this wafer was polished under the above-described conditions, and after polishing, each difference in level was measured to evaluate planarizing characteristics. ○ was given to a sample excellent in planarizing characteristics, and x was given to a sample poor in planarizing characteristics.

Example 4-1

100 parts by weight of a polyether-based prepolymer (Adiprene L-325, NCO content 2.22 meq/g, manufactured by Uniroyal) and 1 part by weight of a silicone-based nonionic surfactant SH192 (0.79 wt % relative to the polyurethane) were mixed and regulated at 80° C. 26 parts by weight of 4,4'-methylenebis(o-chloroaniline) (MOCA) previously melted at 120° C. were added thereto under vigorous stirring to incorporate cells. The mixture was stirred for about 1 minute, and the mixed solution was introduced into a pan-type open mold and post-cured for 6 hours in an oven at 110° C., to produce a polyurethane resin foam block. The density of this polyurethane resin foam block was 0.92 g/cm$^3$.

A foam sheet was cut off from this polyurethane resin foam block by a slicer and then provided with grooves in the form of concentric circles to prepare a polishing surface, and a polishing pad was prepared by laminating its reverse side with a cushion material comprising a commercial nonwoven fabric impregnated with polyurethane.

Example 4-2

A polyurethane resin foam block was obtained in the same manner as in Example 4-1 except that 3 parts by weight of SH192 were used as the silicone-based nonionic surfactant. The density of this polyurethane resin foam block was 0.87 g/cm$^3$.

From this polyurethane resin foam block, a foam sheet was cut off by a slicer and used to prepare a polishing pad in the same manner as in Example 4-1.

Example 4-3 parts by weight of toluene diisocyanate (mixture of 2,4-diisocyanate/2,6-diisocyanate in a ratio of 80/20, abbreviated hereinafter to TDI), 393 parts by weight of 4,4'-dicyclohexylmethane diisocyanate (abbreviated hereinafter to HMDI), 2145 parts by weight of polytetramethylene glycol (Mn: 818) and 276 parts by weight of diethylene glycol were mixed and stirred under heating at 80° C. for 120 minutes to prepare an isocyanate-terminated prepolymer (NCO content 2.29 meq/g).

A polyurethane resin foam block was obtained in the same manner as in Example 1 except that 100 parts by weight of the isocyanate-terminated prepolymer was used in place of the polyether-based prepolymer described in Example 4-1, 6 parts by weight (4.51 wt % relative to the polyurethane) of SH192 were used as the silicone-based nonionic surfactant, and the amount of MOCA was 27 parts by weight. The density of this polyurethane resin foam block was 0.81 g/cm$^3$.

From this polyurethane resin foam block, a foam sheet was cut off by a slicer and used to prepare a polishing pad in the same manner as in Example 4-1.

Example 4-4

TDI (1730 parts by weight), HMDI (393 parts by weight), 2515 parts by weight of polytetramethylene glycol (Mn: 1006), and 276 parts by weight of diethylene glycol were mixed and stirred under heating at 80° C. for 120 minutes to prepare an isocyanate-terminated prepolymer (NCO content 2.58 meq/g).

A polyurethane resin foam block was obtained in the same manner as in Example 4-1 except that 100 parts by weight of the isocyanate-terminated prepolymer was used in place of the polyether-based prepolymer described in Example 4-1, 6 parts by weight (4.54 wt % relative to the polyurethane) of SH192 were used as the silicone-based nonionic surfactant, the amount of MOCA was 24 parts by weight, and 2.3 parts by weight of glycerin were further added. The density of this polyurethane resin foam block was 0.72 g/cm$^3$.

From this polyurethane resin foam block, a foam sheet was cut off by a slicer and used to prepare a polishing pad in the same manner as in Example 4-1.

Comparative Example 4-1

A polyurethane resin foam block was obtained in the same manner as in Example 4-1 except that 10 parts by weight of SH192 were used as the silicone-based nonionic surfactant. The density of this polyurethane resin foam block was 0.68 g/cm$^3$.

From this polyurethane resin foam block, a foam sheet was cut off by a slicer and used to prepare a polishing pad in the same manner as in Example 4-1.

The polishing pads obtained in Examples 4-1 to 4-4 and Comparative Example 4-1 were used in a polishing test to evaluate planarizing characteristics and within wafer uniformity. The results are shown in Table 4. The content of the surfactant was expressed in terms of weight % relative to the polyurethane (prepolymer+chain extender).

TABLE 4

| | Example 4-1 | Example 4-2 | Example 4-3 | Example 4-4 | Comparative Example 4-1 |
|---|---|---|---|---|---|
| Surfactant content (wt %) | 0.79 | 2.33 | 4.51 | 4.54 | 7.35 |
| Thermal change in dimension (%) | 0.6 | 1.1 | 1.7 | 2.3 | 3.2 |
| Density (g/cm$^3$) | 0.92 | 0.87 | 0.81 | 0.72 | 0.68 |
| D hardness | 61 | 54 | 59 | 57 | 38 |
| Compressibility (%) | 0.9 | 1.4 | 0.8 | 1.2 | 4.2 |
| Storage elastic modulus (MPa) | 315 | 285 | 302 | 295 | 143 |
| Planarizing characteristics | ○ | ○ | ○ | ○ | X |
| Within wafer uniformity | ○ | ○ | ○ | ○ | X |

From the results in Table 4, the polishing pads having a thermal change in dimension within the range of the present invention were excellent in both planarizing characteristics and within wafer uniformity, but the polishing pads having a thermal change in dimension outside of the range of the present invention were problematic in both planarizing characteristics and within wafer uniformity, Example 5

<Evaluation Methods>

(Method of Evaluating Dynamic Coefficient of Friction)

Figure 3:
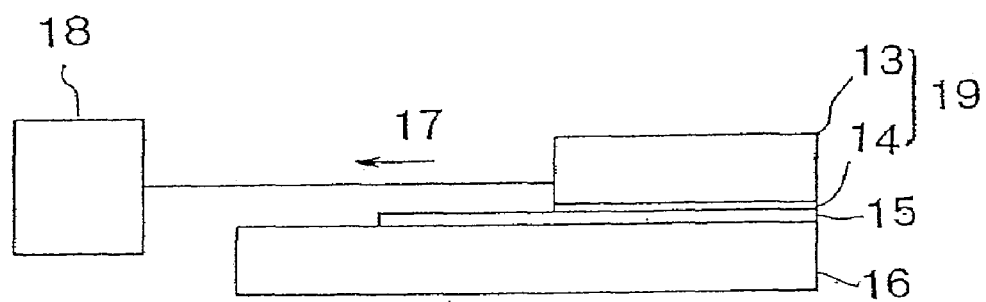
FIG. 3 is an illustration showing a method of measuring dynamic coefficient of friction.
Figure 3:
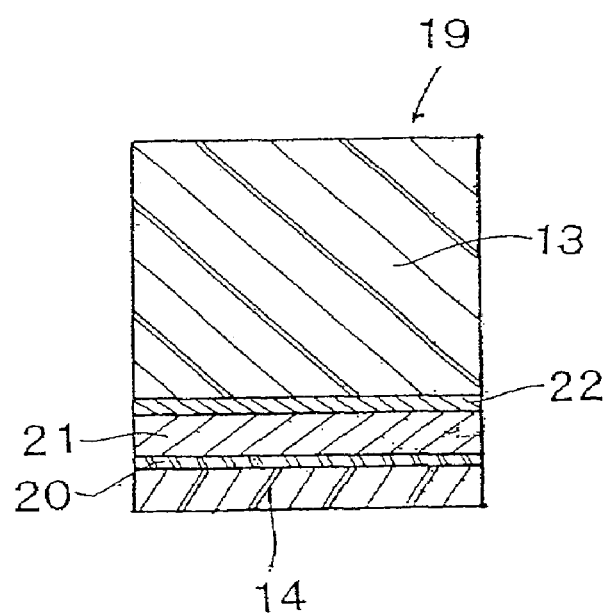

A device for measuring dynamic coefficient of friction is shown in FIG. 3. FIG. 3(a) is a general view, and FIG. 3(b) is a block diagram of a measurement sample 19. In this measurement, a polishing layer-forming sheet 14 is placed on a glass plate 15 (highly heat-resistant glass Pyrex (#7740, 150 mm×250 mm×5 mm, manufactured by Corning)) mounted on a stand 16, and a cushion layer 21 (low-density polyethylene foam with specific gravity of 0.17; thickness 1.27 mm) was stuck thereon via a double-coated tape 20 (double-tack tape #5782 manufactured by Sekisui Chemical Co., Ltd.), and the cushion layer 21 was stuck on a weight 13 via a resin-printing plate-fixing double-coated tape 535A (manufactured by Nitto Denko Corporation) 22, to give a measurement sample 19 having weight 13 mounted thereon. Then, the polishing layer-forming sheet 14 of the measurement sample 19, while being abutted on the glass plate 15, is moved by pulling in the direction of arrow 17 by a friction measuring device 18, to measure the coefficient of friction.

The dynamic coefficient of friction is calculated by dividing, by 4.4 kgf, the average of the minimum and maximum dynamic frictional force in a chart of frictional force measured with the frictional coefficient measuring device after the measurement sample 19 was moved by 10 cm to exhibit stationary frictional force.

The size of the polishing layer-forming sheet was 5 cm×8 cm, the loading weight 13 had a weight of 4.4 kg and a bottom of 8 cm×5 cm, and the rate of movement of the measurement sample 19 was 20 cm/min., and the measurement time was 30 seconds. As the friction measuring device 18, Tensilone®-100 (manufactured by Toyo Baldwin) was used, and the atmospheric conditions were that the temperature was 23±2° C., and the humidity was 50±6% RH.

(Evaluation of Polishing Characteristics)

As the polishing apparatus, SPP600S manufactured by Okamoto Machine Tool Works, Ltd. was used in evaluation of polishing characteristics. The thickness of the oxide film was measured by an interference film thickness measuring device manufactured by Otsuka Denshisha. The polishing conditions were as follows: Polishing loading was 350 g/cm$^2$, the number of revolutions of the polishing platen was 35 rpm, and the number of revolutions of the wafer was 30 rpm. For polishing, silica slurry SS21 (manufactured by Cabot) was dropped at a flow rate of 150 ml/min during polishing.

The method of evaluating polishing characteristics is the same as the method described in Examples 1 to 3.

(Method of Measuring Compressibility)

The method of evaluating compressibility is the same as the method described in Examples 1 to 3.

(Method of Measuring Storage Elastic Modulus)

The method of measuring storage elastic modulus is the same as the method described in Examples 1 to 3.

(Method of Measuring Average Cell Diameter)

The method of measuring average cell diameter is the same as the method described in Examples 1 to 3.

(Method of Measuring Shore D Hardness)

The method of measuring Shore D hardness is the same as the method described in Examples 1 to 3.

(Analysis of Surfactant Content)

The method of analyzing surfactant content is the same as the method described in Examples 1 to 3.

Example 5-1

3000 parts by weight of a polyether-based urethane prepolymer (Adiprene L-325 manufactured by Uniroyal) and 120 parts by weight of a silicone-based surfactant SH192 (polydimethylsiloxane/polyoxyalkyl copolymer manufactured by Toray Dow Corning Silicone Co., Ltd.) were introduced into a vessel and mixed at about 900 rpm with a stirrer to produce a foamed solution (cell dispersion), and thereafter, the stirrer was exchanged with another stirrer, and 770 parts by weight of a heat-melted curing agent (4,4'-methylene-bis [2-chloroaniline]) were introduced into it under stirring. The mixture was stirred for about 1 minute, and the mixed solution was introduced into a pan-type open mold and post-cured for 6 hours in an oven at 110° C., to produce a foamed polyurethane block. The resulting foamed polyurethane had a D hardness of 52, a compressibility of 2.0%, a storage elastic modulus of 279 MPa, a specific gravity of 0.8 and an average cell diameter of 40 μm. It was confirmed by analysis that the surfactant was contained in an amount of about 2.8 wt %.

Under heating at about 50° C., this foamed polyurethane block was sliced into a sheet of 1.27 mm in thickness by slicer VGW-125 (manufactured by Amitec), to give a polishing layer forming sheet.

A nonwoven fabric with a basic weight of 200 g/m$^2$ using 3.5-denier polyester fibers was impregnated with 30 wt % water-dispersed polyurethane emulsion and then dried to prepare a cushion layer-forming material. This cushion layer-forming material (thickness 1.27 mm) was stuck on the previously prepared polishing layer via a double-tack tape #5782 (Sekisui Chemical Co., Ltd.), and a double-tack tape #5782 was further stuck on the cushion layer, to complete a polishing pad (a).

The polyurethane foam serving as the polishing layer-forming material in Example 5-1 was 0.5 as determined by the above-described method of measuring dynamic coefficient of friction.

When the polishing pad (a) was used in polishing under the conditions described above, the polishing rate was 2300 Å/min, which was a practically sufficient polishing rate. In this polishing, no dechucking error was generated.

Example 5-2

A foamed polyurethane block was prepared in the same manner as in Example 5-1 except that the silicone-based surfactant SH192 was added in an amount of 40 parts by weight. The resulting foamed polyurethane had a Shore D hardness of 59, a compressibility of 1.3%, a storage elastic modulus of 299 MPa, a specific gravity of 0.85 and an average cell diameter of 55 μm. It was confirmed by analysis that the surfactant was contained in an amount of about 0.9 wt %.

The dynamic coefficient of friction of the polyurethane foam in Example 5-2 was determined to be 0.3.

When a polishing pad (b) was prepared from this polyurethane foam sheet in the same manner as in Example 5-1 and used in polishing under the same conditions as in Example 5-1, the polishing rate was 2000 Å/min, which was a practically sufficient polishing rate. In this polishing, no dechucking error was generated.

Example 5-3

A foamed polyurethane block was prepared in the same manner as in Example 5-1 except that the silicone-based surfactant SH192 was added in an amount of 180 parts by weight. The resulting foamed polyurethane had a Shore D hardness of 47, a compressibility of 2.4%, a storage elastic modulus of 272 MPa, a specific gravity of 0.78 and an average cell diameter of 34 μm. It was confirmed by analysis that the surfactant was contained in an amount of about 4.4 wt %.

The dynamic coefficient of friction of the polyurethane foam in Example 5-3 was determined to be 0.7.

When a polishing pad (c) was prepared from this polyurethane foam sheet in the same manner as in Example 5-1 and used in polishing under the same conditions as in Example 5-1, the polishing rate was 2600 Å/min, which was a practically sufficient polishing rate. In this polishing, no dechucking error was generated.

Comparative Example 5-1

Non-foamed polyurethane was prepared in the same manner as in Example 5-1 except that the surfactant was not added and stirring was not conducted. The dynamic coefficient of friction of this non-foamed polyurethane, as determined by the method described above, was 0.01. When this non-foamed polyurethane was used in polishing, the polishing rate was as low as 1000 Å/min, which could not be satisfactory.

Comparative Example 5-2

A polishing pad was prepared in the same manner as in Example 5-1 except that the amount of the silicone-based surfactant added in Example 5-1 was changed to 1.4 parts by weight. The resulting foamed polyurethane could not form cells well, and the number of cells was low. The physical properties of the polishing pad were as follows: Shore D hardness, 60; compressibility, 1.0%; storage elastic modulus, 302 MPa; specific gravity, 0.91; and average cell diameter, 65 μm. It was confirmed by analysis that the surfactant was contained in an amount of about 0.03 wt %.

The dynamic coefficient of friction of the polyurethane foam in Comparative Example 5-2 was determined to be 0.05. When a polishing pad (c) was prepared from this polyurethane foam sheet in the same manner as in Example 5-1 and used in polishing under the same conditions as in Example 5-1, the polishing rate was 1200 Å/min, which could not be satisfactory.

Comparative Example 5-3

A polishing pad was prepared in the same manner as in Example 5-1 except that the amount of the silicone-based surfactant added in Example 5-1 was changed to 500 parts by weight. In this case, fine cells were uniformly generated. The physical properties of the resulting foamed polyurethane were as follows: Shore D hardness, 30; compressibility, 5.2%; storage elastic modulus, 105 MPa; specific gravity, 0.45; and average cell diameter, 25 μm. It was confirmed by analysis that the surfactant was contained in an amount of about 11.5 wt %.

The dynamic coefficient of friction of the polyurethane foam in Comparative Example 5-3 was determined to be 1.2. When a polishing pad (c) was prepared from this polyurethane foam sheet in the same manner as in Example 5-1 and used in polishing under the same conditions as in Example 5-1, the polishing rate was 3000 Å/min, and this polishing rate was excellent, but dechucking error occurred.

The evaluation results are collectively shown in Table 5.

TABLE 5

|  | Amount of surfactant added (parts by weight) | Surfactant content (wt %) | Dynamic coefficient of friction | D hardness | Compressibility (%) | Storage elastic modulus (MPa) | Polishing rate (Å/min) | Dechucking error |
|---|---|---|---|---|---|---|---|---|
| Example 5-1 | 120 | 2.8 | 0.5 | 52 | 2.0 | 279 | 2300 | ○ |
| Example 5-2 | 40 | 0.9 | 0.3 | 59 | 1.3 | 299 | 2000 | ○ |
| Example 5-3 | 180 | 4.4 | 0.7 | 47 | 2.4 | 272 | 2600 | ○ |
| Comparative Example 5-1 | 0 | 0 | 0.01 | 74 | 0.5 | 760 | 1000 | ○ |
| Comparative Example 5-2 | 1.4 | 0.03 | 0.05 | 60 | 1.0 | 302 | 1200 | ○ |
| Comparative Example 5-3 | 500 | 11.5 | 1.2 | 30 | 5.2 | 105 | 3000 | X |

As described above, the polishing pad having a polishing layer with a dynamic coefficient of friction in the range of 0.1 to 1.0, comprising polyurethane resin foam, has a practically sufficiently polishing rate and does not undergo dechucking error.

Example 6

<Evaluation Methods>
(Method of Measuring Storage Elastic Modulus)

The method of measuring storage elastic modulus is the same as the method described in Examples 1 to 3.

(Method of Measuring Shore D Hardness)

The method of measuring Shore D hardness is the same as the method described in Examples 1 to 3.

(Method of Measuring Compressibility)

The method of evaluating compressibility is the same as the method described in Examples 1 to 3.

(Measurement of Abrasion Loss)

The resulting polishing sheet was dried as a test specimen to determine its initial weight. The test specimen was dipped for 24 hours in an aqueous solution of potassium hydroxide, pH 12.5, at 40° C., then washed sufficiently with distilled water and dried. Using a Taber abrader (model 174 manufactured by Taber), the abrasion of the test specimen after the test was measured under conditions where the loading was 1000 g and a truck wheel H-22 was rotated at 1000 rpm. A test specimen showing a smaller abrasion loss is more excellent.

(Preparation and Evaluation of a Polishing Pad)

A double-coated tape (double-tack tape #5782 manufactured by Sekisui Chemical Co., Ltd.) was stuck on the resulting polishing sheet, to complete a polishing pad. The polishing characteristics of the resulting polishing pad were evaluated by using a CMP polishing apparatus (SPP-600S manufactured by Okamoto Machine Tool Works, Ltd.). Polishing was conducted by allowing silica slurry adjusted to pH 11 (RD97001 manufactured by Fujimi Inc.) to flow at a flow rate of 150 g/min under conditions where the polishing loading was 350 g/cm², the number of revolutions of the polishing pad was 35 rpm, and the number of revolutions of the wafer was 33 rpm.

(Planarity)

For evaluation of planarity, a 0.5 μm thermal-oxide film was deposited on a 6-inch silicone wafer and subjected to patterning (L/S (line/space)=25 μm/5 μm, and L/S=5 μm/25 μm), and a 1 μm oxide film (TEOS) was further deposited thereon, to prepare a wafer having a pattern with an initial difference in level of 0.5 μm. This wafer was polished under the above-described conditions, and the abrasion loss in 25 μm-space bottom when the global difference in level was reduced to 2000 Å or less was measured to evaluate the planarity. A smaller value is indicative of more excellent planarity.

(Within Wafer Uniformity)

For evaluation of within wafer uniformity, a 1 μm thermal-oxide film was deposited on a 6-inch silicone wafer and polished until the thickness of the thermal-oxide film was reduced to 0.5 μm under the polishing conditions described above, and the thickness of the wafer was measured at 28 positions, and within wafer uniformity was determined according to the equation below. A smaller value of within wafer uniformity is indicative of more excellent uniformity.

Within wafer uniformity (%)={(maximum thickness of the film−minimum thickness of the film)/(2× average thickness of the film)}×100

(Average Polishing Rate)

A 1 μm thermal-oxide film deposited on a 6-inch silicone wafer was polished under the polishing conditions described above, and the average polishing rate was determined by dividing the reduced thickness of the thermal-oxide film after polishing by the polishing time. A higher average polishing rate is indicative of a more excellent polishing pad.

(Polishing Rate Stability)

Polishing rate stability was determined according to the following equation:

Polishing rate stability (%)={(maximum polishing rate)−(minimum polishing rate)/average polishing rate}×100

The maximum polishing rate is the highest polishing rate during polishing of a first wafer to a last wafer (number of wafers polished is 100, 300, or 500), and the minimum polishing rate is the lowest polishing rate during polishing of the first wafer to the last wafer.

Example 6-1

1000 parts by weight of toluene diisocyanate (mixture of 2,4-diisocyanate/2,6-diisocyanate in a ratio of 80/20), 375 parts by weight of 4,4'-dicyclohexylmethane diisocyanate, 1681 parts by weight of polytetramethylene glycol (number-average molecular weight: 994) and 188 parts by weight of diethylene glycol were introduced into a vessel and stirred under heating at 80° C. for 150 minutes to give a prepolymer having an isocyanate equivalent of 2.28 meq/g. 97 parts by weight of a silicone-based nonionic surfactant (SH192 manufactured by Toray Dow Corning Silicone Co., Ltd.) were added to this prepolymer, regulated at a temperature of 70° C. and defoamed under reduced pressure. Then, 943 parts by weight of 4,4'-methylenebis(o-chloroaniline) previously melted at 120° C. were added thereto under vigorous stirring to incorporate cells, thus giving a mixed solution. The mixed solution was stirred for about 1 minute, then introduced into a pan-type open mold and post-cured for 8 hours in an oven at 110° C., to give a finely foamed polyurethane block (cell diameter 40 μm). The density of this finely foamed polyurethane block was 0.87 g/cm³. The density was measured according to JIS K 7222 (Foamed plastics and rubber: measurement of apparent density).

Under heating at about 80° C., this finely foamed polyurethane block was sliced into a sheet of 1.27 mm in thickness by a slicer (VGW-125 manufactured by Amitec) to give a polishing sheet. From this sheet, a rectangular sheet of 5 mm in width was cut off. Its determined storage elastic modulus was 285 MPa. The D hardness was 54, and the compressibility was 1.5%.

Example 6-2

1000 parts by weight of toluene diiusocyanate (mixture of 2,4-diisocyanate/2,6-diisocyanate in a ratio of 80/20), 146 parts by weight of 4,4'-dicyclohexylmethane diisocyanate, 1150 parts by weight of polytetramethylene glycol (number-average molecular weight: 796) and 188 parts by weight of diethylene glycol were introduced into a vessel and stirred under heating at 80° C. for 150 minutes to give a prepolymer having an isocyanate equivalent of 2.29 meq/g. 75 parts by weight of a silicone-based nonionic surfactant (SH192 manufactured by Toray Dow Corning Silicone Co., Ltd.) were added to this prepolymer, regulated at a temperature of 70° C. and defoamed under reduced pressure. Then, 730 parts by weight of 4,4'-methylenebis(o-chloroaniline) previously melted at 120° C. were added thereto under vigorous stirring to incorporate cells, thus giving a mixed solution. The mixed solution was stirred for about 1 minute, then introduced into a pan-type open mold and post-cured for 8 hours in an oven at 110° C., to give a finely foamed polyurethane block (cell diameter 35 μm). The density of this finely foamed polyurethane block was 0.75 g/cm³.

A polishing sheet and a polishing pad were prepared in the same manner as in Example 6-1 and evaluated for polishing.

Reference Example 6-1 parts by weight of toluene diisocyanate (mixture of 2,4-diisocyanate/2,6-diisocyanate in a ratio of 80/20), 375 parts by weight of 4,4'-dicyclohexylmethane diisocyanate, 1362 parts by weight of polyethylene adipate (number-average molecular weight: 746) and 188 parts by weight of diethylene glycol were introduced into a vessel and stirred under heating at 80° C. for 150 minutes to give a prepolymer having an isocyanate equivalent of 2.43 meq/g. 88 parts by weight of a silicone-based nonionic surfactant (SH192 manufactured by Toray Dow Corning Silicone Co., Ltd.) were added to this prepolymer, regulated at a temperature of 70° C. and defoamed under reduced pressure. Then, 903 parts by weight of 4,4'-methylenebis(o-chloroaniline) previously melted at 120° C. were added thereto under vigorous stirring to incorporate cells, thus giving a mixed solution. The mixed solution was stirred for about 1 minute, then introduced into a pan-type open mold and post-cured for 8 hours in an oven at 110° C., to give a finely foamed polyurethane block (cell diameter 35 μm). The density of this finely foamed polyurethane block was 0.70 g/cm³.

A polishing sheet and a polishing pad were prepared in the same manner as in Example 6-1 and evaluated for polishing.

Reference Example 6-2

1000 parts by weight of toluene diisocyanate (mixture of 2,4-diisocyanate/2,6-diisocyanate in a ratio of 80/20), 375 parts by weight of 4,4'-dicyclohexylmethane diisocyanate, 1746 parts by weight of polyester polyol (number-average molecular weight: 1006) obtained by polymerizing phthalic anhydride with ethylene glycol, and 188 parts by weight of diethylene glycol were introduced into a vessel and stirred under heating at 80° C. for 150 minutes to give a prepolymer having an isocyanate equivalent of 2.21 meq/g. 88 parts by weight of a silicone-based nonionic surfactant (SH192 manufactured by Toray Dow Corning Silicone Co., Ltd.) were added to this prepolymer, regulated at a temperature of 70° C. and defoamed under reduced pressure. Then, 930 parts by weight of 4,4'-methylenebis(o-chloroaniline) previously melted at 120° C. were added thereto under vigorous stirring to incorporate cells, thus giving a mixed solution. The mixed solution was stirred for about 1 minute, then introduced into a pan-type open mold and post-cured for 8 hours in an oven at 110° C., to give a finely foamed polyurethane block (cell diameter 40 μm). The density of this finely foamed polyurethane block was 0.84 g/cm³.

A polishing sheet and a polishing pad were prepared in the same manner as in Example 6-1 and evaluated for polishing.

Reference Example 6-3

150 parts by weight of a silicone-based nonionic surfactant (SH192 manufactured by Toray Dow Corning Silicone Co., Ltd.) were added to and mixed with 1000 parts by weight of Adiprene L-325 (isocyanate-terminated prepolymer, NCO=9.25%, manufactured by Uniroyal), and the mixture was introduced into a vessel, regulated at a temperature of 70° C. and defoamed under reduced pressure. Then, 250 parts by weight of 4,4'-methylenebis(o-chloroaniline) previously melted at 120° C. were added thereto under vigorous stirring to incorporate cells, thus giving a mixed solution. The mixed solution was stirred for about 1 minute, then introduced into a pan-type open mold and post-cured for 8 hours in an oven at 110° C., to give a finely foamed polyurethane block (cell diameter 35 μm). The density of this finely foamed polyurethane block was 0.76 g/cm³.

A polishing sheet and a polishing pad were prepared in the same manner as in Example 6-1 and evaluated for polishing.

TABLE 6

| | Polishing sheet | | | | | | Polishing pad | | | | |
| | | | | | | | | | Average | | |
| | Storage elastic modulus (MPa) | D hardness | Compressibility (%) | Abrasion loss (mg) | | | Planarity (Å) | Within wafer uniformity (%) | polishing rate (Å/min) | Polishing rate stability (%): number of wafers | | |
| | | | | Before test | After test | B. Difference | | | | 100 wafers | 300 wafers | 500 wafers |
|---|---|---|---|---|---|---|---|---|---|---|---|---|
| Example 6-1 | 285 | 54 | 1.5 | 51 | 54 | 3 | 1000 | 7.5 | 1160 | 5 | 6 | 9 |
| Example 6-2 | 292 | 56 | 1.3 | 66 | 74 | 8 | 900 | 7.9 | 1210 | 3 | 5 | 8 |
| Reference Example 6-1 | 311 | 59 | 0.9 | 55 | 69 | 14 | 900 | 8.3 | 1140 | 5 | 11 | 22 |
| Reference Example 6-2 | 278 | 53 | 1.8 | 43 | 60 | 17 | 900 | 7.2 | 1230 | 4 | 16 | 27 |
| Reference Example 6-3 | 235 | 38 | 3.9 | 49 | 54 | 5 | 1400 | 6.9 | 1310 | 6 | 8 | 11 |

As can be seen from the results in Table 6, the other polishing pads of the present invention are excellent in planarity and within wafer uniformity, are superior in polishing rate and are also excellent in polishing rate stability, and during use, the polishing rate is hardly changed and the polishing characteristics are stable.

Example 7

<Evaluation Methods>
(Polishing Characteristics)

The polishing characteristics of the polishing pad were evaluated by using a CMP polishing apparatus SPP-600 S (manufactured by Okamoto Machine Tool Works, Ltd.). Polishing was conducted by allowing ceria slurry adjusted to pH 8 (ceria sol manufactured by Nissan Chemical Industries, Ltd.) to flow at a flow rate of 150 g/min under conditions where the polishing loading was 350 g/cm², the number of revolutions of the polishing pad was 35 rpm, and the number of revolutions of the wafer was 33 rpm. The polishing characteristics were evaluated in terms of average polishing rate. As polishing characteristics, ○ was given to a sample having a polishing rate of higher than 2000 Å/min, while x was given to a sample having a polishing rate of less than 2000 Å/min.

(Degree of the Remaining Monomer)

10 mg isocyanate-terminated prepolymer sample inactivated by reacting its terminal isocyanate group with methanol was dissolved in 10 ml THF, and the degree of the remaining monomer was determined from a peak area of a methanol reaction product measured by GPC measurement unit LC10A (Shimadzu Corporation).

In this measurement, 40 μl sample solution was injected and measured at a flow rate of 1 ml/min with a P1 gel column (filler particle diameter, 5 μm; pore diameter 500/100/50 Å) using THF as solvent.

(Pot Life)

The isocyanate-terminated prepolymer was heated at 60° C., and molten 4,4'-methylenebis(o-chloroaniline) previously regulated at 120° C. was added thereto such that the NCO group/OH group equivalent ratio was 1.1, and the mixture was cast in a thickness of about 5 mm on a glass plate heated at 50° C. This liquid coating was stuck 3 times with a bar which was about 3 by 3 mm square, and the surface was observed for 10 seconds. The time in which the liquid lost its fluidity to allow the unevenness formed by sticking the liquid with the bar to remain for 10 seconds was regarded as pot life.

(Evaluation of Molding Properties)

When a curable foaming composition was molded by casting into a pan-type open mold in the following example of production of a polishing pad material, the material which could be completely cast into the mold was evaluated to be excellent in molding properties and given ○, while the material which could not completely spread on the mold was evaluated to be poor in molding properties and given x.

Examples 7-1 to 7-5, Comparative Examples 7-1 to 7-6

<Production of a Polishing Pad Material>

A mixture consisting of polytetramethylene glycol (abbreviated hereinafter to PTMG) having a number-average molecular weight of 1000 and diethylene glycol (abbreviated hereinafter to DEG) in a molar ratio of 50/50 was used as a glycol component, and together with this glycol component, toluene diisocyanate (mixture of 2,4-diisocyanate/2,6-diisocyanate in a ratio of 80/20, abbreviated hereinafter to TDI) was used in such excess that the TDI monomer after the reaction was in a predetermined amount, and the mixture was stirred under heating at 80° C. for 120 minutes, and then the isocyanate monomer was distilled away under reduced pressure to prepare an isocyanate-terminated TDI prepolymer.

Separately, 4,4'-dicyclohexylmethane diisocyanate (abbreviated hereinafter to HMDI), together with the same glycol component, was used in such excess that the HMDI monomer after the reaction was in a predetermined amount, and the mixture was stirred under heating at 80° C. for 120 minutes, and then the isocyanate monomer was distilled away under reduced pressure to prepare an isocyanate-terminated HMDI prepolymer.

These two kinds of prepolymers were mixed such that the TDI prepolymer/HMDI prepolymer ratio was 75/25 by weight, and the respective isocyanate monomers were added thereto in a predetermined ratio to prepare a starting prepolymer for production of foamed polyurethane.

A predetermined amount of a silicone surfactant SH-192 (manufactured by Toray Dow Corning Silicone Co., Ltd.) was added to and mixed with 100 parts by weight of the resulting starting prepolymer, regulated at a temperature of 80° C., and stirred vigorously to incorporate cells with a mixer having a whipper-type stirring blade, thus preparing a cell dispersion. The stirring device was exchanged with a planetary mixer, and 4,4'-methylenebis(o-chloroaniline) (abbreviated hereinafter to MOCA) previously melted at 120° C. was added to this cell dispersion such that the $NCO/NH_2$ equivalent ratio was 1.1, and then the mixture was stirred for about 1 minute. The resulting curing foaming composition was introduced into a pan-type open mold and post-cured in an oven at 110° C. for 6 hours to produce a foamed polyurethane block. The cell diameter of this foamed polyurethane was approximately 40 to 50 μm, and the density was 0.85 to 0.90 g/cm$^3$.

The degree of the remaining isocyanate monomers in the prepolymer, and the remaining HMDI/TDI monomer ratio is shown in the upper section in Table 7.

<Preparation of a Polishing Pad>

Under heating at about 50° C., the resulting foamed polyurethane block with fine cells as a polishing pad-forming material was sliced into a sheet of 2 mm in thickness by a slicer (VGW-125 manufactured by Amitec) to give a foamed polyurethane sheet. This sheet was cut into a round sheet of 610 mm in diameter and provided with grooves in a lattice-like pattern (groove width 2.0 mm, groove depth 0.6 mm, groove pitch 1.5 mm) or grooves in the form of concentric circles (groove width 0.3 mm, groove depth 0.4 mm, groove pitch 1.5 mm) on the surface of the sheet.

A commercial cushion material for polishing pads was stuck via a double-coated tape on the formed polyurethane sheet provided with the grooves, to complete a polishing pad sample.

The resulting polishing pad was used to measure its polishing rate, and the evaluation results are collectively shown in Table 7.

TABLE 7

| | | Example 7-1 | Example 7-2 | Example 7-3 | Example 7-4 | Example 7-5 | Comparative Example 7-1 |
|---|---|---|---|---|---|---|---|
| Degree of remaining monomers | HMDI (wt %) | 8.1 | 12.5 | 1.4 | 0.5 | 8.1 | 7.6 |
| | TDI (wt %) | 3.7 | 6.4 | 0.9 | 0.8 | 3.7 | 13.1 |
| | HMDI + TDI | 11.8 | 18.9 | 2.3 | 1.3 | 11.8 | 20.7 |
| | HMDI/TDI | 2.2 | 2.0 | 1.6 | 0.6 | 2.2 | 0.6 |
| Amount of surfactant added (wt %) | | 2.3 | 2.3 | 2.3 | 2.3 | 4.5 | 2.3 |
| Evaluation results | Pot life | 3'40" | 3'30" | 3'30" | 2'40" | 3'45" | 2'40" |
| | Evaluation of moldability | ○ | ○ | ○ | ○ | ○ | ○ |
| | Polishing rate | 2700 | 2450 | 2850 | 2900 | 2300 | 1400 |
| | Evaluation of polishing characteristics | ○ | ○ | ○ | ○ | ○ | X |

TABLE 7-continued

|  |  | Comparative Example 7-2 | Comparative Example 7-3 | Comparative Example 7-4 | Comparative Example 7-5 | Comparative Example 7-6 |
|---|---|---|---|---|---|---|
| Degree of remaining monomers | HMDI (wt %) | 15.4 | 13.0 | 3.2 | 1.8 | 8.1 |
|  | TDI (wt %) | 6.2 | 3.5 | 0.9 | 4.1 | 3.7 |
|  | HMDI + TDI | 21.6 | 16.5 | 4.1 | 5.9 | 11.8 |
|  | HMDI/TDI | 2.5 | 3.7 | 3.6 | 0.4 | 2.2 |
| Amount of surfactant added (wt %) |  | 2.3 | 2.3 | 2.3 | 2.3 | 7.3 |
| Evaluation results | Pot life | 4'00" | ≧5' | ≧5' | 2'10" | 4'10" |
|  | Evaluation of moldability | ○ | X | X | X | ○ |
|  | Polishing rate | 1500 | 2500 | 2800 | — | 1650 |
|  | Evaluation of polishing characteristics | X | ○ | ○ | — | X |

As is evident from Table 7, the other polishing pads of the present invention showed good results in any evaluations. On the other hand, the polishing pads wherein the degree of remaining isocyanate monomers was higher than 20 wt % in Comparative Examples 7-1 and 7-2 were not satisfactory in polishing characteristics, and the polishing pads wherein the remaining HMDI/TDI ratio by weight was higher than 3.2 in Comparative Examples 7-3 and 7-4 showed slow hardening and were not satisfactory in molding properties even if the degree of remaining isocyanate monomers was 20 wt % or less. The polishing pad wherein the HMDI/TDI ratio by weight was less than 0.5 in Comparative Example 7-5 could not be molded due to its too short pot life. The polishing pad wherein the amount of the silicone-based surfactant added was higher than 5 wt % in Comparative Example 7-6 was not satisfactory in polishing characteristics although the degree of remaining isocyanate monomers and the HMDI/TDI ratio by weight were in the range of the present invention.

Example 8

Example 8-1 parts by weight of toluene diisocyanate (mixture of 2,4-diisocyanate/2,6-diisocyanate in a ratio of 80/20), 3930 parts by weight of 4,4'-dicyclohexylmethane diisocyanate, 25150 parts by weight of polytetramethylene glycol having a number-average molecular weight of 1006 and a molecular-weight distribution of 1.7, and 2756 parts by weight of diethylene glycol were introduced into a vessel and stirred under heating at 80° C. for 120 minutes to give a prepolymer having an isocyanate equivalent of 2.10 meq/g. 1480 parts by weight of Expancel 551DE (fine hollow particles consisting of a vinylidene chloride/acrylonitrile copolymer manufactured by Japan Ferrite) were mixed therewith, and the mixture was defoamed under reduced pressure. This prepolymer mixture was regulated at 80° C., and 12816 parts by weight of 4,4'-methylenebis(o-chloroaniline) previously melted at 120° C. were added thereto under stirring. The mixed solution was stirred for about 1 minute, then introduced into a pan-type open mold and post-cured for 6 hours in an oven at 110° C., to give a foamed polyurethane block.

The molecular weights of polyols such as polytetramethylene glycol was measured by the above-mentioned measurement method using the GPC measurement unit LC-10A manufactured by Shimadzu Corporation.

The polyol component constituting the polyurethane polishing pad is analyzed after decomposition of the polyurethane. The analysis procedures are as follows:

a) 1 g polyurethane polishing pad sample is taken in a PTFE container, and 7.0 ml pyridine and 0.5 ml water are added thereto, and the whole of the container is placed in a stainless steel autoclave, and the sample is decomposed by heating at 160° C. for 8 hours.

The decomposed solution is extracted with dichloromethane/2N HCl (mixing ratio 1/1). Because the polyol is extracted in the dichloromethane layer, this layer is collected.

c) The solvent is distilled away from the dichloromethane layer, and the resulting polyol is measured by GPC according to the above-described method.

Identification of the polyol component can be evaluated by a known analysis method. For example, a method of measuring an IR spectrum of the polyol obtained in the above decomposition and an analysis method using a GC-MS method can be mentioned. The polyurethane polishing pad can also be analyzed by a pyrolysis GC-MS method.

Under heating at about 50° C., this foamed polyurethane block was sliced into a sheet of 1.27 mm in thickness by a slicer (VGW-125 manufactured by Amitec) to give a polishing sheet. From this sheet, a rectangular sheet of 5 mm in width was cut off and measured for storage elastic modulus.

The modulus of elasticity was measured in a frequency of 1 Hz with sine wave vibration with a tensile testing jig in a dynamic viscoelasticity measuring device Rheogel-E4000 (manufactured by UBM). Storage elastic modulus was measured at a temperature of from −20° C. to 80° C. in a temperature-dependent mode, and as the elastic modulus at each temperature, the storage elastic modulus at 20° C., 40° C. and 60° C. were shown.

The storage elastic modulus of the resulting polishing sheet at 20° C., 40° C. and 60° C. were 404 MPa, 299 MPa and 190 MPa, respectively.

A double-coated tape (double-tack tape #5673FW manufactured by Sekisui Chemical Co., Ltd.) was stuck on the resulting polishing sheet, to complete a polishing pad. Using a silicone wafer having an oxide film deposited thereon, the polishing characteristics of the resulting polishing pad were evaluated by using a CMP polishing apparatus (SPP-600S manufactured by Okamoto Machine Tool Works, Ltd.). A polishing characteristics was evaluated with silica slurry adjusted to pH 11 (RD97001 manufactured by Fujimi Inc.) to flow at a flow rate of 150 g/min under conditions where the polishing loading was 350 g/cm², the number of revolutions of the polishing pad was 35 rpm, and the number of revolutions of the wafer was 33 rpm.

As polishing characteristics, the average polishing rate and within wafer uniformity were evaluated. A 1 μm thermal-oxide film deposited on a 6-inch silicone wafer was polished until the thickness of the thermal-oxide film was reduced to 0.5 μm, during which the average polishing rate was determined.

The thickness of the wafer was measured at predetermined 28 positions, to determine within wafer uniformity according to the equation below. A smaller value of within wafer uniformity is indicative of more excellent uniformity.

within wafer uniformity (%)={(maximum thickness of the film−minimum thickness of the film)/(2× average thickness of the film)}×100

The average polishing rate of the resulting polishing pad was 1350 Å/min, and the within wafer uniformity was 7%.

Example 8-2

A polishing sheet and a polishing pad were prepared in the same manner as in Example 8-1 except that 24750 parts by weight of polytetramethylene glycol having a number-average molecular weight of 990 and a molecular-weight distribution of 1.5 were used.

The measured modulus of elasticity, average polishing rate and within wafer uniformity of the resulting polishing sheet and polishing pad are shown in Table 8.

Comparative Example 8-1

A polishing sheet and a polishing pad were prepared in the same manner as in Example 8-1 except that 25450 parts by weight of polytetramethylene glycol having a number-average molecular weight of 1018 and a molecular-weight distribution of 2.0 were used.

The measured modulus of elasticity, average polishing rate and within wafer uniformity of the resulting polishing sheet and polishing pad are shown in Table 8.

TABLE 8

|  | Modulus of elasticity (MPa) | | | Average polishing rate | within wafer uniformity |
| --- | --- | --- | --- | --- | --- |
|  | 20° C. | 40° C. | 60° C. | (Å/min) | (%) |
| Example 8-1 | 404 | 299 | 190 | 1350 | 7 |
| Example 8-2 | 390 | 308 | 205 | 1450 | 5 |
| Comparative Example 8-1 | 410 | 271 | 160 | 1100 | 11 |

As can be seen from the results shown above, the other polishing pads of the present invention show a high average polishing rate, are excellent in within wafer uniformity, and enables stable planarizing processing. As can be seen from the modulus of elasticity at each temperature, these achievements would be attributable to the less dependence of the modulus of elasticity on temperature, that is, to the suppression of the change in the hardness (modulus of elasticity) of the polishing pad caused by frictional heat between the polishing pad and a workpiece.

<[II] Polishing Pad>

In another polishing pad according to the present invention, the polymer material serving as the matrix material in the polishing layer is not particularly limited. The polymer material includes, for example, polyurethane, polyester, polyamide, acrylic resin, olefinic resin etc. Among these materials, the polyurethane is desired because it has properties of achieving desirable physical properties by abrasion resistance and is easy to change the composition of starting materials, as described above.

Hereinafter, the polyurethane is described as a typical example of the polymer material. The polyurethane comprises an organic polyisocyanate, a polyol compound and a chain extender.

As the organic polyisocyanate, compounds known in the field of polyurethane can be used without particular limitation. The organic polyisocyanate includes, for example, aromatic diisocyanates such as 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethylhexamethylene diisocyanate and 1,6-hexamethylene diisocyanate, and alicyclic diisocyanates such as 1,4-cyclohexane diisocyanate, 4,4'-dicyclohexylmethane diisocyanate, isophorone diisocyanate, hydrogenated m-xylylene diisocyanate, and norbornane diisocyanate. These may be used alone or as a mixture of two or more thereof.

The usable organic polyisocyanate includes not only the diisocyanate compounds described above but also multifunctional (trifunctional or more) polyisocyanate compounds. As the multifunctional isocyanate compounds, Desmodule-N (manufactured by Bayer) and a series of diisocyanate adduct compounds under the trade name of Duranate (Asahi Chemical Industry Co., Ltd.) are commercially available.

The polyol compound includes compounds usually used as polyol compounds in the field of polyurethane. The polyol compound includes, for example, the following high-molecular polyols.

(1) Polyether Polyol

The polyether polyol includes polyoxypropylene polyols obtained by adding propylene oxide to at least one polyvalent alcohol such as ethylene glycol, diethylene glycol, propylene glycol, dipropylene glycol, glycerin, trimethylol propane etc., polyoxyethylene polyols obtained by adding ethylene oxide to at least one polyvalent alcohol, polyols obtained by adding butylene oxide, styrene oxide etc. to at least one polyvalent alcohol, and polytetramethylene glycols obtained by adding tetrahydrofuran via ring-opening polymerization to the polyvalent alcohol. A copolymer using two or more of the above-mentioned cyclic ethers can also be used.

(2) Polyester Polyol

The polyester polyol includes polyols such as condensation polymers of at least one member of glycols such as ethylene glycol, 1,2-propylene glycol, 1,3-propylene glycol, 1,4-butane diol, 1,5-pentane diol, 1,6-hexane diol, 1,4-cyclohexane dimethanol, neopentyl glycol, 3-methyl-1,5-pentane diol, diethylene glycol, triethylene glycol and 1,4-bis(2-hydroxyethoxy)benzene, glycerin, trimethylol propane, pentaerythritol and other low-molecular polyvalent alcohols and at least one member of glutaric acid, adipic acid, pimelic acid, suberic acid, sebacic acid, terephthalic acid, isophthalic acid, dimer acid, hydrogenated dimer acid, other low-molecular dicarboxylic acids and oligomer acids, as well as ring-opening polymers of propiolactone, caprolactone, valerolactone etc. Typical examples of the polyester polyol include polybutylene adipate and polycaprolactone polyol.

(3) Polycarbonate Polyol

The polycarbonate polyol includes polyester polycarbonate polyols exemplified by reaction products of a polyester glycol such as polycaprolactone and alkylene carbonate, polyester polycarbonate polyols obtained by reacting ethylene carbonate with polyvalent alcohols and then reacting the resulting reaction mixture with an organic dicarboxylic acid, and those obtained by ester exchange reaction of a polyhydroxy compound with aryl carbonate.

(4) Acryl Polyol

The acryl copolymer used include acryl polyols comprising copolymerizable monomers having two or more hydroxyl groups in one molecule, for example hydroxyalkyl acrylates such as β-hydroxyethyl acrylate, β-hydroxypropyl acrylate, 3-hydroxypropyl acrylate, β-hydroxybutyl acrylate, 4-hydroxybutyl acrylate, β-hydroxypentyl acrylate, or their corresponding hydroxyalkyl methacrylates, monoacrylates of polyvalent alcohols such as glycerin, trimethylol propane etc. or their corresponding monomethacrylates, and hydroxyl-containing monoethylenically unsaturated monomers such as N-methylol acrylamide or N-methylol methacrylamide.

As the acryl polyol, terecheric acryl polyol can also be used. Such terecheric acryl polyol is a hydroxyl-containing acrylic polymer obtained by polymerizing an unsaturated monomer containing (meth)acrylate by an organic peroxide compound-containing initiator in the presence of an alcohol compound and in the presence of an organic sulfonic acid compound. The alcohol compound is preferably an aliphatic alcohol such as methanol or ethanol or an alicyclic alcohol, and when a monofunctional alcohol is used as the alcohol compound, the resulting active hydrogen group-containing acrylic polymer is substantially divalent, while when a diol is used as the alcohol compound, the active hydrogen group-containing acrylic polymer is substantially tetravalent.

(5) Other Polyols

Other polyols such as phenol resin polyol, epoxy polyol, polybutadiene polyol, polyisoprene polyol, polyester-polyether polyol, polymer polyol comprising a polymer such as acrylonitrile and styrene dispersed or subjected to vinyl addition, urea-dispersed polyol, carbonate polyol etc. can be used as the polyol in the present invention. Polyol compounds obtained by condensating these polyol compounds with p-aminobenzoic acid to convert their active hydrogen atoms into aromatic amino groups can also be used.

The number-average molecular weight of these high-molecular polyols is not particularly limited, but is preferably about 500 to 2000 from the viewpoint of the elastic characteristics of the resulting polyurethane. When the number-average molecular weight of the high-molecular polyol is less than 500, the polyurethane obtained therefrom does not have sufficient elastic characteristics, and becomes a brittle polymer to be easily abraded, and is thus not preferable from the viewpoint of the life of the polishing pad. On the other hand, when the number-average molecular weight is higher than 2000, the polyurethane obtained therefrom may be soft to fail to achieve sufficiently satisfactory planarity.

As the polyol compound, a low-molecular polyol illustrated as the polyester polyol may be used in combination with the above-described high-molecular polyol. These polyol compounds may be used alone or as a mixture of two or more thereof. The ratio of the high-molecular polyol to the low-molecular polyol in the polyol compound is not particularly limited, and can be determined depending on the required characteristics of the polishing layer in the polishing pad using the polyurethane produced therefrom.

In another polishing pad according to the present invention, a water-soluble polymeric polyol is contained in the polyol compound, and the resulting polyurethane is adjusted to the above degree of swelling. The "water solubility" of the water-soluble polymeric polyol means that the polymeric polyol is completely miscible with the same volume of water. The water-soluble polymeric polyol includes, for example, polyethylene glycol among the polymeric polyols illustrated above. Water-soluble polymeric polyols other than those illustrated above include polyester polyols wherein monomers having an ionic group, such as dibasic acids (for example, 5-(tetra-n-butylsulfonium)sulfoisophthalic acid) having a sulfonic acid (salt) group, were copolymerized.

The ratio of the water-soluble polymeric polyol in the whole polyol compound is not particularly limited, but is preferably in the range of about 1 to 70% by weight. When the ratio of the water-soluble polymeric polyol is low, the degree of swelling of the resulting polyurethane is decreased, and the polyurethane is not sufficiently swollen in a moistening atmosphere with supplied slurry, and the surface of the polishing layer is not sufficiently softened to prevent scratches, and therefore the ratio of the water-soluble polymeric polyol is preferably at least 1% by weight, more preferably at least 5% by weight, still more preferably at least 10% by weight. On the other hand, when the ratio of the water-soluble polymeric polyol is high, the degree of swelling of the polyurethane is increased, and not only the surface but also the inside of the polyurethane is swollen in a moistening atmosphere with supplied slurry, and the whole of the polishing layer tends to be softened to fail to achieve sufficient improvement in planarity, and thus the ratio of the water-soluble polymeric polyol is preferably not higher than 70% by weight, more preferably not higher than 65% by weight, still more preferably 60% by weight.

As the polyol compound used in the other polishing pad of the present invention, an ether-based polyol is preferably used in consideration of the hydrolysis resistance of the resulting polyurethane, as described above. An ether-based water-soluble glycol is desirably contained as the polyol component so that the wetting properties of the resulting polyurethane with water can be improved to such a range as to attain the optimum contact angle. The ether-based water-soluble glycol refers to glycol having an intramolecular ether linkage and a completely miscible property with the same volume of water. As the ether-based water-soluble glycol, it is preferable to use the above-illustrated polyols and polyethylene glycol, diethylene glycol and triethylene glycol in the above-illustrated polyvalent alcohols. One or two or more of these water-soluble glycols may be contained. A trifunctional or multifunctional component may be used in combination therewith.

The ratio of the ether-based water-soluble glycol in the whole polyol compound is not particularly limited, but is desirably in the range of about 1 to 85% by weight. When the ratio of the water-soluble glycol is low, the wetting properties of the polyurethane may be insufficient (the contact angle to water is increased), the polishing rate may be decreased, uniform polishing may not be feasible, and scratches may be caused, and therefore, the ratio of the ether-based water-soluble glycol is preferably at least 1% by weight, more preferably at least 5% by weight, still more preferably at least 8% by weight. On the other hand, when the ratio of the ether-based water-soluble glycol is high, the wetting properties of the polyurethane are too high (the contact angle to water is decreased), and the polishing rate may be unstable, and thus the ratio of the ether-based water-soluble glycol is preferably not higher than 85% by weight, more preferably not higher than 80% by weight, still more preferably not higher than 70% by weight.

The chain extender is an organic compound having at least 2 or more active hydrogen groups, and the active hydrogen group includes, for example, a hydroxyl group, a primary or secondary amino group, a thiol group (SH) etc. The chain extender is a compound having a molecular weight of 500 or less. Examples of such compounds include the above-mentioned low-molecular polyols, aromatic or alicyclic diamines such as 4,4'-methylenebis(o-chloroaniline), 2,6-dichloro-p-phenylene diamine, 4,4'-methylenebis(2,3-dichloroaniline) and dicylohexylmethane-4,4'-diamine, and aromatic diols such as 1,4-bishydroxyethoxybenzene (Cuamine H (manufactured by Ihara Chemical) and m-xylylene diol (manufactured by Mitsubishi Gas Chemical Co., Inc.). These chain extenders may be used alone or as a mixture of two or more thereof.

The contents of the organic polyisocyanate, the polyol compound and the chain extender in the present invention can be varied considerably depending on their molecular weights and the desired physical properties of the polyurethane (polishing layer) produced therefrom. To obtain the polishing pad having the desired polishing characteristics, the number of isocyanate groups in the organic polyisocyanate to the number of total functional groups (number of total active hydrogen groups such as hydroxyl group, amino group etc.) in the polyol compound and in the chain extender is desirably in the range of 0.95 to 1.15, more desirably 0.99 to 1.10. The ratio of the high-molecular component to the low-molecular component in the polyol compound is determined according to the required characteristics of finely foamed polyurethane produced therefrom.

The method of producing the polyurethane and the polishing pad is not particularly limited, and the method described above can be used.

In the other polishing pad of the present invention, the amount of the silicone-based surfactant added is preferably 0.1 to 5% by weight based on the polyurethane material (total amount of the first and second components). When the amount is less than 0.1% by weight, foam with fine cells may not be obtained. From this viewpoint, the amount of the silicone-based surfactant added is preferably at least 1% by weight. On the other hand, when the amount is higher than 5% by weight, the number of cells in finely foamed polyurethane is increased, and highly hard finely foamed polyurethane is hardly obtainable. Further, the strength of the polishing layer is decreased, and planarizing characteristics are lowered in polishing. From this viewpoint, the amount of the silicone-based surfactant added is preferably not higher than 5% by weight.

EXAMPLES

Hereinafter, the present invention is described in more detail by reference to the Examples, but the present invention is not particularly limited by the Examples.

Example 9

Reference Example 9-1

(Preparation of a Polyurethane Block)

1566 parts by weight of toluene diisocyanate (mixture of 2,4-diisocyanate/2,6-diisocyanate in a ratio of 80/20, abbreviated hereinafter to TDI), 786 parts by weight of 4,4'-dicyclohexylmethane diisocyanate (abbreviated hereinafter to HMDI), 790 parts by weight of polytetramethylene glycol (abbreviated hereinafter to PTMG) having a number-average molecular weight of 844, 1310 parts by weight of polyethylene glycol (abbreviated hereinafter to PEG) having a number-average molecular weight of 600, and 331 parts by weight of diethylene glycol (abbreviated hereinafter to DEG) were introduced into a vessel and stirred under heating at 80° C. for 120 minutes to give an isocyanate-terminated prepolymer. This prepolymer mixture was defoamed under reduced pressure and then regulated at 80° C., and 1520 parts by weight of 4,4'-methylenebis(o-chloroaniline) (abbreviated hereinafter to MBOCA) previously melted at 120° C. were added thereto under stirring. The mixture was stirred for about 1 minute, and the mixed solution was introduced into a pan-type open mold and post-cured for 6 hours in an oven at 110° C., to produce a non-foamed polyurethane block.

(Measurement of the Degree of Swelling)

A specimen of 2 mm in thickness and 20 by 20 mm square was cut off from the resulting polyurethane block and dipped in an aqueous sodium hydroxide solution, pH 11, at 20° C. for 24 hours and then measured for its degree of swelling according to the following equation. As a result, the degree of swelling was 7.5%.

$$\text{Degree of swelling (\%)} = [\{(\text{weight after 24 hours}) - (\text{original weight})\}/(\text{original weight})] \times 100$$

Example 9-1-A (Preparation of a Finely Foamed Polyurethane Block)

An isocyanate-terminated prepolymer was prepared in the same manner as in Reference Example 9-1. Thereafter, 210 parts by weight of a silicone surfactant (SH-192 manufactured by Toray Dow Corning Silicone Co., Ltd.) were added to and mixed with this prepolymer and regulated at a temperature of 80° C. 1520 parts by weight of MBOCA previously melted at 120° C. were added thereto under stirring. The mixture was stirred for about 1 minute, and the mixed solution was introduced into a pan-type open mold and post-cured for 6 hours in an oven at 110° C., to produce a finely foamed polyurethane block (cell diameter 40 μm). The density of the resulting finely foamed polyurethane was 0.75 g/cm$^3$. The density was measured according to JIS K 7222 (Foamed plastics and rubber: measurement of apparent density).

(Measurement of Storage Elastic Modulus)

Under heating at about 50° C., this finely foamed polyurethane block was sliced into a sheet of 1.27 mm in thickness by a slicer (VGW-125 manufactured by Amitec) to give a polishing sheet. From this sheet, a rectangular sheet of 5 mm in width was cut off. Its determined storage elastic modulus was 325 MPa.

The elastic modulus was measured in a frequency of 1 Hz with sinusoidal wave vibration with a tensile testing jig in a dynamic viscoelasticity measuring device Rheogel-E4000 (manufactured by UBM). Storage elastic modulus was measured at a temperature of from −20° C. to 80° C. in a temperature-dependent mode, and the storage elastic modulus at 40° C. was shown as the elastic modulus.

(Preparation of a Polishing Pad)

A double-coated tape (double-tack tape #5782 manufactured by Sekisui Chemical Co., Ltd.) was stuck on the resulting polishing sheet, to complete a polishing pad. The polishing characteristics of the resultant polishing pad were evaluated by using a CMP polishing apparatus (SPP-600S manufactured by Okamoto Machine Tool Works, Ltd.). Polishing characteristics was evaluated with silica slurry adjusted to pH 11 (RD97001 manufactured by Fujimi Inc.) to flow at a flow rate of 150 g/min. under conditions where the polishing loading was 350 g/cm$^2$, the number of revolutions of the polishing pad was 35 rpm, and the number of revolutions of the wafer was 33 rpm.

(Planarity)

For evaluation of planarity, a 0.5 μm thermal-oxide film was deposited on a 6-inch silicone wafer and subjected to patterning (L/S (line/space)=25 μm/5 μm, and L/S=5 μm/25 μm), and a 1 μm oxide film (TEOS) was further deposited thereon, to prepare a wafer having a pattern with an initial difference in level of 0.5 μm. This wafer was polished under the above-described conditions, and the abrasion loss in 25 μm-space when the global difference in level was reduced to 2000 Å or less was measured to evaluate the planarity. The planarity of the resulting polishing pad was 75 nm. A smaller value is indicative of more excellent planarity.

(Scratches)

In evaluation of scratches, a 1 μm thermal-oxide film deposited on a 6-inch silicone wafer was polished under the above-described polishing conditions until the thickness of the thermal-oxide film was reduced to 0.5 μm, and then the wafer was washed, dried and measured for its microscratches by KLA (KLA2112 manufactured by KLA Tencol). Ten scratches on this wafer were observed.

(Polishing Rate)

In evaluation of polishing rate, a 1 μm thermal-oxide film deposited on a 6-inch silicone wafer was polished under the above-described polishing conditions until the thickness of the thermal-oxide film was reduced to 0.5 μm, and the polishing rate was determined from the polishing time. The polishing rate of the resulting polishing pad was 115 nm/min. A higher average polishing rate is indicative of a more excellent polishing pad.

Example 9-1-B

From the non-foamed polyurethane block obtained in Reference Example 9-1, a polishing pad was prepared in the same manner as in Example 9-1-A and evaluated for its polishing characteristics. The result is shown in Table 9. When this non-foamed polyurethane was measured for its density and storage elastic modulus in the same manner as in Example 9-1-A, the density was 1.18 g/cm$^3$ and the storage elastic modulus of the polishing sheet was 970 MPa.

Reference Example 9-2

(Preparation of a Polyurethane Block)

1566 parts by weight of TDI, 786 parts by weight of HMDI, 1580 parts by weight of PTMG having a number-average molecular weight of 844, 749 parts by weight of PEG having a number-average molecular weight of 600, and 331 parts by weight of DEG were introduced into a vessel and stirred under heating at 80° C. for 120 minutes to give an isocyanate-terminated prepolymer. This prepolymer mixture was defoamed under reduced pressure and then regulated at 80° C., and 1520 parts by weight of MBOCA previously melted at 120° C. were added thereto under stirring. The mixture was stirred for about 1 minute, and the mixed solution was introduced into a pan-type open mold and post-cured for 6 hours in an oven at 110° C., to produce a non-foamed polyurethane block. The degree of swelling of the resulting non-foamed polyurethane block, as determined in the same manner as in Reference Example 9-1, was 2.8%.

Example 9-2-A (Preparation and Evaluation of a Finely Foamed Polyurethane Block)

An isocyanate-terminated prepolymer was prepared in the same manner as in Reference Example 9-2. Thereafter, 210 parts by weight of SH-192 were added to and mixed with this prepolymer and regulated at a temperature of 80° C. 1520 parts by weight of MBOCA previously melted at 120° C. were added thereto under stirring. The mixture was stirred for about 1 minute, and the mixed solution was introduced into a pan-type open mold and post-cured for 6 hours in an oven at 110° C., to produce a finely foamed polyurethane block (cell diameter 40 μm). When the resulting finely foamed polyurethane was measured for its density and storage elastic modulus in the same manner as in Example 9-1-A, the density was 0.74 g/cm$^3$ and the storage elastic modulus of the polishing sheet was 310 MPa. A polishing pad was prepared in the same manner as in Example 9-1-A and evaluated for its polishing characteristics. The results are shown in Table 9.

Example 9-2-B

From the non-foamed polyurethane block obtained in Reference Example 9-2, a polishing pad was prepared in the same manner as in Example 9-1-A and evaluated for its polishing characteristics. The results are shown in Table 9. When this non-foamed polyurethane was measured for its density and storage elastic modulus in the same manner as in Example 9-1-A, the density was 1.17 g/cm$^3$ and the storage elastic modulus of the polishing sheet was 929 MPa.

Reference Example 9-3

(Preparation of a Polyurethane Block)

500 parts by weight of a polyether-based prepolymer (Adiprene L-325, NCO content 2.22 meq/g, manufactured by Uniroyal) were introduced into a vessel and defoamed under reduced pressure. 145 parts by weight of MBOCA previously melted at 120° C. were added thereto under stirring. The mixture was stirred for about 1 minute, and the mixed solution was introduced into a pan-type open mold and post-cured for 6 hours in an oven at 110° C., to give a non-foamed polyurethane block. The degree of swelling of the resulting non-foamed polyurethane block, as determined in the same manner as in Reference Example 9-1, was 1.8%.

Comparative Example 9-1-A (Preparation and Evaluation of a Fine Hollow-Containing Polyurethane Block)

500 parts by weight of a polyether-based prepolymer (Adiprene L-325, NCO content 2.22 meq/g, manufactured by Uniroyal) were mixed with 13 parts by weight of Expancel 551DE (fine hollow particles consisting of a vinylidene chloride/acrylonitrile copolymer manufactured by Japan Ferrite) and defoamed under reduced pressure. 145 parts by weight of MBOCA previously melted at 120° C. were added thereto under stirring. The mixture was stirred for about 1 minute, and the mixed solution was introduced into a pan-type open mold and post-cured for 6 hours in an oven at 110° C., to give a fine hollow-containing polyurethane block (cell diameter 40 μm). When the fine hollow-containing polyurethane was measured for its density and storage elastic modulus in the same manner as in Example 9-1-A, the density was 0.75 g/cm$^3$ and the elastic modulus of the polishing sheet was 268 MPa. A polishing pad was prepared in the same manner as in Example 9-1-A and evaluated for its polishing characteristics. The results are shown in Table 9.

Comparative Example 9-1-B

From the non-foamed polyurethane block obtained in Reference Example 9-3, a polishing pad was prepared in the same manner as in Example 9-1-A and evaluated for its polishing characteristics. The results are shown in Table 9. When this non-foamed polyurethane was measured for its density and storage elastic modulus in the same manner as in Example 9-1-A, the density was 1.19 g/cm³ and the storage elastic modulus of the polishing sheet was 750 MPa.

Reference Example 9-4

(Preparation of a Polyurethane Block)

1566 parts by weight of TDI, 786 parts by weight of HMDI, 318 parts by weight of PTMG having a number-average molecular weight of 844, 2623 parts by weight of PEG having a number-average molecular weight of 1000, and 318 parts by weight of DEG were introduced into a vessel and stirred under heating at 80° C. for 120 minutes to give an isocyanate-terminated prepolymer. This prepolymer mixture was defoamed under reduced pressure and then regulated at 80° C., and 1520 parts by weight of MBOCA previously melted at 120° C. were added thereto under stirring. The mixture was stirred for about 1 minute, and the mixed solution was introduced into a pan-type open mold and post-cured for 6 hours in an oven at 1110° C., to produce a non-foamed polyurethane block. The degree of swelling of the resulting non-foamed polyurethane block, as determined in the same manner as in Reference Example 9-1, was 17.4%.

Comparative Example 9-2-A (Preparation and Evaluation of a Finely Foamed Polyurethane Block)

An isocyanate-terminated prepolymer was prepared in the same manner as in Reference Example 9-4. Thereafter, 190 parts by weight of SH-192 were added to and mixed with this prepolymer and regulated at a temperature of 80° C. 1520 parts by weight of MBOCA previously melted at 120° C. were added thereto under stirring. The mixture was stirred for about 1 minute, and the mixed solution was introduced into a pan-type open mold and post-cured for 6 hours in an oven at 110° C., to produce a finely foamed polyurethane block (cell diameter 40 μm). When the resulting finely foamed polyurethane was measured for its density and storage elastic modulus in the same manner as in Example 9-1-A, the density was 0.84 g/cm³ and the storage elastic modulus of the polishing sheet was 271 MPa. A polishing pad was prepared in the same manner as in Example 9-1-A and evaluated for its polishing characteristics. The results are shown in Table 9.

Comparative Example 9-2-B

From the non-foamed polyurethane block obtained in Reference Example 9-4, a polishing pad was prepared in the same manner as in Example 9-1-A and evaluated for its polishing characteristics. The results are shown in Table 9. When this non-foamed polyurethane was measured for its density and storage elastic modulus in the same manner as in Example 9-1-A, the density was 1.18 g/cm³ and the storage elastic modulus of the polishing sheet was 754 MPa

TABLE 9

|  |  |  | Degree of swelling (%) | Density (g/cm³) | Storage elastic modulus (MPa) | Planarity (nm) | Number of scratches | Polishing rate (nm/min) |
| --- | --- | --- | --- | --- | --- | --- | --- | --- |
| Example 9-1 | A | finely foamed | 7.5 | 0.75 | 325 | 75 | 10 | 115 |
|  | B | not foamed |  | 1.18 | 970 | 40 | 58 | 35 |
| Example 9-2 | A | finely foamed | 2.8 | 0.74 | 310 | 75 | 14 | 110 |
|  | B | not foamed |  | 1.17 | 929 | 45 | 50 | 40 |
| Comparative Example 9-1 | A | fine hollow | 1.8 | 0.75 | 268 | 100 | 90 | 115 |
|  | B | not foamed |  | 1.19 | 750 | 55 | 380 | 35 |
| Comparative Example 9-2 | A | finely foamed | 17.4 | 0.84 | 271 | 120 | 8 | 110 |
|  | B | not foamed |  | 1.18 | 754 | 95 | 15 | 45 |

As is evident from Table 9, the polishing pads obtained by the present invention satisfy improvement in planarity and reduction in scratches. Further, the polishing pads comprising the finely foamed polyurethane satisfy the polishing rate.

Example 10

<Evaluation Methods>

(Measurement of Contact Angle)

The foamed polyurethane was sandwiched between two ethylene tetrafluoride resin tapes each having a thickness of 0.2 mm (Naphrone tape TOMBO9001 manufactured by Nichias Co., Ltd.), and the resulting sandwich was further sandwiched between iron plates each having a thickness of 1 mm and then formed by a heat pressing machine into a film of about 100 μm in thickness. The temperature was 215° C., and the pressing pressure was 5 MPa. The contact angle of this film to water was measured by a droplet method by using a contact angle meter CA-X (Kyowa Kaimen Kagaku Co., Ltd.). The contact angle, which was measured 1 minute after dropping at 25° C. in 60% humidity, was used.

(Polishing Characteristics)

The polishing characteristics of the polishing pad were evaluated by using a CMP polishing apparatus SPP-600S (manufactured by Okamoto Machine Tool Works, Ltd.). Polishing characteristics was evaluated with silica slurry RD97001 adjusted to pH 11 (manufactured by Fujimi Inc.) to flow at a flow rate of 150 g/min. under conditions where the polishing loading was 350 g/cm², the number of revolutions of the polishing pad was 35 rpm, and the number of revolutions of the wafer was 33 rpm. The within wafer uniformity, average polishing rate, polishing rate stability and scratches described below were evaluated as the polishing characteristics.

(Within Wafer Uniformity)

A 1 μm thermal-oxide film deposited on a 6-inch silicone wafer was polished for 5 minutes under the polishing conditions described above, and the thickness of the wafer was measured at predetermined 28 positions, and within wafer uniformity was determined according to the equation below. A smaller value of within wafer uniformity is indicative of more excellent uniformity.

within wafer uniformity (%)={(maximum thickness of the film−minimum thickness of the film)/(2× average thickness of the film)}×100

(Average Polishing Rate)

A 1 μm thermal-oxide film deposited on a 6-inch silicone wafer was polished for 5 minutes under the polishing conditions described above, and from the abrasion loss, the average polishing rate was determined. A sample showing a higher average polishing rate can be evaluated to be excellent.

(Polishing Rate Stability)

A 1 μm thermal-oxide film deposited on a 6-inch silicone wafer was polished for 1 minute under the above-described polishing conditions, and this polishing was repeated 5 times successively, and the polishing rate was determined every time polishing, and the polishing rate stability was determined according to the equation below. Smaller polishing rate stability is indicative of an excellent polishing pad.

Polishing rate stability (%)={(maximum polishing rate)−(minimum polishing rate)/(average polishing rate)}×100

(Scratches)

In evaluation of scratches, a 1 μm thermal-oxide film deposited on a 6-inch silicone wafer was polished for 5 minutes under the above-described polishing conditions, and then the wafer was washed, dried and measured for its microscratches by KLA (KLA2112 manufactured by KLA Tencol). A sample showing a lower number of scratches can be evaluated to be an excellent polishing layer material.

Example 10-1

<Production of a Polishing Layer Material>

1566 parts by weight of toluene diisocyanate (mixture of 2,4-diisocyanate/2,6-diisocyanate in a ratio of 80/20, abbreviated hereinafter to TDI), 786 parts by weight of 4,4'-dicyclohexylmethane diisocyanate (abbreviated hereinafter to HMDI), 1509 parts by weight of polytetramethylene glycol (abbreviated hereinafter to PTMG) having a number-average molecular weight of 1006, 1500 parts by weight of polyethylene glycol (abbreviated hereinafter to PEG) having a number-average molecular weight of 1000, and 318 parts by weight of diethylene glycol (abbreviated hereinafter to DEG) were introduced into a vessel and stirred under heating at 80° C. for 120 minutes to give an isocyanate-terminated prepolymer. 210 parts by weight of a silicone surfactant SH192 (manufactured by Toray Dow Corning Silicone Co., Ltd.) were added thereto and regulated at 80° C. 1520 parts by weight of 4,4'-methylenebis(o-chloroaniline) (abbreviated hereinafter to MBOCA) previously melted at 120° C. were added thereto under so vigorous stirring as to incorporate cells. The mixture was stirred for about 1 minute, and the mixed solution was introduced into a pan-type open mold and post-cured for 6 hours in an oven at 110° C., to produce a foamed polyurethane block (cell diameter 40 μm).

The density of this foamed polyurethane block was 0.85 g/cm$^3$. The density was measured according to JIS K 7222 (Foamed plastics and rubber: measurement of apparent density).

Separately, polyurethane having the same composition was polymerized, and its contact angle to water, as determined in the following manner, was 85°.

<Preparation of a Polishing Pad>

Under heating at about 50° C., the resulting foamed polyurethane block with fine cells as a polishing layer-forming material was sliced into a sheet of 1.27 mm in thickness by a slicer (VGW-125 manufactured by Amitec) to give a foamed polyurethane sheet. This sheet was cut into a round sheet of 610 mm in diameter and provided with grooves in a lattice-like pattern (groove width 2.0 mm, groove depth 0.6 mm, groove pitch 15 mm) or grooves in the form of concentric circles (groove width 0.3 mm, groove depth 0.4 mm, groove pitch 1.5 mm) on the surface of the sheet.

A double-coated tape (double-tack tape #5782 manufactured by Sekisui Chemical Co., Ltd.) was stuck on the foamed polyurethane sheet provided with the grooves, to complete a polishing pad sample. The evaluation results of the resulting polishing pad are shown in Table 10.

Example 10-2

A foamed polyurethane block (cell diameter 40 μm) was obtained in the same manner as in Example 10-1 except that 1566 parts by weight of TDI, 786 parts by weight of HMDI, 785 parts by weight of PTMG having a number-average molecular weight of 1006, 1404 parts by weight of PEG having a number-average molecular weight of 600, and 331 parts by weight of DEG were used to produce an isocyanate-terminated prepolymer, and the amount of MBOCA was 1500 parts by weight. The density of the resulting foamed polyurethane block was 0.78 g/cm$^3$.

The contact angle of this polyurethane composition, as determined in the same manner as in Example 10-1, was 79°.

A polishing pad was prepared in the same manner as in Example 10-1, and evaluated for polishing characteristics. The results are shown in Table 10.

Example 10-3

500 parts by weight of a polyether-based prepolymer (Adiprene L-325, NCO content 2.22 meg/g, manufactured by Uniroyal) were mixed with 19 parts by weight of SH192 and regulated at 80° C. 145 parts by weight of MBOCA previously melted at 120° C. were added thereto under so vigorous stirring as to incorporate cells. The mixture was stirred for about 1 minute, and the mixed solution was introduced into a pan-type open mold and post-cured for 6 hours in an oven at 110° C., to produce a foamed polyurethane block (cell diameter 35 μm). The density of this foamed polyurethane block was 0.86 g/cm$^3$.

The contact angle of this polyurethane composition, as determined in the same manner as in Example 10-1, was 90°. By proton NMR analysis, it was found that as the polyol component, PTMG having a number-average molecular weight of 1000 was contained in an amount of about 0.539 part by weight, and DEG in an amount of about 0.057 part by weight, per 1 part by weight of the composition of Adiprene L-325.

A polishing pad was prepared in the same manner as in Example 10-1 and evaluated for its polishing characteristics. The results are shown in Table 10.

Comparative Example 10-1

A foamed polyurethane block (cell diameter 40 μm) was prepared in the same manner as in Example 10-1 except that 1566 parts by weight of TDI, 786 parts by weight of HMDI, 302 parts by weight of PTMG having a number-average molecular weight of 1006, 2700 parts by weight of PEG having a number-average molecular weight of 1000, and 318 parts by weight of DEG were used to prepare an isocyanate-terminated prepolymer, and the amount of MBOCA was 1520 parts by weight. The density of the resulting foamed polyurethane block was 0.85 g/cm$^3$.

The contact angle of this polyurethane composition, as determined in the same manner as in Example 10-1, was 69°.

A polishing pad was prepared in the same manner as in Example 10-1 and evaluated for its polishing characteristics. The results are shown in Table 10.

Comparative Example 10-2

A foamed polyurethane block (cell diameter 40 μm) was prepared in the same manner as in Example 10-1 except that 1566 parts by weight of TDI, 786 parts by weight of HMDI and 3622 parts by weight of PTMG having a number-average molecular weight of 1006 were used to prepare an isocyanate-terminated prepolymer, and the amount of MBOCA was 2136 parts by weight. The density of the resulting foamed polyurethane block was 0.84 g/cm$^3$.

The contact angle of this polyurethane composition, as determined in the same manner as in Example 10-1, was 97°.

A polishing pad was prepared in the same manner as in Example 10-1 and evaluated for its polishing characteristics. The results are shown in Table 10.

The average diameter of cells in foam and the number of cells per unit area in the cushion layer of closed-cell type in the present invention are not particularly limited, and are suitably determined according to the required characteristics of the cushion layer depending on an object of polishing and polishing conditions.

The method of obtaining the foam of closed-cell type is not limited insofar as foam whose degree of swelling with water is in the range shown in the present invention. Generally, the following methods are known and usable in production of the cushion layer in the polishing pad of the present invention: A physical foaming method wherein a low-molecular gas such as $CO_2$ is dissolved in resin at a predetermined temperature and pressure, and the dissolved gas is made super-saturated by rapidly reducing pressure and increasing temperature to generate cells in the resin, a method wherein a low-boiling organic compound is mixed with a polymerizable resin material and hardened simultaneously with foaming, a chemical foaming method wherein a chemical foaming agent (reactant) is kneaded with a resin material, then decomposed and reacted under predetermined temperature conditions to generate a gas such as $CO_2$ or $N_2$ to generate cells in the resin, and a mechanical foaming method wherein a molten resin or a prepolymer is mechanically stirred to incorporate cells, then solidified by cooling or solidified by polymerization reaction to allow cells forcibly enclosed therein.

The non-foamed resin material constituting the cushion layer is not particularly limited, and photosetting resin, thermosetting resin and thermoplastic resin can be used.

The non-foamed resin material is preferably a resin with rubber elasticity of less hysteresis and with compression characteristics of rubber-like elastomer, and examples thereof

TABLE 10

| | Contact angle (°) | Groove shape | within wafer uniformity (%) | Average polishing rate (nm/min) | Polishing rate stability (%) | Number of scratches |
|---|---|---|---|---|---|---|
| Example 10-1 | 85 | lattice-like pattern | 8.0 | 110 | 7.3 | 20 |
| | | concentric circles | 8.0 | 107 | 7.5 | 28 |
| Example 10-2 | 79 | lattice-like pattern | 7.5 | 120 | 8.3 | 15 |
| | | concentric circles | 7.5 | 123 | 8.1 | 12 |
| Example 10-3 | 90 | lattice-like pattern | 8.0 | 110 | 7.3 | 38 |
| | | concentric circles | 8.5 | 113 | 7.1 | 35 |
| Comparative Example 10-1 | 69 | lattice-like pattern | 7.0 | 120 | 13.3 | 20 |
| | | concentric circles | 7.5 | 110 | 14.5 | 12 |
| Comparative Example 10-2 | 97 | lattice-like pattern | 11.0 | 85 | 11.8 | 122 |
| | | concentric circles | 10.5 | 85 | 11.8 | 110 |

As is evident from Table 10, a polishing pad capable of polishing an object of polishing uniformly with fewer scratches and maintaining a satisfactory polishing rate stably could be obtained according to the present invention. These characteristics can be seen to depend on the contact angle of the polishing layer-forming polymer material to water, rather than the difference in the surface shape (difference in the formed grooves) of the polishing pad.

<[III] Polishing Pad>

The material constituting the cushion layer of closed-cell type in another polishing pad according to the present invention is not limited insofar as the degree of swelling with water is in the range shown in the present invention. Specifically, the material includes polyolefins such as polyethylene and polypropylene, polyurethane, polystyrene, polyester, polyvinyl chloride, polyvinylidene chloride, silicone polymer etc.

include a butadiene polymer, isoprene polymer, styrene-butadiene copolymer, styrene-isoprene-styrene block copolymer, styrene-butadiene-styrene block copolymer, styrene-ethylene-butadiene-styrene block copolymer, acrylonitrile-butadiene copolymer, polyurethane elastomer, epichlorohydrin rubber, chlorinated polyethylene, silicone rubber, polyester-based thermoplastic elastomer, polyamide-based thermoplastic elastomer, urethane-based thermoplastic elastomer, and fluorine-type thermoplastic elastomer, as well as photosensitive resin having cushioning properties used in printing materials.

The hardness of the cushion layer-forming material in the present invention is preferably 10 to 75, more preferably 20 to 65, in terms of Shore A hardness. When the Shore A hardness of the cushion layer-forming material is less than 10, there arises a problem in planality and dull edge in the periphery of a wafer, while when the hardness is greater than 75, there arises a problem in uniformity.

The compressibility of the cushion layer-forming material in the present invention is preferably 1.5 to 30%, more preferably 3.5 to 15%. When the compressibility of the cushion layer-forming material is less than 1.5, there arises a problem in uniformity, while when the compatibility is higher than 30%, there arises a problem in planality and dull edge in the periphery of a wafer.

The compression recovery of the material constituting the cushion layer in the polishing pad of the present invention is preferably 70% or more, more preferably 80% or more. When the compression recovery of the material constituting the cushion layer is less than 70%, there arises a problem in polishing rate stability.

The thickness of the polishing layer constituting the polishing pad of the present invention is not particularly limited, but is generally 0.8 to 2 mm, and the thickness of the cushion layer is preferably 0.5 to 5 mm.

The cushion layer in the present invention is preferably subjected to buff processing in order to improve thickness accuracy.

When the cushion layer in the present invention is laminated on the polishing layer, the surface of the cushion layer may be coated with an adhesive layer or a double-coated tape via which the polishing layer is laminated thereon. When the material constituting the cushion layer exhibits adhesive property upon heating or irradiation with light, the cushion layer is laminated on the polishing layer directly without using an adhesive, and then stuck thereon by heating or irradiation with light.

When the polishing pad of the present invention is stuck via the cushion layer on a platen, the surface of the cushion layer may be coated with an adhesive layer or a double-coated tape via which a platen is stuck thereon. When the material constituting the cushion layer exhibits adhesiveness upon heating or irradiation with light, the cushion layer may be stuck on the platen directly without using an adhesive, as is the case with the lamination on the polishing layer described above.

When the cushion layer is stuck via a double-coated tape, the surface of the cushion layer is subjected preferably to surface treatment such as corona discharging treatment in order to improve adhesive strength.

As the material constituting the polishing layer in the polishing pad of the present invention, known polishing layer-forming materials can be used without limitation, and examples thereof include polyurethane resin, polyester resin, polyether resin, acryl resin, ABS resin, polycarbonate resin, or a blend of these resins, and photosensitive resin. These resins may be foamed or non-foamed resins. The resin constituting the polishing layer preferably has higher hardness and lower compressibility than those of the cushion layer.

Among the resins constituting the polishing layer, the polyurethane resin is preferably used because of excellent polishing characteristics, and the polyurethane resin foam of closed-cell type is particularly preferably used. The methods of producing the polyurethane resin foam of closed-cell type and the polishing pad are in accordance with the methods described above.

EXAMPLES

Hereinafter, the present invention is described in more detail by reference to the Examples, but the present invention is not limited by the Examples.

Example 11

<Evaluation Methods>
(Degree of Swelling with Water)

A 1.5 cm×5.0 cm cushion layer-forming material was dried at 50° C. for 24 hours and gradually cooled in a container containing a drying agent, and the weight of the sample was measured with an accuracy balance. Then, this sample was dipped in distilled water and left therein at 20° C. for 24 hours, and then the sample was removed, and the surface of the sample was wiped to remove water, and the weight of the sample was measured with an accuracy balance. Using these weights, the degree of swelling was calculated according to the following equation:

Degree of swelling (wt %)=[(weight after dipping−weight before dipping)/weight before dipping]×100

(Hardness)

According to JIS K 6253, a sample of 6 mm or more in thickness was measured with a Shore A hardness meter.

(Compressibility, Compression Recovery)

Using a cylindrical indenter of 3 mm in diameter, the cushion layer was measured for T1 to T3 at 25° C. with TMA (manufactured by SII), and compressibility and compression recovery were determined according to the following equations:

Compressibility (%)=[($T1-T2$)/$T1$]×100

Compression recovery (%)=[($T3-T2$)/($T1-T2$)]×100

T1: the thickness of the sheet after application of 30 kPa (300 g/cm$^2$) stress for 60 seconds to the sheet.

T2: the thickness of the sheet after application of 180 kPa stress for 60 seconds to the sheet in the state T1.

T3: the thickness of the sheet after leaving the sheet in the state T2 for 60 seconds without loading and subsequent application of 30 kPa stress for 60 seconds to the sheet.

(Evaluation of Polishing Characteristics)

As the polishing apparatus, SPP600S (Okamoto Machine Tool Works, Ltd.) was used in evaluation of the polishing characteristics of the prepared polishing pad. The polishing rate was calculated from the time in which a 1 μm thermal-oxide film formed on an 8-inch silicone wafer was polished by about 0.5 μm. The thickness of the oxide film was measured by an interference film thickness measuring device (manufactured by Otsuka Denshisha). Using a contact needle meter, Rmax and Rmin of predetermined 14 points on the polished surface of the wafer, and within wafer uniformity was calculated according to the formula:

Within wafer Uniformity (%)=100×($R$max−$R$min)/($R$max+$R$min).

During polishing, silica slurry SS12 (manufactured by Cabot) was added at a flow rate of 150 ml/min. The polishing conditions were as follows: The polishing loading was 350 g/cm$^5$, the number of revolutions of the polishing platen was 35 rpm, and the number of revolutions of the wafer was 30 rpm. It can be said that a polishing pad showing higher uniformity is excellent.

In evaluation of polishing rate stability, a 1 μm thermal-oxide film formed on an 8-inch silicone wafer was polished for 5 minutes under the above-described polishing conditions, and thereafter, a new silicone wafer was polished until the wafer was polished by about 0.5 μm, the polishing rate was calculated to evaluate polishing rate stability. It can be said that a polishing pad showing a higher polishing rate is excellent.

[Preparation of a Polishing Layer]

3000 parts by weight of a polyether-based urethane prepolymer Adiprene L-325 (manufactured by Uniroyal) and 120 parts by weight of a silicone-based surfactant SH192 (dimethyl polysiloxane/polyoxyalkyl copolymer manufactured by Toray Dow Corning Silicone Co., Ltd.) were introduced into a vessel and mixed at about 900 rpm with a stirrer to produce a foamed solution, and thereafter, the stirrer was exchanged with another stirrer, and 770 parts by weight of a heat-melted curing agent (4,4'-methylene-bis[2-chloroaniline]) were introduced into it under stirring. The mixture was stirred for about 1 minute, and the mixed solution was introduced into a pan-type open mold and post-cured for 6 hours in an oven at 110° C., to produce a foamed polyurethane block.

Under heating at about 50° C., this foamed polyurethane block was sliced into a sheet of 1.27 mm in thickness by slicer VGW-125 (manufactured by Amitec), followed by buff treatment of the surface thereof, to give a polishing layer-forming sheet.

other side with UV rays. The same double-coated tape as in Example 1-1 was stuck on the other side than the cushion layer-stuck side to prepare a polishing pad.

Example 11-3

A polishing pad was prepared in the same manner as in Example 11-1 except that natural rubber foam (Kureha Super Soft) was used as the cushion layer.

Example 11-4

A polishing pad was prepared in the same manner as in Example 11-1 except that polyurethane foam having a 15-fold degree of foaming was used as the cushion layer.

Comparative Example 11-1

A polishing pad was prepared in the same manner as in Example 11-1 except that a nonwoven fabric with a basic weight of 200 g/m$^2$ using 3.5-denier polyester fibers was impregnated with 30 wt % water-dispersed polyurethane emulsion, then dried and used as the cushion layer.

TABLE 11

|  |  | Example 11-1 | Example 11-2 | Example 11-3 | Example 11-4 | Comparative Example 11-1 |
| --- | --- | --- | --- | --- | --- | --- |
| Characteristics of the cushion layer | Degree of swelling (%) | 14.3 | 0.2 | 24.8 | 9.6 | 41.8 |
|  | Hardness (Shore A) | 37 | 17 | 28 | 27 | 56 |
|  | Compressibility (%) | 6.0 | 20.4 | 19.5 | 13.9 | 15.0 |
|  | Compression recovery (%) | 94 | 93 | 90 | 94 | 73 |
| Evaluation results of the polishing pad | Polishing rate (Å/min) | 2100 | 2550 | 2200 | 2400 | 1900 |
|  | Polishing rate after 5 minutes (Å/min) | 2150 | 2510 | 2300 | 2350 | 2500 |
|  | Uniformity (%) | 7.3 | 6.7 | 6.0 | 7.8 | 7.1 |

[Preparation of a Polishing Pad]

Example 11-1

The polishing layer (with a perforated surface) prepared above was provided on the other side of the polishing surface with a double-coated tape (double-tack tape manufactured by Sekisui Chemical Co., Ltd.), and as a cushion layer, a polyethylene foam (Toray PEF manufactured by Toray Industries, Inc.) (thickness, 1.27 mm) having a surface brushed with a buff and subjected to corona treatment was stuck thereon, and a double-tack tape was stuck on the other side than the cushion layer-stuck surface, to prepare a polishing pad.

Example 11-2

As a cushion layer, 84 parts by weight of a styrene-butadiene copolymer (SBR1507 manufactured by JSR), 10 parts by weight of a monomer lauryl methacrylate, 1 part by weight of a photo-initiator benzyl dimethyl ketal and 5 parts by weight of a plasticizer liquid isoprene were blended with one another, melted and mixed in a twin-screw extruder, and extruded through a T die. The resulting sheet was sandwiched between PET films of 100 μm in thickness and pressed against rolls such that the thickness of the cushion layer was reduced to 1.27 mm, to form an unhardened cushion layer-forming sheet.

The PET films of this unhardened cushion layer-forming sheet were removed, then the same polishing layer as sample 1 was mounted on one side of this sheet, and the polishing layer was stuck thereon by photosetting by irradiating the From the results in Table 11, the polishing pads of the present invention having a cushion layer having a swelling degree of 40% or less with water were excellent in polishing rate, polishing rate after 5 minutes, and uniformity, and the polishing rate was also stable, but the polishing pad in the comparative example was not satisfactory in polishing rate and inferior in polishing rate stability.

The other polishing pad of the present invention is a polishing pad using a cushion layer having a swelling degree of 40% or less with water thereby attaining high productivity with less change with time in polishing rate.

INDUSTRIAL APPLICABILITY

The polishing pad of the present invention can be used as a polishing pad by which optical materials such as lenses, reflecting mirrors etc., or materials requiring a high degree of surface planarity, as in the polishing of silicone wafers, glass substrates or aluminum substrates for hard disks, or general metal polishing, can be flattened with stability and high polishing efficiency. The polishing pad of the present invention can also be used particularly in a step of planarizing a silicone wafer, a device (multilayer substrate) having an oxide layer, a metal layer etc. formed on a silicon wafer, or a device before lamination and formation of an oxide layer or a metal layer. Further, the polishing pad of the present invention can prevent scratches and dechucking error, and the polishing pad is long-lasting. Accordingly, a polishing pad having high polishing rate and excellent in planarity and uniformity can be obtained in the present invention.

What is claimed is:

1. A method of polishing a semiconductor wafer, which comprises:
providing a semiconductor wafer polishing pad having a polishing layer constituted by resin foam of closed-cell type, wherein the number of closed cells in the polishing layer is 200 to 600 per mm$^2$ and the average diameter of the closed cells is 30 to 60 μm; and
rotating the polishing pad and simultaneously positioning the polishing pad to abut on a semiconductor wafer while supplying an abrasive between the polishing layer and the semiconductor wafer; wherein
a resin constituting the resin foam consists of a polyurethane resin produced by mixing a first component containing an isocyanate group-containing compound with a second component containing an active hydrogen group-containing compound followed by hardening the mixture by heating, said mixture containing a curing agent and a silicone-based surfactant
the resin foam has a hardness of 45 or more and less than 65 as measured using a D-type rubber hardness meter, and
the closed cells solely contain gas selected from the group consisting of nitrogen, oxygen, a rare gas, dry air, and a mixed gas of the foregoing.

2. The method of polishing a semiconductor wafer according to claim 1, wherein the polishing layer is polyurethane resin foam containing 0.05 to 5 wt % silicone-based surfactant.

3. The method of polishing a semiconductor wafer according to claim 1, wherein the polishing layer has a thermal change in dimension of 3% or less.

4. The method of polishing a semiconductor wafer according to claim 1, wherein the polishing layer has a dynamic coefficient of friction of the surface of the polishing layer of 0.1 to 1.0.

5. The method of polishing a semiconductor wafer according to claim 1, wherein the difference in the abrasion loss of the polishing layer in a Taber abrasion test before and after a test of dipping it in an aqueous solution (40° C.) of potassium hydroxide, pH 12.5, for 24 hours is 10 mg or less.

6. The method according to claim 1, wherein the storage elastic modulus of the resin foam at 40° C. is 270 MPa or more.

7. The method according to claim 1, wherein the density of the polyurethane resin foam is 0.67 to 0.90 g/cm$^3$.

8. The method according to claim 2, wherein the silicone-based surfactant is a polyalkylsiloxane/polyether copolymer.

9. The method according to claim 1, wherein the compressibility of the polishing layer is 0.5 to 5%.

10. The method according to claim 1, which is composed of at least 2 layers comprising a polishing layer and a cushion layer softer than the polishing layer laminated therein.

11. The method according to claim 10, wherein the cushion layer is selected from a nonwoven polyester fabric impregnated with urethane, polyurethane foam, and polyethylene foam.

* * * * *

UNITED STATES PATENT AND TRADEMARK OFFICE
CERTIFICATE OF CORRECTION

| | |
|---|---|
| PATENT NO. | : 7,488,236 B2 |
| APPLICATION NO. | : 11/466909 |
| DATED | : February 10, 2009 |
| INVENTOR(S) | : Tetsuo Shimomura et al. |

It is certified that error appears in the above-identified patent and that said Letters Patent is hereby corrected as shown below:

On the title page (62); delete "Division of application No. 10/494,249, filed on Nov. 3, 2004." and insert --Division of application No. 10/494,249 filed as application No. PCT/JP02/10310 on Oct. 3, 2002.--.

On the title page (56); Under Other Publications, change "Englishe" to --English--.

Column 1, line 5; Change "Which" to --which--.

Column 1, line 7; Change "Oct. 2, 2002" to --Oct. 3, 2002--.

Column 1, line 10; Change "13: No." to --13--.

Column 1, line 10; Change "2001-347410," to --No. 2001-347410,--.

Column 7, line 43; Change "mm$^2$" to --mm$^2$.--.

Column 7, line 45; Change "concave(cells)" to --concave (cells)--.

Column 11, line 50; Change "euring-hardening" to --hardening--.

Column 22, line 4; Change "euring-hardening" to --hardening--.

Column 24, line 13; Change "g/cm 2)" to --g/cm$^2$--.

Column 28, line 8; Change "parts" to --3000 parts--.

Column 28, line 20; Change "1110°.," to --110°--.

Column 30, line 58; Change "parts" to --3000 parts--.

Column 33, line 61; Change "1110°.," to --110°--.

Column 37, line 6; Change "g/m" to --g/m$^2$--.

Column 38, line 46; Change "under" to --Under--.

Column 39, line 38; Change "parts" to --1480 parts--.

UNITED STATES PATENT AND TRADEMARK OFFICE
CERTIFICATE OF CORRECTION

PATENT NO. : 7,488,236 B2
APPLICATION NO. : 11/466909
DATED : February 10, 2009
INVENTOR(S) : Tetsuo Shimomura et al.

It is certified that error appears in the above-identified patent and that said Letters Patent is hereby corrected as shown below:

Column 41, line 7; Change "uniformity," to --uniformity.--.

Column 46, line 27; Change "diiusocyanate" to --diisocyanate--.

Column 46, line 52; Change "parts" to --1000 parts--.

Column 48, line 45; Change "SPP-600 S" to --SPP-600S--.

Column 51, line 45; Change "parts" to --14790 parts--.

Column 52, line 29; Change "The" to --b) The--.

Column 59, line 24; Change "scratcheson" to --scratches on--.

Column 61, line 45; Change "1110°.," to --110°--.

Column 62, line 18; Change "MPa" to --MPa.--.

Column 68, line 56; Change "g/cm$^5$," to --g/cm$^2$,--.

Column 71, line 19, In Claims 1, change "surfactant" to --surfactant,--.

Column 72, line 4, In Claims 4, change "1," to --1--.

Signed and Sealed this

Fourth Day of August, 2009

JOHN DOLL
*Acting Director of the United States Patent and Trademark Office*